US012568723B2

(12) United States Patent
Yamanaka

(10) Patent No.: US 12,568,723 B2
(45) Date of Patent: Mar. 3, 2026

(54) SEMICONDUCTOR LIGHT-EMITTING DEVICE AND LIGHT SOURCE DEVICE INCLUDING THE SAME

(71) Applicant: Nuvoton Technology Corporation Japan, Kyoto (JP)

(72) Inventor: Kazuhiko Yamanaka, Osaka (JP)

(73) Assignee: NUVOTON TECHNOLOGY CORPORATION JAPAN, Kyoto (JP)

( * ) Notice: Subject to any disclaimer, the term of this patent is extended or adjusted under 35 U.S.C. 154(b) by 551 days.

(21) Appl. No.: 18/060,836

(22) Filed: Dec. 1, 2022

(65) Prior Publication Data

US 2023/0100183 A1 Mar. 30, 2023

Related U.S. Application Data

(63) Continuation of application No. PCT/JP2021/022495, filed on Jun. 14, 2021.

(30) Foreign Application Priority Data

Jun. 19, 2020 (JP) ................................. 2020-106523

(51) Int. Cl.
  *H10H 20/85* (2025.01)
  *H01L 25/075* (2006.01)
  (Continued)

(52) U.S. Cl.
  CPC ..... *H10H 20/8506* (2025.01); *H01L 25/0753* (2013.01); *H10H 20/8312* (2025.01); *H10H 20/855* (2025.01); *H10H 20/857* (2025.01)

(58) Field of Classification Search
  None
  See application file for complete search history.

(56) References Cited

U.S. PATENT DOCUMENTS 6,587,491 B1 7/2003 Yamamoto
2003/0128552 A1 7/2003 Takagi et al.
  (Continued)

FOREIGN PATENT DOCUMENTS

JP 2001-111152 A 4/2001
JP 2006-135353 A 5/2006
  (Continued)

OTHER PUBLICATIONS

International Search Report issued on Aug. 31, 2021 in International Patent Application No. PCT/JP2021/022495, with English translation.

*Primary Examiner* — Feifei Yeung Lopez
(74) *Attorney, Agent, or Firm* — Rimon P.C.

(57) ABSTRACT

A semiconductor light-emitting device includes a first submount and a semiconductor light-emitting chip. The semiconductor light-emitting chip includes a first surface, a first optical waveguide extending in a first direction parallel to the first surface and disposed closer to the first surface than to a second surface, and an emission surface that emits emission light. The first submount includes a first base including a third surface, and a spacer disposed on the third surface. The semiconductor light-emitting chip is bonded to the first submount with the first surface facing the spacer. The emission surface is positioned forward of a front end surface of the spacer. A first front surface, which is the front end surface of the first base, is positioned forward of the emission surface.

16 Claims, 49 Drawing Sheets

(51) Int. Cl.
  *H10H 20/831* (2025.01)
  *H10H 20/855* (2025.01)
  *H10H 20/857* (2025.01)

(56) References Cited

U.S. PATENT DOCUMENTS

| | | | |
|---|---|---|---|
| 2013/0243019 A1 | 9/2013 | Wakabayashi et al. | |
| 2013/0250987 A1* | 9/2013 | Fujimoto | ............ H01S 5/02469 |
| | | | 372/36 |
| 2015/0023376 A1 | 1/2015 | Yamanaka et al. | |
| 2016/0064895 A1 | 3/2016 | Ishige et al. | |
| 2016/0204575 A1* | 7/2016 | Horn | .................... H01S 5/0237 |
| | | | 372/36 |
| 2022/0373736 A1* | 11/2022 | Itakura | ............... G02B 6/12004 |
| 2023/0031544 A1* | 2/2023 | Dejima | .............. H01S 5/02326 |

FOREIGN PATENT DOCUMENTS

| | | |
|---|---|---|
| JP | 2013-191787 A | 9/2013 |
| JP | 2013-225654 A | 10/2013 |
| WO | 2013/128794 A1 | 9/2013 |
| WO | 2014/192939 A1 | 12/2014 |
| WO | 2015/024860 A1 | 2/2015 |

* cited by examiner

SEMICONDUCTOR LIGHT-EMITTING DEVICE AND LIGHT SOURCE DEVICE INCLUDING THE SAME

CROSS REFERENCE TO RELATED APPLICATIONS

This is a continuation application of PCT International Application No. PCT/JP2021/022495 filed on Jun. 14, 2021, designating the United States of America, which is based on and claims priority of Japanese Patent Application No. 2020-106523 filed on Jun. 19, 2020. The entire disclosures of the above-identified applications, including the specifications, drawings, and claims are incorporated herein by reference in their entirety.

FIELD

The present disclosure relates to a semiconductor light-emitting device and a light source device including the semiconductor light-emitting device.

BACKGROUND

Semiconductor light-emitting chips such as semiconductor laser diodes are becoming increasingly high-power. As semiconductor light-emitting chips become more powerful, input power and generated heat also increase.

In semiconductor light-emitting devices in which a semiconductor light-emitting chip is mounted on a submount, a technique has been proposed to efficiently discharge heat generated by the semiconductor light-emitting chip to the submount and dissipate the heat from the submount to the outside (see, for example, patent literature (PTL) 1 and PTL 2).

PTL 1 proposes a technique in which a block with high thermal conductivity is disposed on a side surface of a semiconductor light-emitting chip to discharge heat generated by the semiconductor light-emitting chip from the side surface to the submount. PTL 1 and PTL 2 propose a technique in which submounts are disposed above and below a semiconductor light-emitting chip, and heat generated in the submounts is discharged upward and downward.

CITATION LIST

Patent Literature

PTL 1: WO 2015/024860
PTL 2: WO 2013/128794

SUMMARY

Technical Problem

Regarding the surface from which emission light such as laser light is emitted from the semiconductor light-emitting chip and the vicinity of that surface, a mechanism to inhibit the obstruction of the optical path of the emission light and a mechanism to dispose and fix an optical element that couples with the emission light are required. Specifically, nothing should be disposed on or in the vicinity of the emission surface to inhibit light path obstruction and to dispose an optical element. In such cases, however, it becomes difficult to discharge heat generated in the vicinity of the emission surface of the semiconductor light-emitting chip. It is also difficult to improve the precision of the position at which to fix the optical element when the optical element is disposed in the vicinity of the emission surface. If the position at which the optical element is fixed is not precise, this may reduce the coupling efficiency of the emission light from the semiconductor light-emitting chip to the optical element.

The present disclosure has an object to provide a semiconductor light-emitting device and a light source device that can efficiently couple the emission light from a semiconductor light-emitting chip with an optical element when the optical element is fixed, and that can easily discharge heat generated by the semiconductor light-emitting chip from the submount to the outside.

Solution to Problem

In order to overcome the above-described technical problem, one aspect of the semiconductor light-emitting device according to the present disclosure includes a first submount and a first semiconductor light-emitting chip disposed on the first submount. The first semiconductor light-emitting chip includes a first surface and a second surface on opposite sides, a first optical waveguide extending in a first direction parallel to the first surface and disposed closer to the first surface than to the second surface, and a first emission surface that is one of side surfaces that connect the first surface and the second surface and intersect the first direction, and emits emission light in the first direction. The first submount includes a first base including a third surface, and a spacer disposed on the third surface. The first semiconductor light-emitting chip is bonded to the first submount with the first surface facing the spacer. In a traveling direction of the emission light, the first emission surface is positioned forward of, among two end surfaces of the spacer in the first direction, an end surface closer to the first emission surface. Among two end surfaces of the first base in the first direction, a first front surface is positioned forward of the first emission surface in the traveling direction of the emission light, the first front surface being an end surface closer to the first emission surface.

In one aspect of the semiconductor light-emitting device according to the present disclosure, the distance in the first direction between the first front surface and the first emission surface may be between 13 μm and 200 μm, inclusive, and the thickness of the spacer may be between 10 μm and 163 μm, inclusive.

In one aspect of the semiconductor light-emitting device according to the present disclosure, the first semiconductor light-emitting chip may be a semiconductor laser chip or a super luminescent diode.

In one aspect of the semiconductor light-emitting device according to the present disclosure, the first base may include an insulating material. The first base may be composed entirely of an insulating material, and, alternatively, may include a composite material of the insulating material formed on the surface of a conductive material.

In one aspect of the semiconductor light-emitting device according to the present disclosure, the spacer may be a first metal material comprising a metal material.

In one aspect of the semiconductor light-emitting device according to the present disclosure, the first semiconductor light-emitting chip may include a first electrode, the first electrode may include the first surface, and the first electrode and the spacer may be electrically connected.

In one aspect of the semiconductor light-emitting device according to the present disclosure, the first semiconductor light-emitting chip may include a second electrode, the second electrode may include the second surface, the first submount may include a second metal material disposed on the third surface, and the second electrode and the second metal material may be electrically connected.

In one aspect, the semiconductor light-emitting device according to the present disclosure may include a second submount disposed on the second surface.

In one aspect of the semiconductor light-emitting device according to the present disclosure, the second submount may include a second base including a fourth surface and a third metal material disposed on the fourth surface, and the second surface may face the third metal material.

In one aspect of the semiconductor light-emitting device according to the present disclosure, among two end surfaces of the third metal material in the first direction, an end surface closer to the first emission surface may be positioned forward of the first emission surface in the traveling direction of the emission light.

In one aspect of the semiconductor light-emitting device according to the present disclosure, the first semiconductor light-emitting chip may include a second electrode, the second electrode may include the second surface, and the second electrode and the third metal material may be electrically connected.

In one aspect, the semiconductor light-emitting device according to the present disclosure may include a first sidewall and a second sidewall connected to the second submount, the first sidewall and the second sidewall may be arranged in a second direction parallel to the first surface and orthogonal to the first direction, and the first semiconductor light-emitting chip may be disposed between the first sidewall and the second sidewall.

In one aspect of the semiconductor light-emitting device according to the present disclosure, the first sidewall may include a first metal column and the second sidewall may include a second metal column.

In one aspect of the semiconductor light-emitting device according to the present disclosure, the first submount may include a second metal material disposed on the third surface, and the first metal column may be electrically connected to the second metal material.

In one aspect of the semiconductor light-emitting device according to the present disclosure, the first metal column may be electrically connected to the third metal material.

In one aspect of the semiconductor light-emitting device according to the present disclosure, the second metal material and the second electrode may be electrically connected.

In one aspect of the semiconductor light-emitting device according to the present disclosure, the second submount may include a fourth metal material disposed on the fourth surface, and the second metal column may be electrically connected to the fourth metal material.

In one aspect of the semiconductor light-emitting device according to the present disclosure, the second metal column may be electrically connected to the spacer.

In one aspect of the semiconductor light-emitting device according to the present disclosure, the first semiconductor light-emitting chip includes a first electrode, the second base includes a fifth surface on an opposite side relative to the fourth surface, the second submount may include a fifth metal material disposed on the fifth surface, and the first electrode may be electrically connected to the fifth metal material.

In one aspect of the semiconductor light-emitting device according to the present disclosure, the second submount may include a sixth metal material disposed on the fifth surface, and the second electrode may be electrically connected to the sixth metal material.

In one aspect, the semiconductor light-emitting device according to the present disclosure may include an optical element connected to the first submount and the second submount.

In one aspect of the semiconductor light-emitting device according to the present disclosure, among two end surfaces of the second base in the first direction, a second front surface, which is an end surface closer to the first emission surface, may be positioned forward of the first emission surface in the traveling direction of the emission light.

In one aspect of the semiconductor light-emitting device according to the present disclosure, the first front surface and the second front surface may be coplanar.

In one aspect of the semiconductor light-emitting device according to the present disclosure, the first semiconductor light-emitting chip may include a third rear surface that faces away from the first emission surface, the first base may include a first rear surface, the second base may include a second rear surface, the first rear surface may be, from among two end surfaces of the first base in the first direction, the end surface closer to the third rear surface, the second rear surface may be, from among two end surfaces of the second base in the first direction, the end surface closer to the third rear surface, the third rear surface may be positioned forward of the first rear surface in the traveling direction of the emission light, and the third rear surface may be positioned forward of the second rear surface in the traveling direction of the emission light.

In one aspect, the semiconductor light-emitting device according to the present disclosure may include: a light-transmissive component disposed on the first front surface and the second front surface; a first sidewall and a second sidewall arranged in a second direction parallel to the first surface and orthogonal to the first direction; and a third sidewall. The first base may include a first rear surface that faces away from the first front surface, the second base may include a second rear surface that faces away from the second front surface, the third sidewall may be disposed on the first rear surface and the second rear surface, the first semiconductor light-emitting chip may be disposed between the first sidewall and the second sidewall, and the first semiconductor light-emitting chip may be hermetically sealed by the first submount, the second submount, the light-transmissive component, the first sidewall, the second sidewall, and the third sidewall.

In one aspect of the semiconductor light-emitting device according to the present disclosure, in a top view of the third surface, the spacer and the second metal material may protrude from the second submount in a second direction parallel to the first surface and orthogonal to the first direction.

In one aspect, the semiconductor light-emitting device according to the present disclosure may include a functional element disposed on the fifth surface, and the functional element may be electrically connected to the fifth metal material and the sixth metal material.

In one aspect, the semiconductor light-emitting device according to the present disclosure may include a second semiconductor light-emitting chip disposed on the first submount. The second semiconductor light-emitting chip may include a sixth surface parallel to the first direction, a seventh surface on an opposite side relative to the sixth surface, and a second optical waveguide extending in the first direction and disposed closer to the sixth surface than to the seventh surface. The first submount may include a seventh metal material disposed on the third surface. The spacer and the seventh metal material may be electrically connected. The second semiconductor light-emitting chip may be bonded to the first submount with the sixth surface facing the seventh metal material. The second submount may include a fourth metal material disposed on the fourth surface. The seventh surface may be connected to the fourth metal material, and the sixth surface may be electrically connected to the seventh metal material.

In one aspect of the semiconductor light-emitting device according to the present disclosure, the semiconductor light-emitting chip may include a second emission surface. The second emission surface may be, from among two end surface of the second semiconductor light-emitting chip in the first direction, the end surface closer to the first emission surface. The second base may include a second front surface. The second front surface may be, from among two end surfaces of the second base in the first direction, the end surface closer to the first emission surface. Among two end surfaces of the seventh metal material in the first direction, the second emission surface may be located forward of the end surface closer to the second emission surface in the traveling direction of the emission light. Among two end surfaces of the fourth metal material in the first direction, the end surface closer to the second emission surface may be located forward of the second emission surface in the traveling direction of the emission light and rearward of the second front surface in the traveling direction of the emission light.

In one aspect, the semiconductor light-emitting device according to the present disclosure may include a functional element disposed on the fourth surface. The second submount may include a eighth metal material and a ninth metal material which are disposed on the fourth surface and electrically insulated from the third metal material and the fourth metal material. The functional element may be electrically connected to the eighth metal material and the ninth metal material.

In one aspect of the semiconductor light-emitting device according to the present disclosure, in a top view of the third surface, the spacer may include a first recess that is recessed inward of the spacer, at an end edge of the spacer that is closer to the first emission surface, from among the two end edges of the spacer in the first direction.

In one aspect of the semiconductor light-emitting device according to the present disclosure, in a top view of the third surface, the second metal material may include a second recess that is recessed inward of the second metal material, at an end edge of the second metal material that is closer to the first emission surface, from among the two end edges of the second metal material in the first direction.

In one aspect, the semiconductor light-emitting device according to the present disclosure may further include an auxiliary plate bonded to the first submount.

In order to overcome the above-described technical problem, one aspect of the light source device according to the present disclosure includes the semiconductor light-emitting device and a lens optical element. The lens optical element is disposed forward of the first submount in the traveling direction of the emission light and connected to the first submount.

In one aspect, the light source device according to the present disclosure may include a second submount disposed on the second surface, and the lens optical element may be connected to the second submount.

In one aspect, the light source device according to the present disclosure may include the semiconductor light-emitting device and the lens optical element, in a top view of the third surface, the spacer may include a first recess that is recessed inward of the spacer, at an end edge of the spacer that is closer to the first emission surface among the two end edges of the spacer in the first direction, and the lens optical element may be connected to the first recess and the second recess.

Advantageous Effects

The present disclosure can provide a semiconductor light-emitting device and a light source device that can efficiently couple the emission light from a semiconductor light-emitting chip with an optical element when the optical element is fixed, and that can easily discharge heat generated by the semiconductor light-emitting chip from the submount to the outside.

BRIEF DESCRIPTION OF DRAWINGS

These and other advantages and features will become apparent from the following description thereof taken in conjunction with the accompanying Drawings, by way of non-limiting examples of embodiments disclosed herein.

FIG. 2 is a cross-sectional view schematically illustrating semiconductor to the light-emitting device according Embodiment 1.

FIG. 3 is a cross-sectional view schematically illustrating the configuration of a semiconductor light-emitting device and a light source device according to Variation 1 of Embodiment 1.

FIG. 16 is a cross-sectional view schematically illustrating the semiconductor light-emitting device according to Variation 1 of Embodiment 2.

FIG. 19A is a cross-sectional view schematically illustrating the overall configuration of a semiconductor light-emitting device according to Variation 3 of Embodiment 2.

FIG. 20 is a cross-sectional view schematically illustrating the overall configuration of a semiconductor light-emitting device according to Variation 4 of Embodiment 2.

FIG. 22 is a partial cross-sectional view schematically illustrating the configuration in the vicinity of a semiconductor light-emitting device in the light source device according to Variation 5 of Embodiment 2.

DESCRIPTION OF EMBODIMENTS

Hereinafter, embodiments of the present disclosure will be described with reference to the drawings. Each of the following embodiments shows a specific example of the present disclosure. The numerical values, shapes, materials, elements, the arrangement and connection of the elements, etc., indicated in the following embodiments are mere examples, and therefore do not intend to limit the present disclosure.

The figures are schematic illustrations and are not necessarily precise depictions. Accordingly, the figures are not necessarily to scale. Elements that are essentially the same share like reference signs in the figures, and duplicate description is omitted or simplified.

Moreover, in the present specification, the terms "above" and "below" do not refer to the vertically upward direction and vertically downward direction in terms of absolute spatial recognition, but are used as terms defined by relative positional relationships based on the layering order in a layered configuration. Furthermore, the terms "above" and "below" are applied not only when two elements are disposed with a gap therebetween or when a separate element is interposed between two elements, but also when two elements are disposed in contact with each other.

Embodiment 1

Next, the semiconductor light-emitting device according to Embodiment 1 will be described.

Overall Configuration

Figure 1:
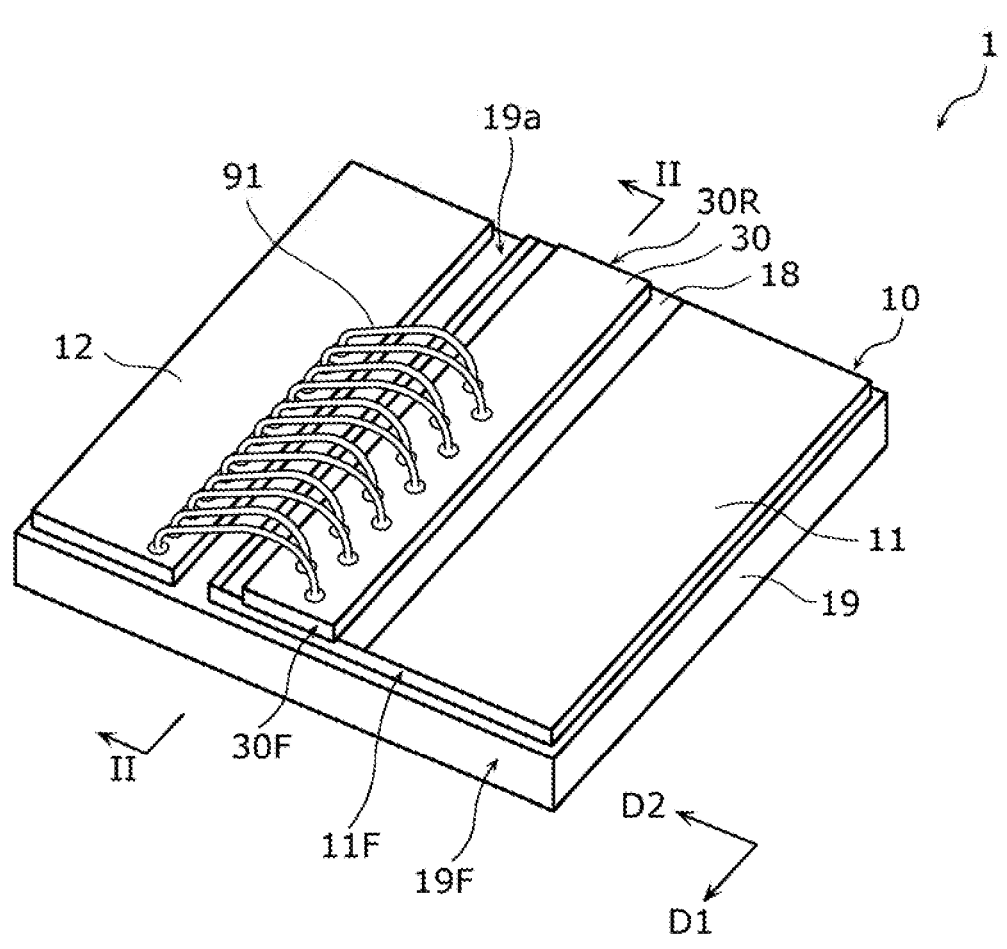
FIG. 1 is a perspective view schematically illustrating a semiconductor light-emitting device according to Embodiment 1.
Figure 2:
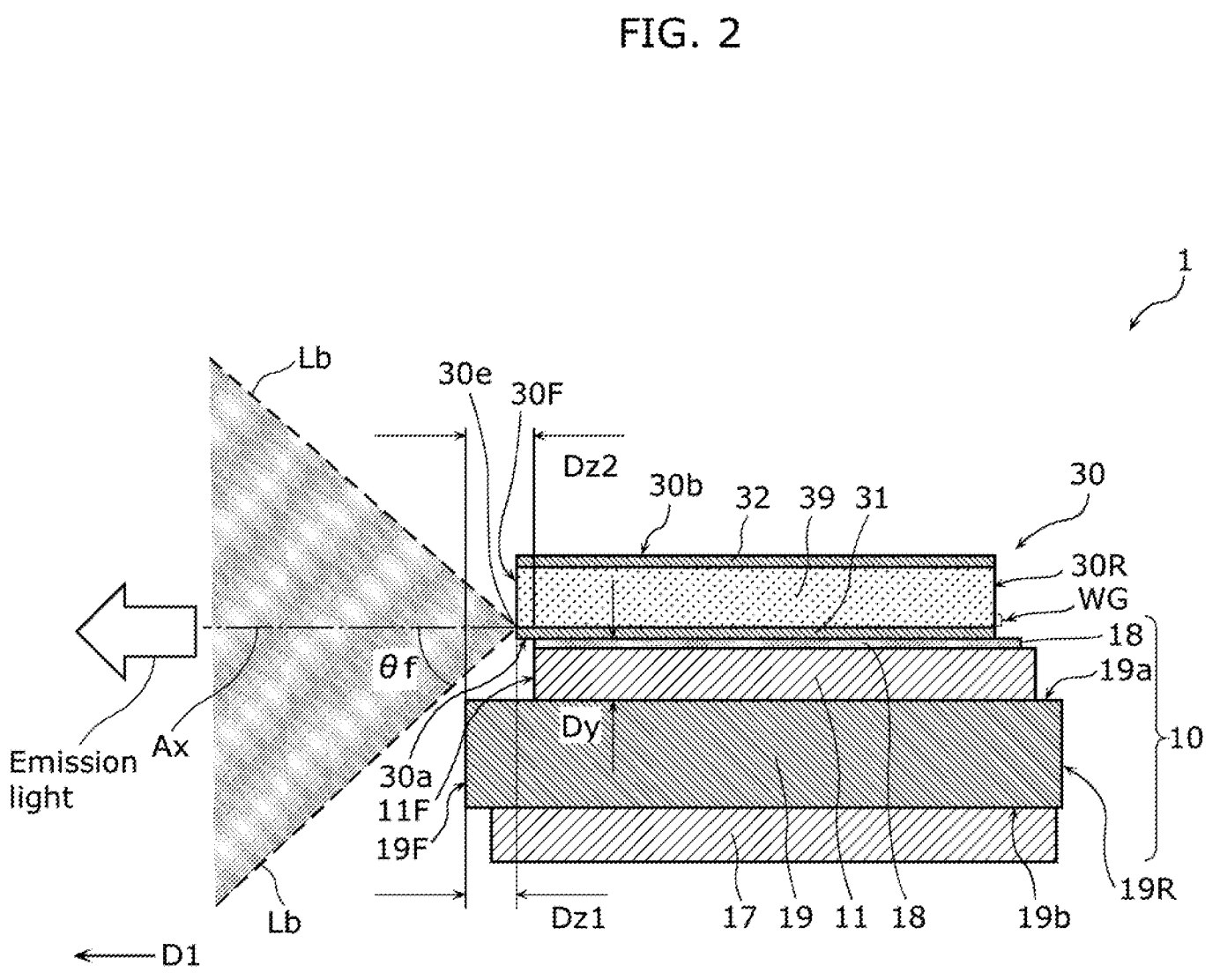

First, the overall configuration of the semiconductor light-emitting device according to the present embodiment will be described with reference to FIG. 1 and FIG. 2. FIG. 1 and FIG. 2 are respectively perspective and cross-sectional views that schematically illustrate semiconductor light-emitting device 1 according to the present embodiment. FIG. 2 is a cross-sectional view taken at line II-II in FIG. 1.

As illustrated in FIG. 1, semiconductor light-emitting device 1 includes semiconductor light-emitting chip 30 and first submount 10. In the present embodiment, semiconductor light-emitting device 1 further includes a plurality of metal wires 91.

Semiconductor light-emitting chip 30 is one example of the first semiconductor light-emitting chip disposed on first submount 10. In the present embodiment, semiconductor light-emitting chip 30 is a semiconductor laser diode chip that is mounted to first submount 10 and includes first electrode 31, second electrode 32, and layered structure 39, as illustrated in FIG. 2. Semiconductor light-emitting chip 30 is disposed in the central portion of first submount 10. Layered structure 39 includes a substrate and a semiconductor layered portion that includes a light-emitting layer. For example, the substrate comprises InP, GaAs, GaN, or AlN or the like. In the present embodiment, the substrate is an n-type semiconductor substrate. For example, the semiconductor layered portion includes, layered in the listed order on the substrate, an n-type cladding layer, an n-side guide layer, a quantum well active layer, a p-side guide layer, and a p-type cladding layer. First electrode 31 is disposed on the main surface of layered structure 39 that is on the semiconductor layered portion side, and second electrode 32 is disposed on the main surface of layered structure 39 that is on the substrate side. Semiconductor light-emitting chip 30 is bonded to first submount 10 at first electrode 31 disposed on the semiconductor layered portion. In other words, semiconductor light-emitting chip 30 is junction-down bonded to first submount 10. In the present embodiment, first electrode 31 is thermally and electrically connected to spacer 11 included in first submount 10.

Semiconductor light-emitting chip 30 includes first surface 30a, second surface 30b, emission surface 30F, and rear surface 30R. First surface 30a is the portion of the surface of semiconductor light-emitting chip 30 that opposes first submount 10. In the present embodiment, first electrode 31 includes first surface 30a. Stated differently, the semiconductor layered portion of semiconductor light-emitting chip 30 is disposed on the first surface 30a side of semiconductor light-emitting chip 30 relative to the substrate. Second surface 30b is the surface on the opposite side of first surface 30a. In the present embodiment, second electrode 32 includes second surface 30b.

Semiconductor light-emitting chip 30 includes optical waveguide WG extending in first direction D1 parallel to first surface 30a. Optical waveguide WG is disposed closer to first surface 30a than to second surface 30b. Optical waveguide WG is one example of the first optical waveguide. More specifically, the semiconductor layered portion of layered structure 39 of semiconductor light-emitting chip 30 includes, in the p-type cladding layer, an optical confinement structure including ridges or the like extending in first direction D1. This forms optical waveguide WG including an optical confinement structure in second direction D2. Optical waveguide WG is disposed on the first surface 30a side of semiconductor light-emitting chip 30 relative to the substrate. For example, optical waveguide WG is formed in the center of the semiconductor layered portion in second direction D2. Second direction D2 is parallel to first surface 30a and orthogonal to first direction D1.

Emission surface 30F is one of the side surfaces connecting first surface 30a and second surface 30b that intersect first direction D1, and is one example of the first emission surface that emits emission light in first direction D1. In the present embodiment, the emission light is emitted from a position on emission surface 30F that corresponds to optical waveguide WG. For example, the emission light is ultraviolet, visible, or infrared laser light having a peak wavelength between 250 nm and 20 μm. Rear surface 30R is one example of the third rear surface, which is the other of the side surfaces connecting first surface 30a and second surface 30b that intersect first direction D1. Stated differently, rear surface 30R is the side surface facing away from emission surface 30F of semiconductor light-emitting chip 30. In the present embodiment, emission surface 30F and rear surface 30R constitute a laser resonator, and the laser light resonates in optical waveguide WG. The point on emission surface 30F corresponding to optical waveguide WG, i.e., the point where the emission light is emitted, is called light-emitting point 30e.

First submount 10 is a base on which semiconductor light-emitting chip 30 is disposed. First submount 10 also functions as a heat sink from which heat generated by semiconductor light-emitting chip 30 is discharged. In the present embodiment, as illustrated in FIG. 1, first submount 10 includes first base 19, spacer 11, second metal material 12, and bonding material 18. As illustrated in FIG. 2, first submount 10 further includes backside metal material 17.

First base 19 is the main component of first submount 10. First base 19 includes third surface 19a, and spacer 11 and second metal material 12 are disposed on third surface 19a. In the present embodiment, first base 19 is one example of the first insulating member comprising an insulating material. For example, first base 19 is a ceramic substrate, a polycrystalline substrate, or a monocrystalline substrate comprising a material with high thermal conductivity such as alumina, AlN, SiC, or diamond or the like. First base 19 may comprise a composite material of an insulating material formed on the third surface 19a side and an electrically conductive material. For example, first base 19 may be a substrate including an oxide film formed on a surface of a silicon substrate. First base 19 may therefore include an insulating material. First base 19 includes backside surface 19b on the opposite side relative to third surface 19a, and backside metal material 17 is disposed on backside surface 19b.

Spacer 11 is one example of the first metal material disposed on third surface 19a. Spacer 11 is disposed at least between third surface 19a of first base 19 and first surface 30a of semiconductor light-emitting chip 30. Spacer 11 covers at least the central portion of third surface 19a. In the present embodiment, spacer 11 is electrically connected to first surface 30a of semiconductor light-emitting chip 30 via bonding material 18. Semiconductor light-emitting chip 30 is junction-down bonded to first submount 10 with first surface 30a facing spacer 11. Spacer 11 is, for example, a plate-shaped metal material consisting mainly of a metal with high thermal conductivity such as Cu, with a protective metal film of, for example, Ni or Au or the like formed on the surface.

Second metal material 12 is a metal material disposed on third surface 19a. Second metal material 12 is electrically insulated from spacer 11 and electrically connected to second electrode 32 of semiconductor light-emitting chip 30. In the present embodiment, second metal material 12 and second electrode 32 are electrically connected via metal wire 91. As illustrated in FIG. 1, second metal material 12 is disposed separated from spacer 11 in second direction D2. Second metal material 12 is, for example, a plate-shaped metal material consisting mainly of a metal with high thermal conductivity such as Cu, with a protective metal film of, for example, Ni or Au or the like formed on the surface.

Bonding material 18 is a metal material that bonds spacer 11 and semiconductor light-emitting chip 30. Bonding material 18 is disposed on the surface of spacer 11 that faces semiconductor light-emitting chip 30. Bonding material 18 is formed of, for example, AuSn.

Backside metal material 17 is a metal material disposed on backside surface 19b of first base 19. Backside metal material 17 is, for example, a plate-shaped metal material consisting mainly of a metal with high thermal conductivity such as Cu, with a protective metal film of, for example, Ni or Au or the like formed on the surface. Backside metal material 17 is connected to a heat-dissipating component such as a heat sink.

Metal wire 91 is a metal wire that connects second electrode 32 of semiconductor light-emitting chip 30 to second metal material 12 of first submount 10. Metal wire 91 is formed of, for example, Au.

Semiconductor light-emitting device 1 includes the above elements, and each of spacer 11 and second metal material 12 is connected to external wiring by, for example, metal wires, which are not illustrated. This allows power to be supplied to semiconductor light-emitting device 1 from an external source.

Positional Relationships between Elements

Next, with reference to FIG. 2, the positional relationships between emission surface 30F of semiconductor light-emitting chip 30 of semiconductor light-emitting device 1, end surface 11F of spacer 11 of first submount 10 (i.e., the left side surface in FIG. 2), and first front surface 19F of first base 19 (i.e., the left side surface in FIG. 2) will be described. Here, among the two end surfaces of first base 19 in first direction D1, first front surface 19F is the end surface that is closer to emission surface 30F.

End surface 11F of spacer 11 is the end surface of spacer 11 located near emission surface 30F. Stated differently, among the two end surfaces of spacer 11 in first direction D1, end surface 11F of spacer 11 is the one closer to emission surface 30F.

First front surface 19F is the end surface of first base 19 located near emission surface 30F. Stated differently, among the two end surfaces of first base 19 in first direction D1, first front surface 19F is the end surface that is closer to emission surface 30F.

Note that first front surface 19F and end surface 11F of spacer 11 are the end surfaces on the traveling-direction-of-emission-light side, and may be described as end surfaces on the emission side of emission light. When, using emission surface 30F of semiconductor light-emitting chip 30 as a reference point, end surface 11F and first front surface 19F are disposed on the rear surface 30R side of emission surface 30F in first direction D1, end surface 11F and first front surface 19F are expressed as being disposed rearward of emission surface 30F (relative to the traveling direction of emission light). When end surface 11F and first front surface 19F are disposed on the traveling-direction-of-emission-light side of emission surface 30F, end surface 11F and first front surface 19F are expressed as being disposed forward of emission surface 30F (relative to the traveling direction of emission light). When, using end surface 11F of spacer 11 as a reference point, emission surface 30F and first front surface 19F are disposed on the rear surface 30R side of end surface 11F in first direction D1, emission surface 30F and first front surface 19F are expressed as being disposed rearward of end surface 11F relative to the traveling direction of emission light. When emission surface 30F and first front surface 19F are disposed on the traveling-direction-of-emission-light side of end surface 11F, emission surface 30F and first front surface 19F are expressed as being disposed forward of end surface 11F relative to the traveling direction of emission light. When, using first front surface 19F as a reference point, emission surface 30F and end surface 11F are disposed on the rear surface 30R side of first front surface 19F in first direction D1, emission surface 30F and end surface 11F are expressed as being disposed rearward of first front surface 19F relative to the traveling direction of emission light. When emission surface 30F and end surface 11F are disposed on the traveling-direction-ofemission-light side of first front surface 19F, emission surface 30F and end surface 11F are expressed as being disposed forward of first front surface 19F relative to the traveling direction of emission light. In any case, when simply stating disposed forward of or rearward of with respect to a surface serving as a reference, it means disposed forward of or rearward of with respect to the reference surface relative to the traveling direction of emission light.

The distance between emission surface 30F and first front surface 19F is greater than the distance between rear surface 30R and first rear surface 19R, which is the rear end surface of first base 19.

The positional relationships between the elements are defined so as to increase the utilization efficiency of emission light. For example, when emission light, which is laser light, is used for material processing, it is necessary to guide the emission light to the object to be irradiated with the highest possible utilization efficiency because high power light is required. It is therefore necessary to avoid disposing opaque objects in the optical path of the emission light, which can result in a loss of emission light.

The emission light emitted from semiconductor light-emitting device 1 has a distribution of light intensity with respect to the angle with optical axis Ax, which is perpendicular to emission surface 30F, i.e., with respect to the emission angle. The light intensity is, as an approximation, highest near the optical axis, and has a Gaussian-like distribution with respect to the emission angle. As illustrated in FIG. 2, the divergence angle (total angle) in the fast axis direction (i.e., the up-and-down direction in FIG. 2) of the emission light of semiconductor light-emitting device 1 is $2\theta f$. The outermost rays on the lower side (the rays indicated by dashed line Lb below optical axis Ax in FIG. 2) to the outermost rays on the upper side (the rays indicated by dashed line Lb above optical axis Ax in FIG. 2), which define the divergence angle $2\theta f$, shall be rays with an intensity that is less than 1% of the peak light intensity of the emission light. In semiconductor laser diodes with high optical output, the divergence angle in the fast axis direction corresponding to $1/e^2$ of the peak intensity is in the range of 40° to 50°, inclusive. In this case, the divergence angle of the outermost rays is in the range of 62° (equivalent to NA 0.52) to 76° (equivalent to NA 0.62), inclusive. When propagating the emission light from semiconductor light-emitting chip 30 using an optical element, it is necessary to couple the emission light from semiconductor light-emitting chip 30 to the optical element with high efficiency in order to obtain high intensity light. It is therefore necessary to reduce the irradiation of part of semiconductor light-emitting device 1, such as first submount 10, by the outermost rays having a divergence angle of 76°.

In the present embodiment, as illustrated in FIG. 2, emission surface 30F is disposed forward of end surface 11F of spacer 11, and first front surface 19F is disposed forward of emission surface 30F (i.e., disposed on the left of emission surface 30F in FIG. 2).

By disposing emission surface 30F forward of end surface 11F of spacer 11, the emission light emitted in first direction D1 from light-emitting point 30e at a predetermined divergence angle is inhibited from being blocked by spacer 11. This can inhibit a reduction in the utilization efficiency of the emission light. In configurations in which the emission light is incident on an optical element, this can inhibit a reduction in the coupling efficiency of the emission light with the optical element.

In applications using an optical element on which the emission light is incident, since first front surface 19F is disposed forward of emission surface 30F of semiconductor light-emitting chip 30, the optical element can be fixed to first front surface 19F with inhibited interference with semiconductor light-emitting chip 30. Fixing the optical element to first base 19 in this manner allows for the position at which the optical element fixed relative to semiconductor light-emitting chip 30 to be more precise than when first submount 10 and the optical element are separated. This allows the emission light from semiconductor light-emitting chip 30 to be efficiently coupled to the optical element.

Next, the positional relationship between first front surface 19F and emission surface 30F for inhibiting emission light with a divergence angle $2\theta f$ as described above from being blocked by first base 19 will be described. Using distance Dy between first surface 30a of semiconductor light-emitting chip 30 and third surface 19a of first base 19 and distance Dz1 between emission surface 30F and first front surface 19F, as illustrated in FIG. 2, a condition for preventing the outermost ray of the emission light from being blocked by first base 19 can be expressed by the following inequality (1).

$$\tan^{-1}(Dy/Dz1) \geq \theta f \tag{1}$$

It is assumed here that the distance from first surface 30a to light-emitting point 30e is sufficiently small compared to the distance from third surface 19a to first surface 30a. Interference between the emission light and first base 19 can be reduced by determining the positional relationship between semiconductor light-emitting chip 30 and first base 19 so that inequality (1) holds true. This makes it possible to increase the utilization efficiency of the light emitted from light-emitting point 30e. This can also inhibit the generation of stray light by the emission light being blocked by first base 19.

Variation 1 of Embodiment 1

Next, a semiconductor light-emitting device and a light source device including the semiconductor light-emitting device according to Variation 1 of Embodiment 1 will be described. The semiconductor light-emitting device according to the present variation includes a preliminary bonding film in addition to the components of semiconductor light-emitting device 1 according to Embodiment 1. The light source device according to the present variation includes a lens optical element in addition to the semiconductor light-emitting device according to the present variation. The following description will focus on the differences between (i) the semiconductor light-emitting device and light source device according the present variation and (ii) semiconductor light-emitting device 1 according to Embodiment 1.

Overall Configuration

Figure 3:
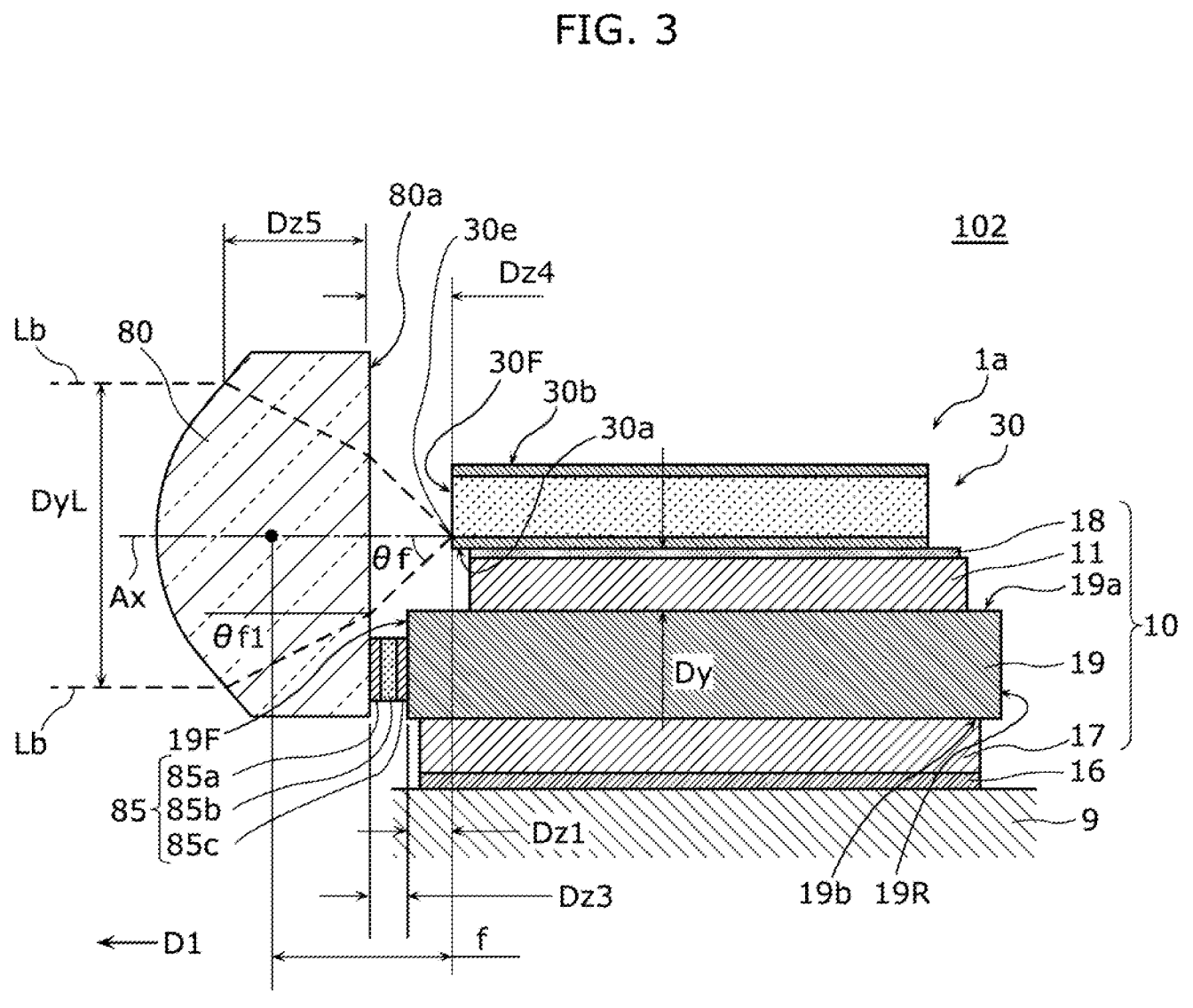

First, the configurations of semiconductor light-emitting device 1a and light source device 102 according to the present variation will be described with reference to FIG. 3. FIG. 3 is a cross-sectional view schematically illustrating the configurations of semiconductor light-emitting device 1a and light source device 102 according to the present variation. FIG. 3 illustrates a cross section taken at the same location as the cross section of semiconductor light-emitting device 1 illustrated in FIG. 2.

As illustrated in FIG. 3, semiconductor light-emitting device 1a according to the present variation includes semiconductor light-emitting chip 30, first submount 10, and preliminary bonding film 85c. Light source device 102 includes semiconductor light-emitting device 1a and lens optical element 80. Light source device 102 further includes preliminary bonding film 85a and bonding material 85b that fix lens optical element 80 to first submount 10, and heat-dissipating component 9 on which semiconductor light-emitting device 1a is disposed. Semiconductor light-emitting device 1a is fixed to heat-dissipating component 9 comprising Cu or the like by second bonding material 16 comprising solder or the like.

Lens optical element 80 is an element connected to first submount 10, and the emission light from semiconductor light-emitting chip 30 is incident on the element. Lens optical element 80 is disposed forward of first submount 10 in the traveling direction of the emission light, and is connected to first submount 10. Lens optical element 80 is fixed to first front surface 19F by bonding portion 85. In the present variation, lens optical element 80 is a fast axis collimator lens, which collimates the emission light in the fast axis direction. For example, a cylindrical lens can be used as lens optical element 80. The fast axis direction is the direction perpendicular to first surface 30a of semiconductor light-emitting chip 30 (i.e., the up-and-down direction in FIG. 3). To collimate the emission light, lens optical element 80 is disposed so that focal length f of lens optical element 80 is equal to the distance from the principal point of lens optical element 80 to emission surface 30F of semiconductor light-emitting chip 30. Lens optical element 80 includes incident surface 80a that opposes emission surface 30F of semiconductor light-emitting chip 30.

Bonding portion 85 is a component that bonds first submount 10 and lens optical element 80 together. Bonding portion 85 includes preliminary bonding films 85a and 85c and bonding material 85b. Preliminary bonding films 85a and 85c are disposed on incident surface 80a and first front surface 19F of lens optical element 80, respectively. In the present variation, preliminary bonding films 85a and 85c are multilayer metal films of Ni, Ti, Pt, or Au or the like. The elements and layering order of the multilayer metal films used for preliminary bonding films 85a and 85c should be selected according to the materials of lens optical element 80, first base 19, and bonding material 85b to form a strong bond. In the present variation, each of preliminary bonding films 85a and 85c is a multilayer metal film of Ni and Au films layered in the listed order from furthest from bonding material 85b. Bonding material 85b is a solder material such as AuSn, SnAgCu, or SnSb, for example.

Preliminary bonding film 85a is formed in advance on incident surface 80a of lens optical element 80. Preliminary bonding film 85c is formed in advance on first front surface 19F. Bonding material 85b is formed in advance on incident surface 80a or first front surface 19F. In the present embodiment, bonding material 85b is formed on first front surface 19F. Lens optical element 80 is disposed in a predetermined position on first base 19, the optical axis is adjusted, and bonding material 85b and preliminary bonding film 85a are adhered together. First submount 10 is then heated after the optical axis adjustment of lens optical element 80 is completed. This melts bonding material 85b of bonding portion 85. First base 19 and lens optical element 80 are then cooled to solidify bonding material 85b and fix lens optical element 80 to first base 19.

The emission light emitted from light-emitting point 30e of semiconductor light-emitting chip 30 of semiconductor light-emitting device 1a having the above configuration can be inhibited from being blocked by spacer 11. This makes it possible to increase the utilization efficiency of the emission light in semiconductor light-emitting device 1a according to the present variation. Moreover, it is possible to inhibit the emission light from being blocked by first base 19 by defining the positional relationship between emission surface 30F and first front surface 19F so that inequality (1) defined above holds true. This makes it possible to further increase the utilization efficiency of the emission light in semiconductor light-emitting device 1a according to the present variation. In such cases, almost all of the emission light is incident on lens optical element 80, becomes collimated light (laser light in the present variation) by lens optical element 80, and is emitted from lens optical element 80.

In semiconductor light-emitting device 1a according to the present variation, emission surface 30F is disposed rearward of first front surface 19F. With this, in light source device 102, the first front surface can be used to fix lens optical element 80 while maintaining a predetermined distance between emission surface 30F and lens optical element 80. This makes it possible to inhibit interference between semiconductor light-emitting chip 30 and lens optical element 80. By fixing lens optical element 80 to first base 19, the distance between lens optical element 80 and emission surface 30F can be minimized, thereby increasing the degree of freedom in the optical design of lens optical element 80. Because semiconductor light-emitting chip 30 and lens optical element 80 can be fixed to the same first base 19, the positional relationship between semiconductor light-emitting chip 30 and lens optical element 80 can be inhibited from changing over time after lens optical element 80 is fixed.

Design Example and Advantageous Effects

Next, a specific design example of semiconductor light-emitting device 1a according to the present variation will be described with reference to FIG. 3.

Just like in semiconductor light-emitting device 1 according to Embodiment 1, it is possible to inhibit the emission light from being blocked by spacer 11 in semiconductor light-emitting device 1a according to the present variation as well. Moreover, it is possible to inhibit the emission light from being blocked by first base 19 by determining the positional relationship between semiconductor light-emitting chip 30 and first base 19 so that inequality (1) defined above holds true.

As illustrated in FIG. 3, in a configuration in which lens optical element 80, which is a fast axis collimator lens, is fixed to first base 19, in order to further ensure the prevention of collision between semiconductor light-emitting chip 30 and lens optical element 80, distance Dz4 between the first front surface of first base 19 and emission surface 30F of semiconductor light-emitting chip 30 may be, for example, 10 µm or more.

In order to couple a plurality of emission lights in the fast axis direction and precisely direct the emission light to the incident surface of a small focusing lens, the emission light emitted as collimated light from lens optical element 80 of semiconductor light-emitting device 1a can be given, for example, a small beam width in the fast axis direction of between 200 µm and 400 µm, inclusive. To obtain such a small beam width, focal length f of lens optical element 80 must be shortened. Thickness (sag) Dz5 of lens optical element 80 at the outermost ray should be decreased in order to shorten focal length f of lens optical element 80, but should be increased to ensure the structural strength of lens optical element 80. In order to achieve both a short focal length f and structural strength, thickness Dz5 can be, for example, between 100 μm and 200 μm, inclusive.

When the refractive index of the material of lens optical element 80 is expressed as n, distance Dz4 is expressed by the following equation (2).

$$Dz4=(DyL/2-Dz5 \times \tan(\theta f1))/\tan(\theta f) \qquad (2)$$

The following equation (3) holds true for divergence angle θf1 and the refractive index n of the material of lens optical element 80.

$$n=\sin(\theta f)/\sin(\theta f1) \qquad (3)$$

In the present variation, since a material with a refractive index n between 1.5 and 1.8, inclusive, is chosen as the material of lens optical element 80, distance Dz4 should be between 13 μm and 200 μm, inclusive.

Assuming that thickness Dz3 of bonding portion 85 is thin enough to be negligible, distance Dz1 in the first direction between first front surface 19F and the emission surface (i.e., distance Dz4) should be between 13 μm and 200 μm, inclusive. In such cases, distance Dy should be between 10 μm and 163 μm, inclusive. Assuming that the thickness of bonding material 18 is thin enough to be negligible with respect to the thickness of spacer 11, distance Dy can be regarded as the thickness of spacer 11. Accordingly, the thickness of spacer 11 should be between 10 μm and 163 μm, inclusive.

This configuration makes it possible to realize semiconductor light-emitting device 1a with high light utilization efficiency.

Manufacturing Method

Next, the manufacturing method of semiconductor light-emitting device 1a according to the present variation will be described with reference to FIG. 4A through FIG. 4D, and the manufacturing method of light source device 102 will be described with reference to FIG. 5. FIG. 4A through FIG. 4D are schematic illustrations of processes in the manufacturing method of first submount 10, preliminary bonding film 85c, and bonding material 85b according to the present variation. FIG. 5 is a schematic illustration of the process of attaching lens optical element 80 to first submount 10 according to the present variation.

Figure 4A:
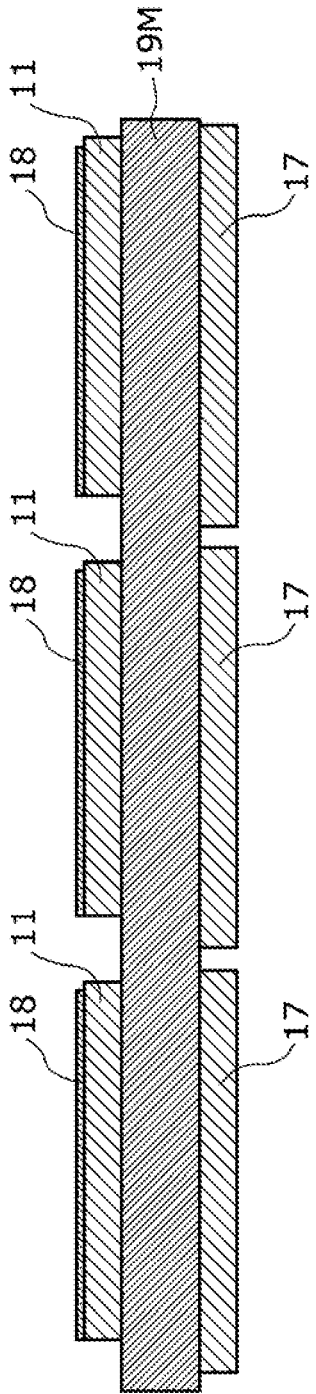
FIG. 4A is a schematic illustration of a first process of a manufacturing method of a first submount, a preliminary bonding film, and a bonding material according to Variation 1 of Embodiment 1.
Figure 5:
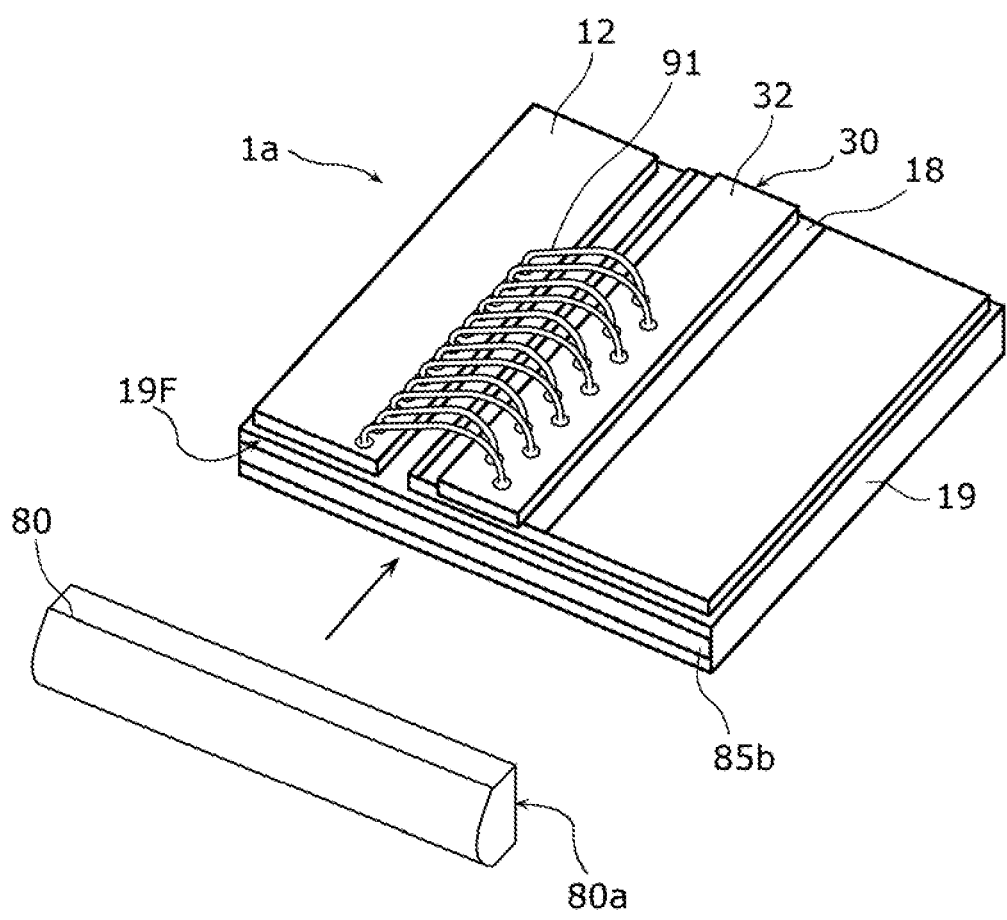
FIG. 5 is a schematic illustration of the process of attaching a lens optical element to the first submount according to Variation 1 of Embodiment 1.

As illustrated in FIG. 4A, base material 19M of first base 19 is prepared. In the present variation, a ceramic plate of AlN, SiC, or diamond or the like of a predetermined thickness is prepared as base material 19M. The thickness of base material 19M is approximately, for example, from 50 μm to 1000 μm.

Next, a metal film of Ti, Pt, or Au or the like is deposited on one of the main surfaces of base material 19M (the upper main surface in FIG. 4A), and then patterned. Next, a metal film of Ti, Pt, or Au or the like is deposited on the other of the main surfaces of base material 19M (the lower main surface in FIG. 4A), and then patterned. Next, a metal such as Cu is deposited on the patterned metal film on both sides of base material 19M by, for example, electrolytic plating. The thickness of the metal such as Cu is approximately, for example, from 10 μm to 200 μm. This forms a plurality of spacers 11 on base material 19M. Although not illustrated in FIG. 4A, second metal material 12 is also formed at the same time on the main surface of base material 19M where spacer 11 is formed. A plurality of backside metal material 17 are also formed at the same time on the other main surface of base material 19M.

Although not illustrated, next, a protective metal film of Cr, Ni, or Au or the like is deposited on spacer 11, second metal material 12, and backside metal material 17 surfaces by, for example, vapor deposition. Patterned bonding material 18 is then formed on a portion of the top of each of the plurality of spacers 11. Acceptable formation methods include vapor deposition using a metal mask or selective electrolytic plating.

Figure 4B:
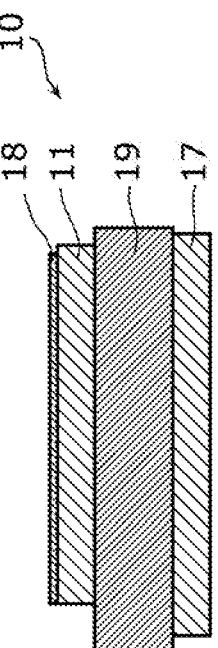
FIG. 4B is a schematic illustration of a second process of the manufacturing method of the first submount, the preliminary bonding film, and the bonding material according to Variation 1 of Embodiment 1.

Next, as illustrated in FIG. 4B, base material 19M is divided (i.e., singulated) into a plurality of first bases 19 by dicing. This makes it possible to form first submount 10.

Figure 4C:
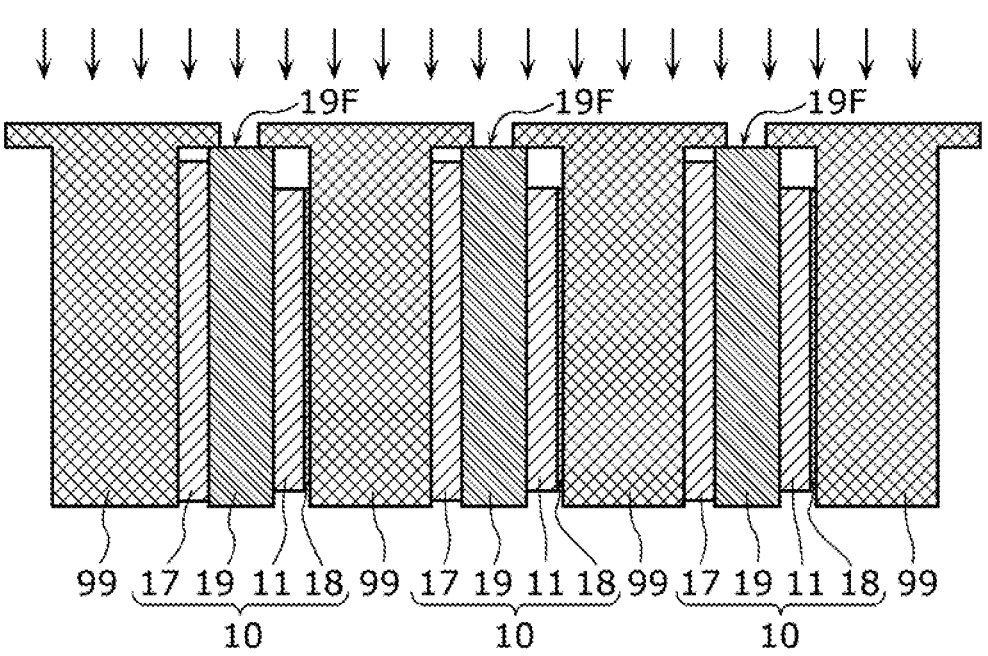
FIG. 4C is a schematic illustration of a third process of the manufacturing method of the first submount, the preliminary bonding film, and the bonding material according to Variation 1 of Embodiment 1.

Next, as illustrated in FIG. 4C, first submount 10 is clamped between T-shaped jigs 99 so as to expose only a portion of first front surface 19F between jigs 99. Next, a metal film of Ti, Pt, or Au or the like is deposited on the exposed portion of first front surface 19F by, for example, vapor deposition to form preliminary bonding film 85c.

Next, bonding material 85b, which is a solder material such as AuSn, is formed on the surface of preliminary bonding film 85c by, for example, vapor deposition or plating.

Figure 4D:
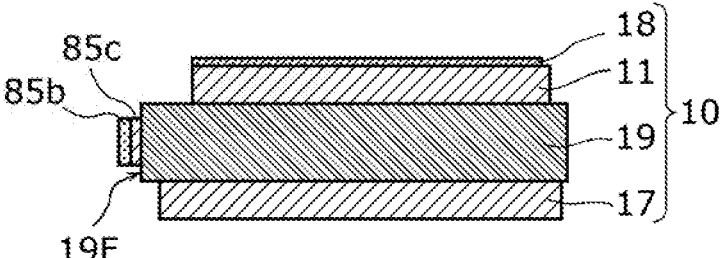
FIG. 4D is a schematic illustration of a fourth process of the manufacturing method of the first submount, the preliminary bonding film, and the bonding material according to Variation 1 of Embodiment 1.

Next, jigs 99 are removed from first submount 10 to complete the manufacturing of first submount 10, preliminary bonding film 85c, and bonding material 85b according to the present variation, as illustrated in FIG. 4D.

Next, as illustrated in FIG. 5, semiconductor light-emitting chip 30 is disposed on bonding material 18 of first submount 10, and second electrode 32 of semiconductor light-emitting chip 30 is connected to second metal material 12 with metal wire 91. This forms semiconductor light-emitting device 1 according to Embodiment 1. Note that in semiconductor light-emitting device 1 illustrated in FIG. 5, preliminary bonding film 85c (not illustrated in FIG. 5) and bonding material 85b are formed on first front surface 19F.

Next, as illustrated in FIG. 5, lens optical element 80 is prepared as a component of the light source device. Here, preliminary bonding film 85a, which has the same configuration as preliminary bonding film 85c, is formed on incident surface 80a of lens optical element 80 by, for example, selective vapor deposition. Next, preliminary bonding film 85a and bonding material 85b are bonded together. More specifically, lens optical element 80 is fixed to first base 19 with the optical axis adjusted as described above.

Semiconductor light-emitting device 1a according to the present variation can be manufactured as described above. With the above manufacturing method, using semiconductor light-emitting device 1a according to the present variation makes it easy to adjust the optical axis of lens optical element 80 included in the light source device, thereby simplifying the manufacturing of the light source device.

Embodiment 2

Next, the semiconductor light-emitting device according to Embodiment 2 will be described. The semiconductor light-emitting device according to the present embodiment differs from semiconductor light-emitting device 1 according to Embodiment 1 mainly in that it includes a second submount in addition to the first submount. The following description will focus on the differences between the semiconductor light-emitting device according the present embodiment and semiconductor light-emitting device 1 according to Embodiment 1.

Overall Configuration

First, the overall configuration of the semiconductor light-emitting device according to the present embodiment will be described with reference to FIG. 6 through FIG. 10B. FIG.

Figure 6:
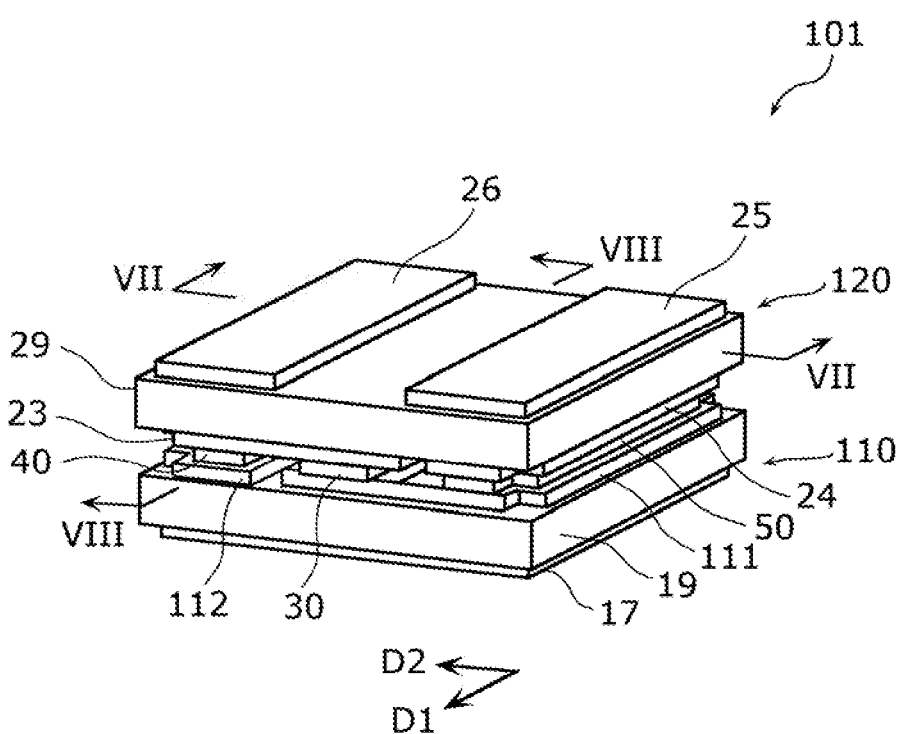
FIG. 6 is a perspective view schematically illustrating the overall configuration of a semiconductor light-emitting device according to Embodiment 2.
Figure 7:
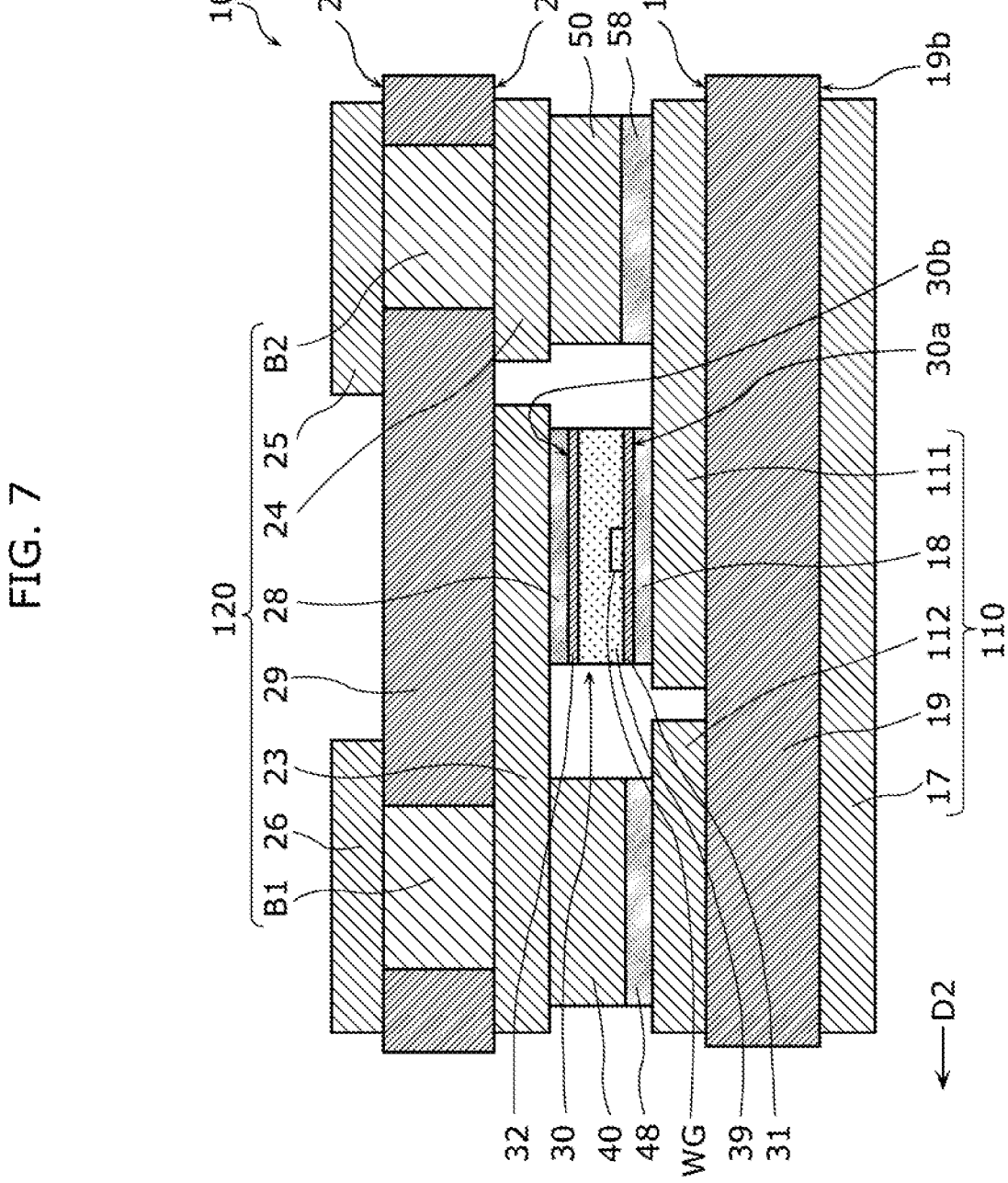
FIG. 7 is a first cross-sectional view schematically illustrating the overall configuration of the semiconductor light-emitting device according to Embodiment 2.
Figure 8:
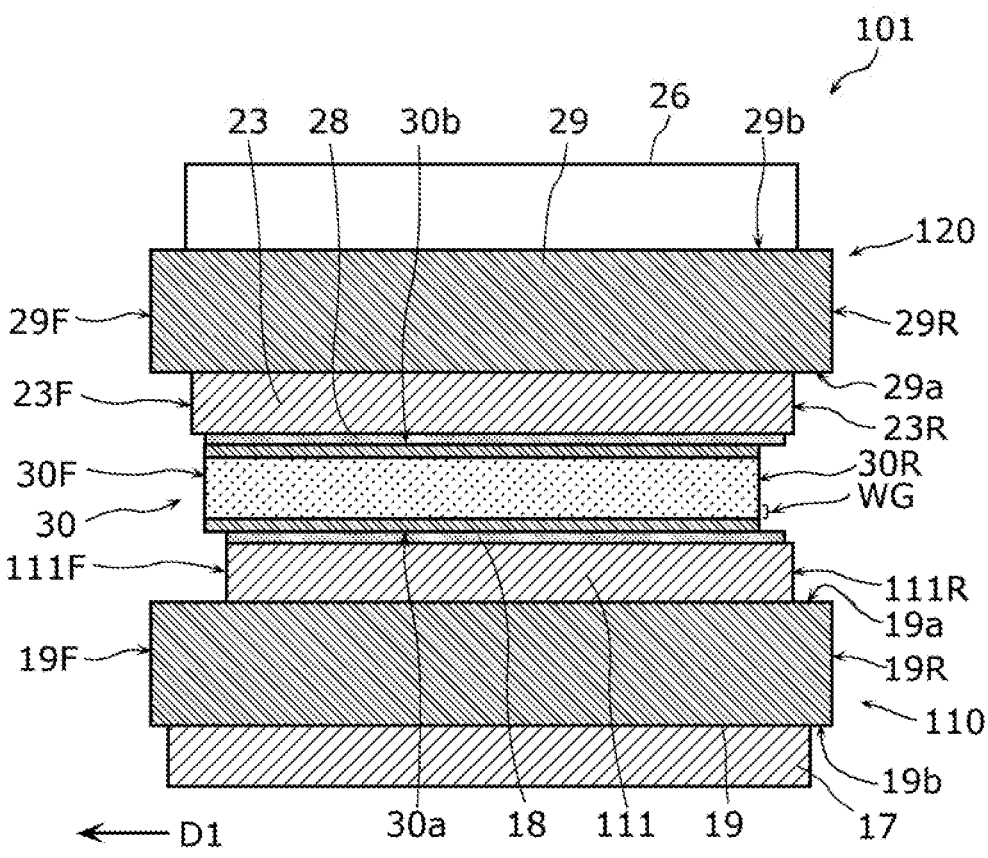
FIG. 8 is a second cross-sectional view schematically illustrating the overall configuration of the semiconductor light-emitting device according to Embodiment 2.
Figure 9:
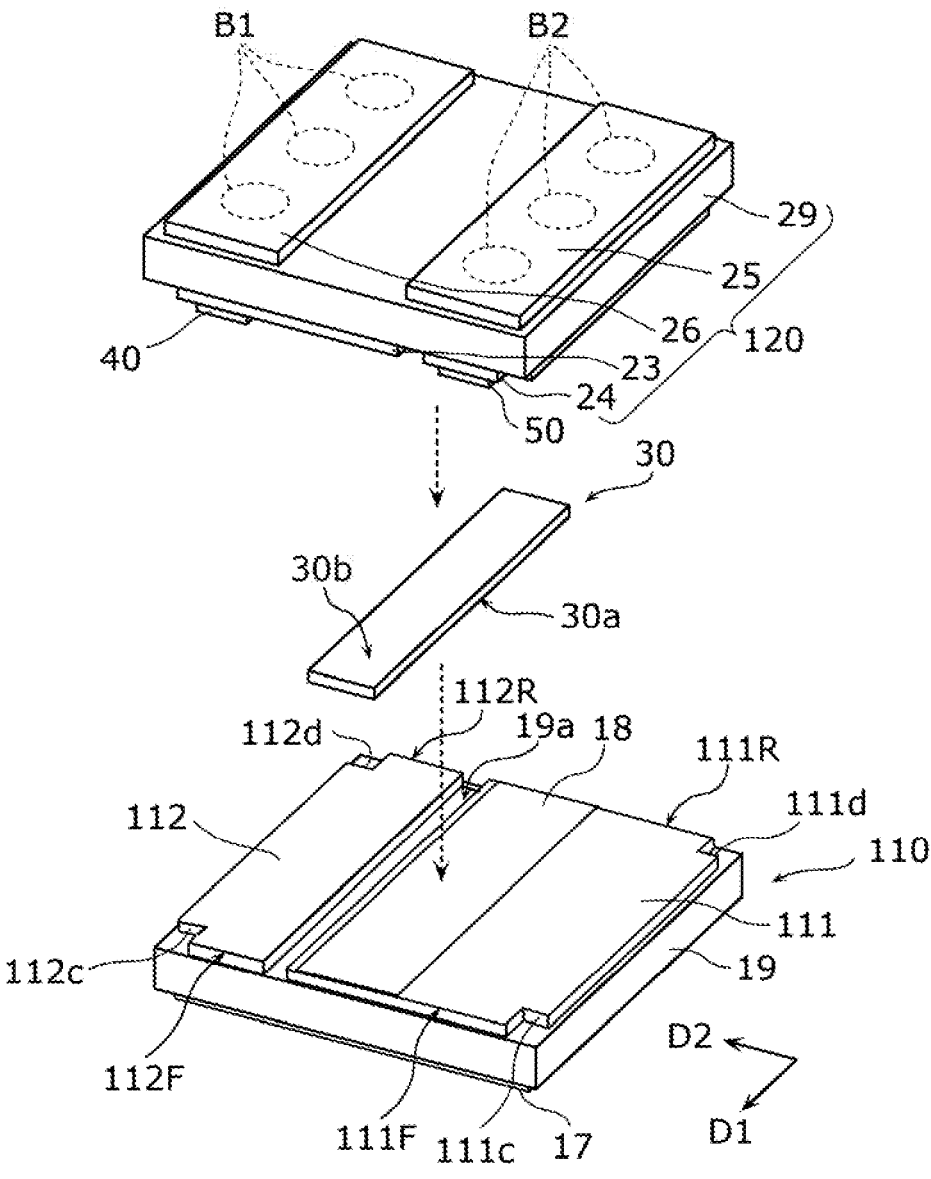
FIG. 9 is an exploded perspective view schematically illustrating the semiconductor light-emitting device according to Embodiment 2.
Figure 10A:
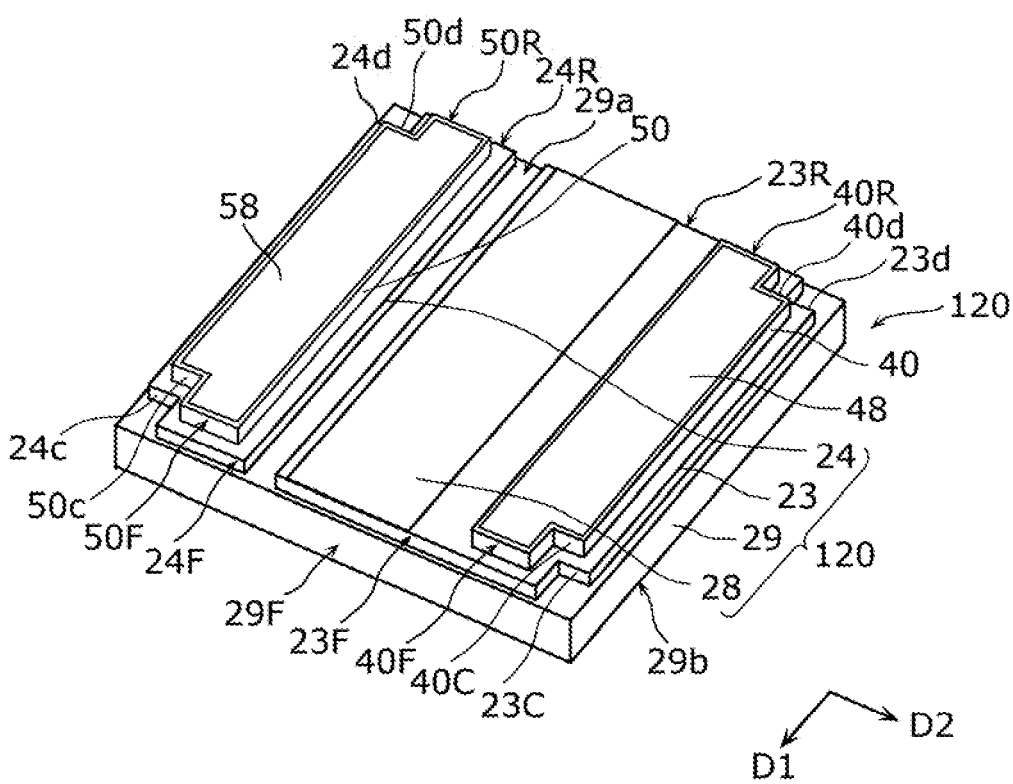
FIG. 10A is a perspective view schematically illustrating a second submount and components connected to the second submount according to Embodiment 2.
Figure 10B:
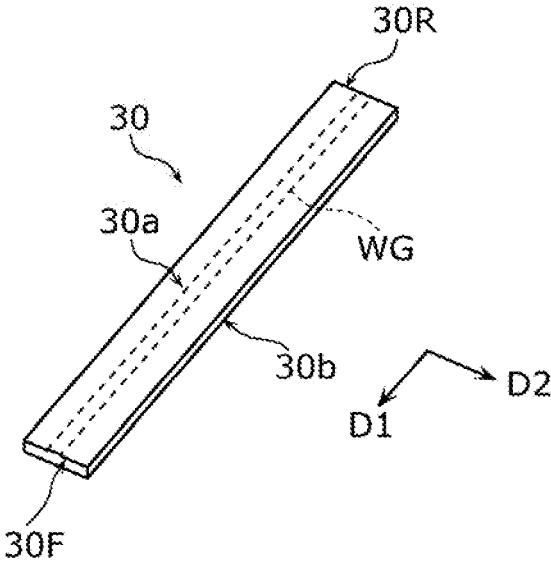
FIG. 10B is a perspective view schematically illustrating a semiconductor light-emitting chip according to Embodiment 2.

6, FIG. 7, and FIG. 8 are respectively a perspective view, a first cross-sectional view, and a second cross-sectional view that schematically illustrate semiconductor light-emitting device 101 according to the present embodiment. FIG. 7 and FIG. 8 are cross-sectional views taken at lines VII-VII and VIII-VIII in FIG. 6, respectively. FIG. 9 is an exploded perspective view of semiconductor light-emitting device 101 according to the present embodiment. FIG. 10A is a perspective view schematically illustrating second submount 120 and the components connected to second submount 120 according to the present embodiment. FIG. 10B is a perspective view schematically illustrating semiconductor light-emitting chip 30 according to the present embodiment.

As illustrated in FIG. 6 through FIG. 8, semiconductor light-emitting device 101 includes first submount 110, semiconductor light-emitting chip 30, and second submount 120. In the present embodiment, semiconductor light-emitting device 101 further includes first sidewall 40 and second sidewall 50, as illustrated in FIG. 6 and FIG. 7. When semiconductor light-emitting device 101 is used in a light source device, it is fixed to a heat-dissipating component, which is not illustrated, by a second bonding material, which is also not illustrated. The heat-dissipating component is disposed on backside metal material 17 of first submount 110, and the second bonding material bonds backside metal material 17 of first submount 110 and the heat-dissipating component together.

Semiconductor light-emitting chip 30 has the same configuration as semiconductor light-emitting chip 30 according to Embodiment 1. As illustrated in FIG. 10B, semiconductor light-emitting chip 30 includes first surface 30a and second surface 30b, and further includes optical waveguide WG that extends in first direction D1, which is parallel to first surface 30a.

As illustrated in FIG. 7, first submount 110 includes first base 19, spacer 111, second metal material 112, bonding material 18, and backside metal material 17. In the present embodiment, first submount 110 further includes bonding material 48 and bonding material 58.

Spacer 111 is one example of the first metal material disposed on third surface 19a of first base 19. Spacer 111 is disposed at least between third surface 19a of first base 19 and first surface 30a of semiconductor light-emitting chip 30. Spacer 111 covers at least the central portion of third surface 19a. In the present embodiment, spacer 111 is thermally and electrically connected to first surface 30a of semiconductor light-emitting chip 30 via bonding material 18. Semiconductor light-emitting chip 30 is junction-down bonded to first submount 110 with first surface 30a facing spacer 111. Spacer 111 is, for example, a plate-shaped metal material consisting mainly of a metal with high thermal conductivity such as Cu, with a protective metal film of, for example, Au or the like formed on the surface.

As illustrated in FIG. 9, in a top view of third surface 19a of first base 19, spacer 111 includes first recess 111c, which is recessed inwardly of spacer 111, at the end edge located near emission surface 30F of semiconductor light-emitting chip 30 (i.e., the front end edge). Stated differently, in a top view of third surface 19a, spacer 111 includes first recess 111c, which is recessed inwardly of spacer 111, at the end edge that is closer to emission surface 30F among the two end edges of spacer 111 in first direction D1. In the present embodiment, first recess 111c is located at the end portion in second direction D2 of spacer 111 that is farther from second metal material 112. In a top view of third surface 19a, first recess 111c is a portion recessed from end surface 111F of spacer 111 located near emission surface 30F of semiconductor light-emitting chip 30 (i.e., from the front end edge), toward rear surface 30R (i.e., rearward). First recess 111c and each of the recesses described below can be used, for example, as a space to dispose bonding material when fixing optical elements or the like to first base 19 and second base 29. In a top view of third surface 19a of first base 19, spacer 111 includes third recess 111d, which is recessed inwardly of spacer 111, at the end edge located near rear surface 30R (i.e., the rear end edge). In a top view of third surface 19a, third recess 111d is a portion recessed from end surface 111R of spacer 111 located near rear surface 30R (i.e., from the rear end edge), toward emission surface 30F (i.e., forward). In the present embodiment, third recess 111d is located at the end portion in second direction D2 of spacer 111 that is farther from second metal material 112.

Second metal material 112 is a metal material disposed on third surface 19a. Second metal material 112 is electrically insulated from spacer 111 and electrically connected to second electrode 32 of semiconductor light-emitting chip 30. In the present embodiment, second metal material 112 is electrically connected to second electrode 32 via bonding material 48, first sidewall 40, and third metal material 23 and bonding material 28 of second submount 120. As illustrated in FIG. 7, second metal material 112 is disposed separated from spacer 111 in second direction D2. Second metal material 112 is, for example, a plate-shaped metal material consisting mainly of a metal with high thermal conductivity such as Cu, with a protective metal film of, for example, Ni or Au or the like formed on the surface.

As illustrated in FIG. 9, in a top view of third surface 19a of first base 19, second metal material 112 includes second recess 112c, which is recessed inwardly of second metal material 112, at the end edge located near emission surface 30F (i.e., the front end edge). Stated differently, in a top view of third surface 19a, second metal material 112 includes second recess 112c, which is recessed inwardly of second metal material 112, at the end edge that is closer to emission surface 30F among the two end edges of second metal material 112 in first direction D1. In a top view of third surface 19a, second recess 112c is a portion recessed from end surface 112F of second metal material 112 located near emission surface 30F (i.e., from the front end edge), toward rear surface 30R (i.e., rearward). In the present embodiment, second recess 112c is located at the end portion in second direction D2 of second metal material 112 that is farther from spacer 111. In a top view of third surface 19a of first base 19, second metal material 112 includes fourth recess 112d, which is recessed inwardly of second metal material 112, at the end edge located near rear surface 30R (i.e., the rear end edge). In a top view of third surface 19a, fourth recess 112d is a portion recessed from end surface 112R of second metal material 112 located near rear surface 30R (i.e., from the rear end edge), toward emission surface 30F (i.e., forward). In the present embodiment, fourth recess 112d is located at the end portion in second direction D2 of second metal material 112 that is farther from spacer 111.

Second submount 120 is a component disposed on second surface 30b of semiconductor light-emitting chip 30. Second submount 120 functions as a heat sink from which heat generated by semiconductor light-emitting chip 30 is discharged. As illustrated in FIG. 7, second submount 120 includes second base 29, third metal material 23, fourth metal material 24, fifth metal material 25, sixth metal material 26, and bonding material 28. Semiconductor light-emitting device 101 includes first sidewall 40 and second sidewall 50 that are connected to second submount 120. In the present embodiment, first sidewall 40 and second sidewall 50 are attached in advance to second submount 120, as illustrated in FIG. 9 and FIG. 10A. Bonding material 48 and bonding material 58 are attached to parts of surfaces of first sidewall 40 and second sidewall 50, respectively.

Second base 29 is the main component of second submount 120. Second base 29 includes fourth surface 29*a* and fifth surface 29*b* on opposite sides. In the present embodiment, second base 29 includes a second insulating member comprising an insulating material, and one or more first vias B1 and one or more second vias B2 that penetrate second base 29 between fourth surface 29*a* and fifth surface 29*b*. In the present embodiment, as illustrated in FIG. 9, second base 29 includes three first vias B1 arranged in first direction D1 and three second vias B2 arranged in first direction D1. For example, the second insulating member of second base 29 is a ceramic substrate, a polycrystalline substrate, or a monocrystalline substrate comprising a material with high thermal conductivity such as alumina, AlN, SiC, or diamond or the like. The one or more first vias B1 and one or more second vias B2 are through-hole electrodes of a metal material formed in a hole penetrating second base 29 between fourth surface 29*a* and fifth surface 29*b*, and comprise a metal material such as W, Mo, Cu, or Au or the like. Third metal material 23 and fourth metal material 24 are disposed on fourth surface 29*a* of second base 29. Bonding material 28 is disposed on third metal material 23. Fifth metal material 25 and sixth metal material 26 are disposed on fifth surface 29*b* of second base 29. Each of third metal material 23, fourth metal material 24, fifth metal material 25, and sixth metal material 26 is, for example, a plate-shaped metal material consisting mainly of a metal with high thermal conductivity such as Cu, with a protective metal film of, for example, Ni or Au or the like formed on the surface.

Third metal material 23 is a metal material disposed on fourth surface 29*a* of second base 29. Second surface 30*b* of semiconductor light-emitting chip 30 faces third metal material 23. Third metal material 23 is disposed at least between fourth surface 29*a* of second base 29 and second surface 30*b* of semiconductor light-emitting chip 30. In the present embodiment, third metal material 23 is thermally and electrically connected to second surface 30*b* of semiconductor light-emitting chip 30 via bonding material 28. Semiconductor light-emitting chip 30 is bonded to second submount 120 with second surface 30*b* facing third metal material 23. Third metal material 23 is connected to first sidewall 40.

Bonding material 28 is a metal material that bonds third metal material 23 and semiconductor light-emitting chip 30. Bonding material 28 is disposed on the surface of third metal material 23 that faces semiconductor light-emitting chip 30. Bonding material 28 is formed of, for example, AuSn.

As illustrated in FIG. 10A, in a top view of fourth surface 29*a* of second base 29, third metal material 23 includes fifth recess 23*c*, which is recessed inwardly of third metal material 23, at the end edge, i.e., end surface 23F located near emission surface 30F (i.e., the front end edge). Among the two end surfaces of third metal material 23 in first direction D1, end surface 23F is the end surface that is closer to emission surface 30F. In a top view of fourth surface 29*a*, fifth recess 23*c* is a portion recessed from end surface 23F of third metal material 23 located near emission surface 30F (i.e., from the front end edge), toward rear surface 30R (i.e., rearward). In the present embodiment, fifth recess 23*c* is located at the end portion in second direction D2 of third metal material 23 that is farther from fourth metal material 24. In a top view of fourth surface 29*a* of second base 29, third metal material 23 includes seventh recess 23*d*, which is recessed inwardly of third metal material 23, at the end edge located near rear surface 30R (i.e., the rear end edge). In a top view of fourth surface 29*a*, seventh recess 23*d* is a portion recessed from end surface 23R of third metal material 23 located near rear surface 30R (i.e., from the rear end edge), toward emission surface 30F (i.e., forward). In the present embodiment, seventh recess 23*d* is located at the end portion in second direction D2 of third metal material 23 that is farther from fourth metal material 24.

Fourth metal material 24 is a metal material disposed on fourth surface 29*a* of second base 29. Fourth metal material 24 is electrically insulated from third metal material 23 and electrically connected to first electrode 31 of semiconductor light-emitting chip 30. As illustrated in FIG. 7, fourth metal material 24 is disposed separated from third metal material 23 in second direction D2.

As illustrated in FIG. 10A, in a top view of fourth surface 29*a* of second base 29, fourth metal material 24 includes sixth recess 24*c*, which is recessed inwardly of fourth metal material 24, at the end edge located near emission surface 30F (i.e., the front end edge). In a top view of fourth surface 29*a*, sixth recess 24*c* is a portion recessed from end surface 24F of fourth metal material 24 located near emission surface 30F (i.e., from the front end edge), toward rear surface 30R (i.e., rearward). In the present embodiment, sixth recess 24*c* is located at the end portion in second direction D2 of fourth metal material 24 that is farther from third metal material 23. In a top view of fourth surface 29*a* of second base 29, fourth metal material 24 includes eighth recess 24*d*, which is recessed inwardly of fourth metal material 24, at the end edge located near rear surface 30R (i.e., the rear end edge). In a top view of fourth surface 29*a*, eighth recess 24*d* is a portion recessed from end surface 24R of fourth metal material 24 located near rear surface 30R (i.e., from the rear end edge), toward emission surface 30F (i.e., forward). In the present embodiment, eighth recess 24*d* is located at the end portion in second direction D2 of fourth metal material 24 that is farther from third metal material 23.

Fifth metal material 25 is a metal material disposed on fifth surface 29*b* of second base 29. As illustrated in FIG. 7, fifth metal material 25 is disposed separated from sixth metal material 26 in second direction D2.

Sixth metal material 26 is a metal material disposed on fifth surface 29*b* of second base 29. Sixth metal material 26 is electrically insulated from fifth metal material 25 and electrically connected to second electrode 32 of semiconductor light-emitting chip 30. In the present embodiment, sixth metal material 26 is electrically connected to second electrode 32 via the first via B1, third metal material 23, and bonding material 28. As illustrated in FIG. 7, sixth metal material 26 is disposed separated from fifth metal material 25 in second direction D2.

First sidewall 40 and second sidewall 50 are components connected to second submount 120. In the present embodiment, as illustrated in FIG. 7 and other figures, first sidewall 40 and second sidewall 50 are arranged in the second direction. Semiconductor light-emitting chip 30 is disposed between first sidewall 40 and second sidewall 50. First sidewall 40 includes a first metal column that is electrically connected to second metal material 112 and third metal material 23. Second sidewall 50 includes a second metal column that is electrically connected to spacer 111 and fourth metal material 24. The first metal column is electrically connected to second metal material 112 via bonding material 48 and directly connected to third metal material

23. The second metal column is electrically connected to spacer 111 via bonding material 58 and directly connected to fourth metal material 24.

In the present embodiment, first sidewall 40 includes only the first metal column, but may include other components besides the first metal column. Likewise, second sidewall 50 includes only the second metal column, but may include other components besides the second metal column. For example, first sidewall 40 and second sidewall 50 may include insulating material. The first metal column and the second metal column are formed of a material with high thermal conductivity and high electrical conductivity, such as Cu, Ni, Al, or Au or the like. In the present embodiment, the first metal column and the second metal column are metal columns with Ni or Au protective metal films formed on the surface of Cu columns formed by electrolytic plating.

In the present embodiment, first sidewall 40 (i.e., the first metal column) has an approximate quadrangular column shape with a length in first direction D1 equivalent to that of semiconductor light-emitting chip 30. As illustrated in FIG. 10A, in a top view of fourth surface 29*a* of second base 29, first sidewall 40 includes ninth recess 40*c*, which is recessed inwardly of first sidewall 40, at the end edge located near emission surface 30F (i.e., the front end edge). In a top view of fourth surface 29*a*, ninth recess 40*c* is a portion recessed from end surface 40F of first sidewall 40 located near emission surface 30F (i.e., from the front end edge), toward rear surface 30R (i.e., rearward). In the present embodiment, ninth recess 40*c* is located at the end portion in second direction D2 of first sidewall 40 that is farther from second sidewall 50. In a top view of fourth surface 29*a* of second base 29, first sidewall 40 includes eleventh recess 40*d*, which is recessed inwardly of first sidewall 40, at the end edge located near rear surface 30R (i.e., the rear end edge). In a top view of fourth surface 29*a*, eleventh recess 40*d* is a portion recessed from end surface 40R of first sidewall 40 located near rear surface 30R (i.e., from the rear end edge), toward emission surface 30F (i.e., forward). In the present embodiment, eleventh recess 40*d* is located at the end portion in second direction D2 of first sidewall 40 that is farther from second sidewall 50.

In the present embodiment, second sidewall 50 (i.e., the second metal column) has an approximate quadrangular column shape with a length in first direction D1 equivalent to that of semiconductor light-emitting chip 30. As illustrated in FIG. 10A, in a top view of fourth surface 29*a* of second base 29, second sidewall 50 includes tenth recess 50*c*, which is recessed inwardly of second sidewall 50, at the end edge located near emission surface 30F (i.e., the front end edge). In a top view of fourth surface 29*a*, tenth recess 50*c* is a portion recessed from end surface 50F of second sidewall 50 located near emission surface 30F (i.e., from the front end edge), toward rear surface 30R (i.e., rearward). In the present embodiment, tenth recess 50*c* is located at the end portion in second direction D2 of second sidewall 50 that is farther from first sidewall 40. In a top view of fourth surface 29*a* of second base 29, second sidewall 50 includes twelfth recess 50*d*, which is recessed inwardly of second sidewall 50, at the end edge located near rear surface 30R (i.e., the rear end edge). In a top view of fourth surface 29*a*, twelfth recess 50*d* is a portion recessed from end surface 50R of second sidewall 50 located near rear surface 30R (i.e., from the rear end edge), toward emission surface 30F (i.e., forward). In the present embodiment, twelfth recess 50*d* is located at the end portion in second direction D2 of first sidewall 40 that is farther from first sidewall 40.

As illustrated in FIG. 10A, bonding material 48 is attached to the surface of first sidewall 40. Bonding material 58 is attached to the surface of second sidewall 50. Bonding material 48 is a metal material that bonds first sidewall 40 and second metal material 112. Bonding material 48 is formed of, for example, AuSn. Bonding material 48 is disposed on the surface of second metal material 112 that faces first sidewall 40. In the present embodiment, bonding material 48 includes inwardly recessed portions that match ninth recess 40*c* and eleventh recess 40*d*.

Bonding material 58 is a metal material that bonds spacer 111 and second sidewall 50. Bonding material 58 is formed of, for example, AuSn. Bonding material 58 is disposed on the surface of spacer 111 that faces second sidewall 50. In the present embodiment, bonding material 58 includes inwardly recessed portions that match tenth recess 50*c* and twelfth recess 50*d*.

With the above configuration, fourth metal material 24 is electrically connected to first electrode 31 via second sidewall 50, bonding material 58, and spacer 111 and bonding material 18 of first submount 110. Accordingly, fifth metal material 25 is electrically connected to first electrode 31 through second via B2, fourth metal material 24, second sidewall 50, bonding material 58, and spacer 111 and bonding material 18 of first submount 110. On the other hand, sixth metal material 26 is electrically insulated from fifth metal material 25 and electrically connected to second electrode 32 of semiconductor light-emitting chip 30.

Semiconductor light-emitting device 101 having the above configuration is supplied with electric power from fifth metal material 25 and sixth metal material 26 of second submount 120. Fifth metal material 25 and sixth metal material 26 are each connected to an external power source via, for example, a metal line, which is not illustrated. The current input to fifth metal material 25 is input to first electrode 31 of semiconductor light-emitting chip 30 through second via B2 of second submount 120, fourth metal material 24, second sidewall 50 (the second metal column), bonding material 58, spacer 111, and bonding material 18. The current input to semiconductor light-emitting chip 30 is output from second electrode 32 through third metal material 23, first via B1, and sixth metal material 26.

In the present embodiment, the method of electrically connecting sixth metal material 26 of second submount 120 and third metal material 23 together and electrically connecting fifth metal material 25 and fourth metal material 24 together is exemplified as, but not limited to a method of providing first via B1 and second via B2 that pass through second base 29. For example, a metal film may be formed on the fourth surface, the side surfaces, and the fifth surface of second base 29 to electrically connect sixth metal material 26 and third metal material 23 together and electrically connect fifth metal material 25 and fourth metal material 24 together.

Manufacturing Method

Next, the manufacturing method of semiconductor light-emitting device 101 according to the present embodiment will be described with reference to FIG. 11A through FIG. 11D. FIG. 11A through FIG. 11D are cross-sectional views schematically illustrating processes in the manufacturing method of semiconductor light-emitting device 101 according to the present embodiment. FIG. 11A through FIG. 11D illustrate cross sections taken perpendicular to first surface 30*a* through optical waveguide WG of semiconductor light-emitting chip 30.

Figure 11A:
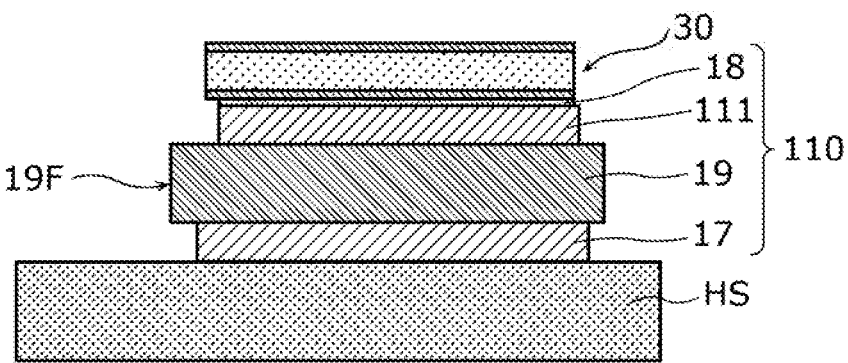
FIG. 11A is a cross-sectional view schematically illustrating a first process of the manufacturing method of the semiconductor light-emitting device according to Embodiment 2.

First, as illustrated in FIG. 11A, first submount 110 is disposed on heating stage HS, and semiconductor light-emitting chip 30 is disposed in a predetermined position on first submount 110. Note that the manufacturing method of first submount 110 is the same as the manufacturing method of first submount 10 according to Variation 1 of Embodiment 1.

Figure 11B:
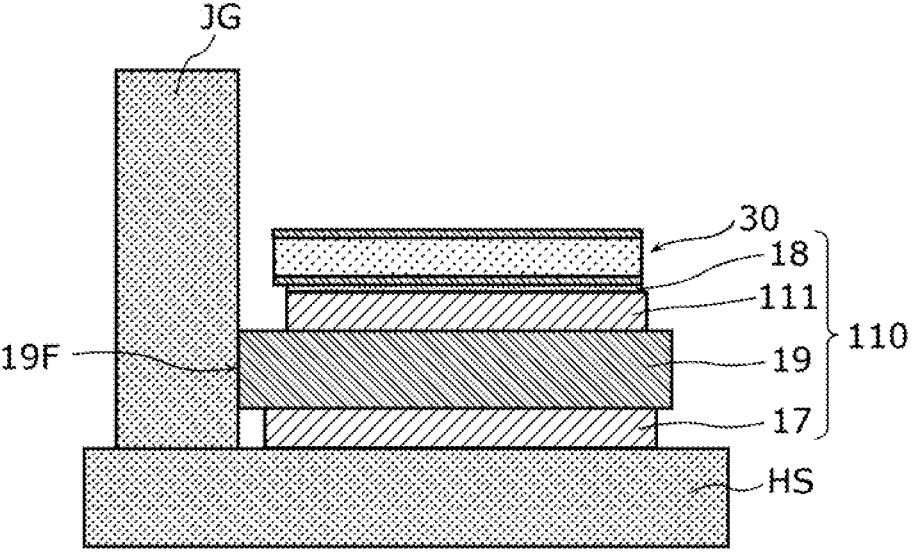
FIG. 11B is a cross-sectional view schematically illustrating a second process of the manufacturing method of the semiconductor light-emitting device according to Embodiment 2.

Next, as illustrated in FIG. 11B, positioning jig JG with a peak-to-valley surface roughness of 1 μm or less is prepared, and positioning jig JG is disposed so that its surface contacts first front surface 19F of first base 19. Here, the surface of positioning jig JG that contacts first front surface 19F is flat and perpendicular to the mounting surface of heating stage HS (i.e., the top surface of heating stage HS illustrated in FIG. 11B). As used herein, perpendicular means not only exactly perpendicular but also substantially perpendicular. For example, perpendicular means between 85° and 95°, inclusive.

Figure 11C:
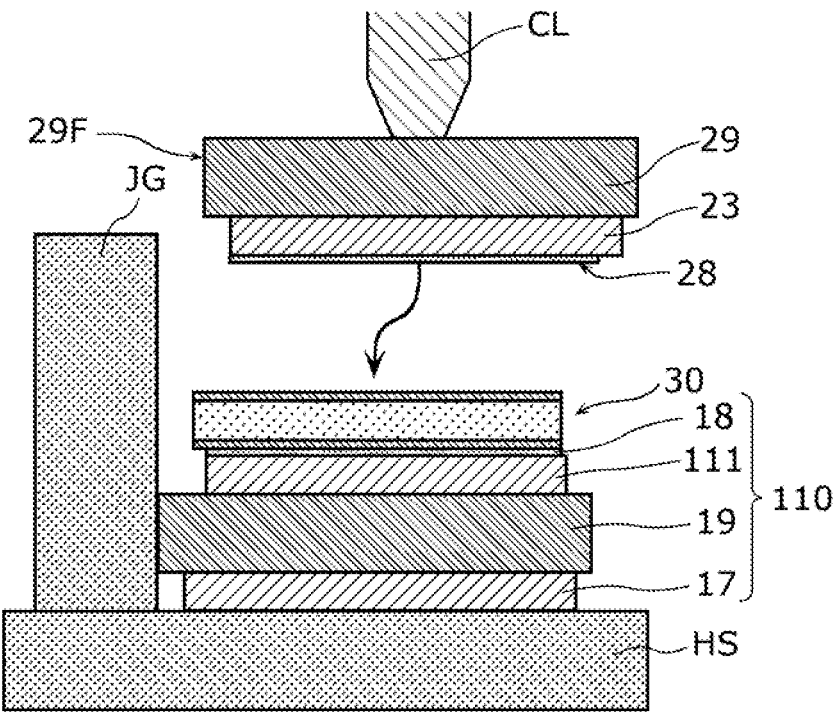
FIG. 11C is a cross-sectional view schematically illustrating a third process of the manufacturing method of the semiconductor light-emitting device according to Embodiment 2.

Next, as illustrated in FIG. 11C, second submount 120 is moved using collet CL. First sidewall 40 and second sidewall 50 are attached to second submount 120, as illustrated in FIG. 10A.

Figure 11D:
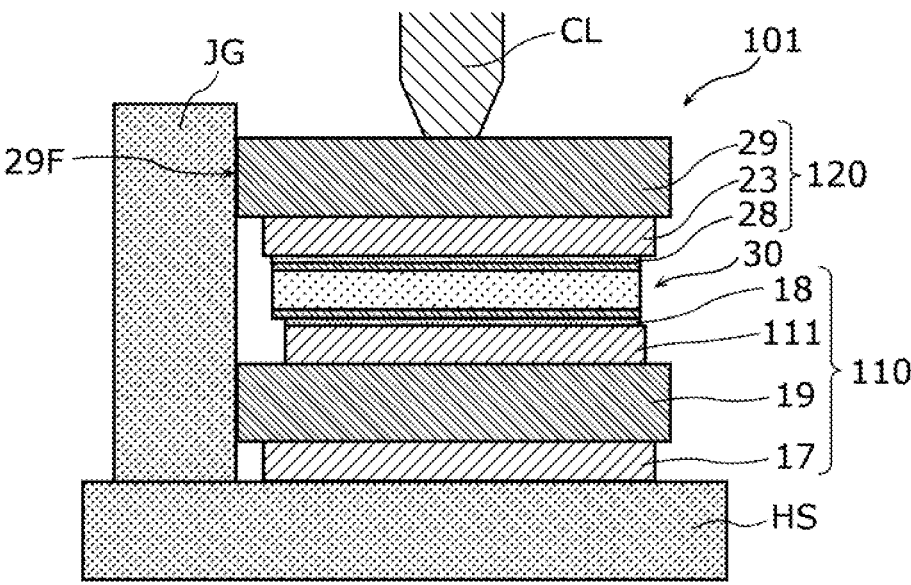
FIG. 11D is a cross-sectional view schematically illustrating a fourth process of the manufacturing method of the semiconductor light-emitting device according to Embodiment 2.

Next, as illustrated in FIG. 11D, after second submount 120 is disposed so that second front surface 29F, which is the end surface located near emission surface 30F of second base 29 of second submount 120 (i.e., second front surface 29F is the front end surface), contacts the surface of positioning jig JG (the surface on the same plane as the surface that first front surface 19F contacts), second submount 120 is fixed in place. Here, among the two end surfaces of second base 29 in first direction D1, second front surface 29F is the end surface that is closer to emission surface 30F.

Next, heating stage HS heats first submount 110 and the like to melt each bonding material. The manufacturing of semiconductor light-emitting device 101 can then be completed by cooling heating stage HS to solidify each bonding material. This manufacturing method makes it possible to limit misalignment between first front surface 19F and second front surface 29F in first direction D1 to within 5 μm, for example.

Emission surface 30F of semiconductor light-emitting chip 30 may be disposed 10 μm or more rearward of first front surface 19F so that positioning jig JG and emission surface 30F of semiconductor light-emitting chip 30 are not in contact.

Positional Relationships between Elements

Figure 12:
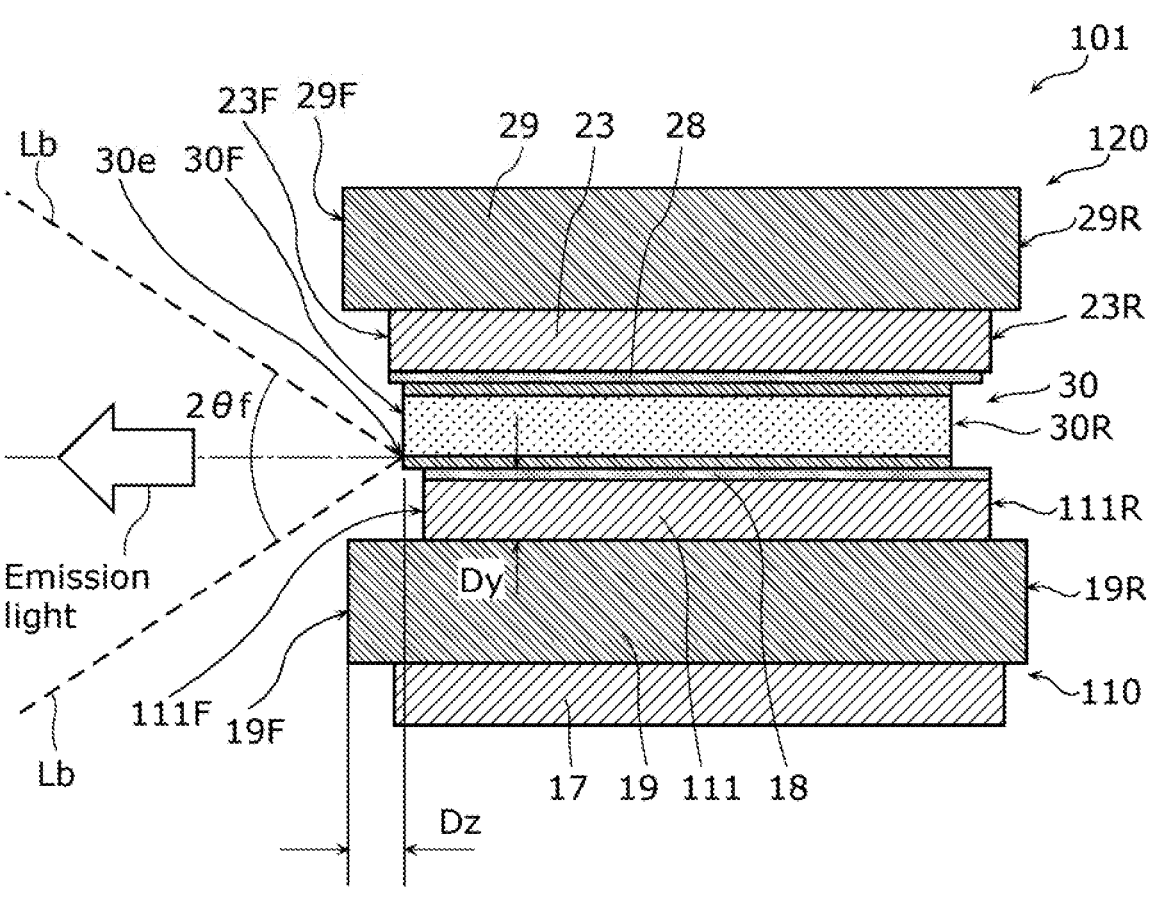
FIG. 12 is a cross-sectional view schematically illustrating positional between of the relationships elements the semiconductor light-emitting device according to Embodiment 2.

Next, the positional relationships between elements of semiconductor light-emitting device 101 will be explained with reference to FIG. 12. FIG. 12 is a cross-sectional view schematically illustrating the positional relationships between elements of semiconductor light-emitting device 101 according to the present embodiment.

As illustrated in FIG. 12, just as in semiconductor light-emitting device 1 according to Embodiment 1, in semiconductor light-emitting device 101 according to the present embodiment as well, emission surface 30F is located forward of end surface 111F of spacer 111, which is the end surface on the emission surface 30F side of spacer 111 (i.e., the front end surface of spacer 111), and first front surface 19F is located forward of emission surface 30F. This configuration allows semiconductor light-emitting device 101 according to the present embodiment to achieve the same advantageous effects as semiconductor light-emitting device 1 according to Embodiment 1.

The relationship between distance Dz between first front surface 19F and emission surface 30F and distance Dy between first surface 30a of semiconductor light-emitting chip 30 and third surface 19a of first base 19 that is required to inhibit emission light from being blocked by first base 19 is calculated in the same manner as the relationship between distance Dz1 and distance Dy described in Embodiment 1. In general, distance Dz should be less than or equal to distance Dy. This inhibits the emission light from being blocked by first base 19 when the divergence angle (20f) of the emission light is 90° or less.

In the present embodiment, second front surface 29F of second base 29 of second submount 120, which is the front surface located near (i.e., in front of) emission surface 30F, is positioned forward of emission surface 30F.

For example, in applications using an optical element on which the emission light is incident, since second front surface 29F is disposed forward of emission surface 30F of semiconductor light-emitting chip 30, the optical element can be fixed to second front surface 29F with inhibited interference with semiconductor light-emitting chip 30. Fixing the optical element to second base 29 in this manner allows for the position at which the optical element fixed relative to semiconductor light-emitting chip 30 to be more precise than when second submount 120 and the optical element are separated. This allows the emission light from semiconductor light-emitting chip 30 to be efficiently coupled to the optical element. First base 19 may be used in addition to second base 29 to fix the optical element. For example, first front surface 19F and second front surface 29F may be coplanar.

In order to inhibit emission light with a divergence angle of 20f as described above from being blocked by third metal material 23 and second base 29, the positional relationship between (i) end surface 23F and second front surface 29F of third metal material 23 and (ii) emission surface 30F can be defined in the same manner as the positional relationship between first front surface 19F and emission surface 30F in Embodiment 1. In other words, the positional relationship can be defined from the relationship between the distance from emission surface 30F to end surface 23F and the distance from first surface 30a to second surface 30b, or the relationship between the distance from emission surface 30F to second front surface 29F and the distance from first surface 30a to fourth surface 29a.

In the present embodiment, end surface 23F located on the emission surface 30F side (i.e., the front side) of third metal material 23 is positioned forward of emission surface 30F. This allows efficient heat discharge to third metal material 23 and second base 29 via bonding material 28 that contacts emission surface 30F, which is the hottest in semiconductor light-emitting chip 30. Heat dissipation paths from semiconductor light-emitting chip 30 will be described later.

End surface 23F of third metal material 23 is disposed rearward of first front surface 19F and second front surface 29F. This makes it possible to inhibit the emission light from being blocked by third metal material 23. By keeping the distance from emission surface 30F to end surface 23F to approximately no longer than the distance from third metal material 23 to light-emitting point 30e (i.e., approximately the thickness of semiconductor light-emitting chip 30), the emission light can be inhibited from being blocked by third metal material 23 with more certainty.

Figure 13:
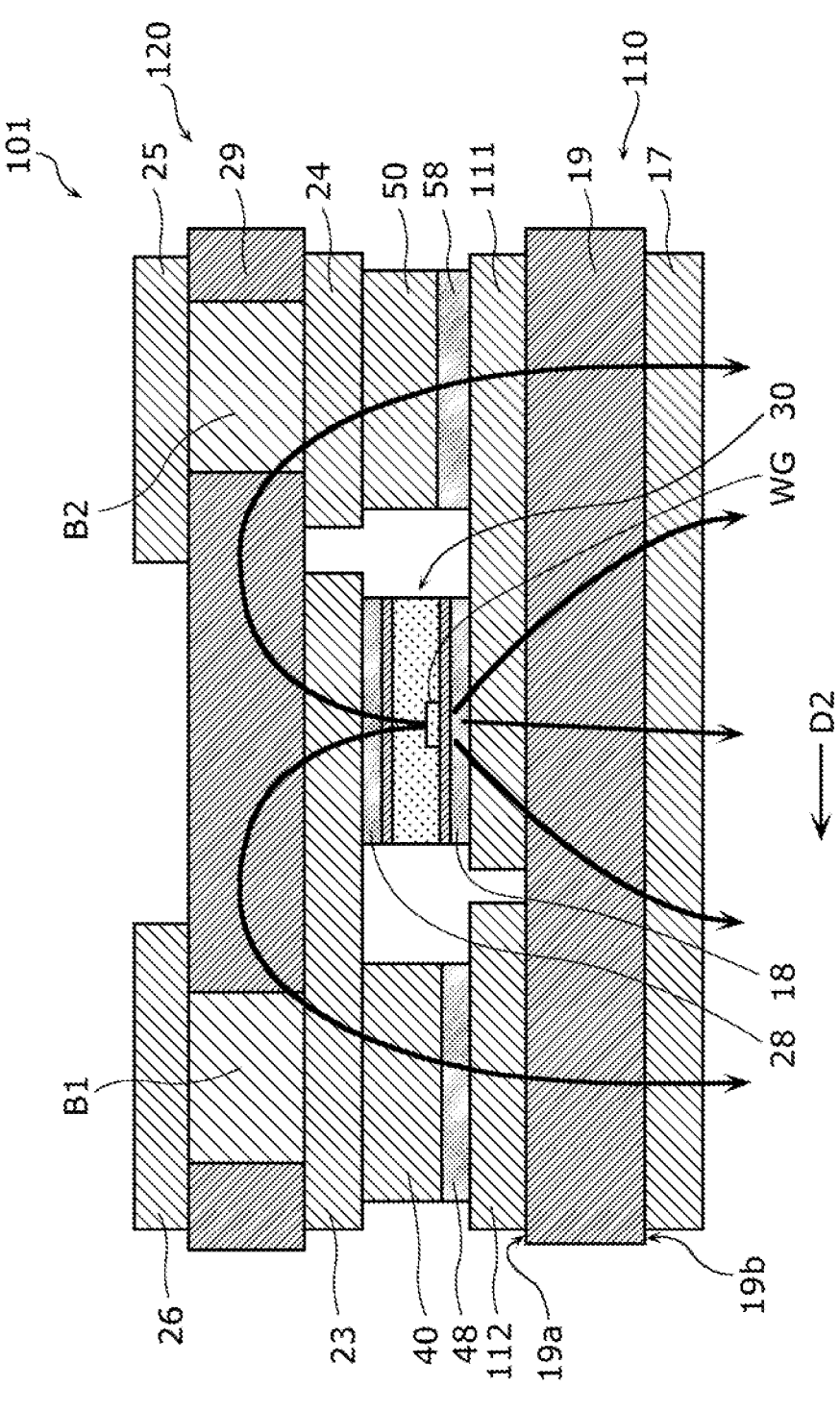
FIG. 13 is a first cross-sectional view schematically illustrating heat dissipation paths of the semiconductor light-emitting device according to Embodiment 2.
Figure 14:
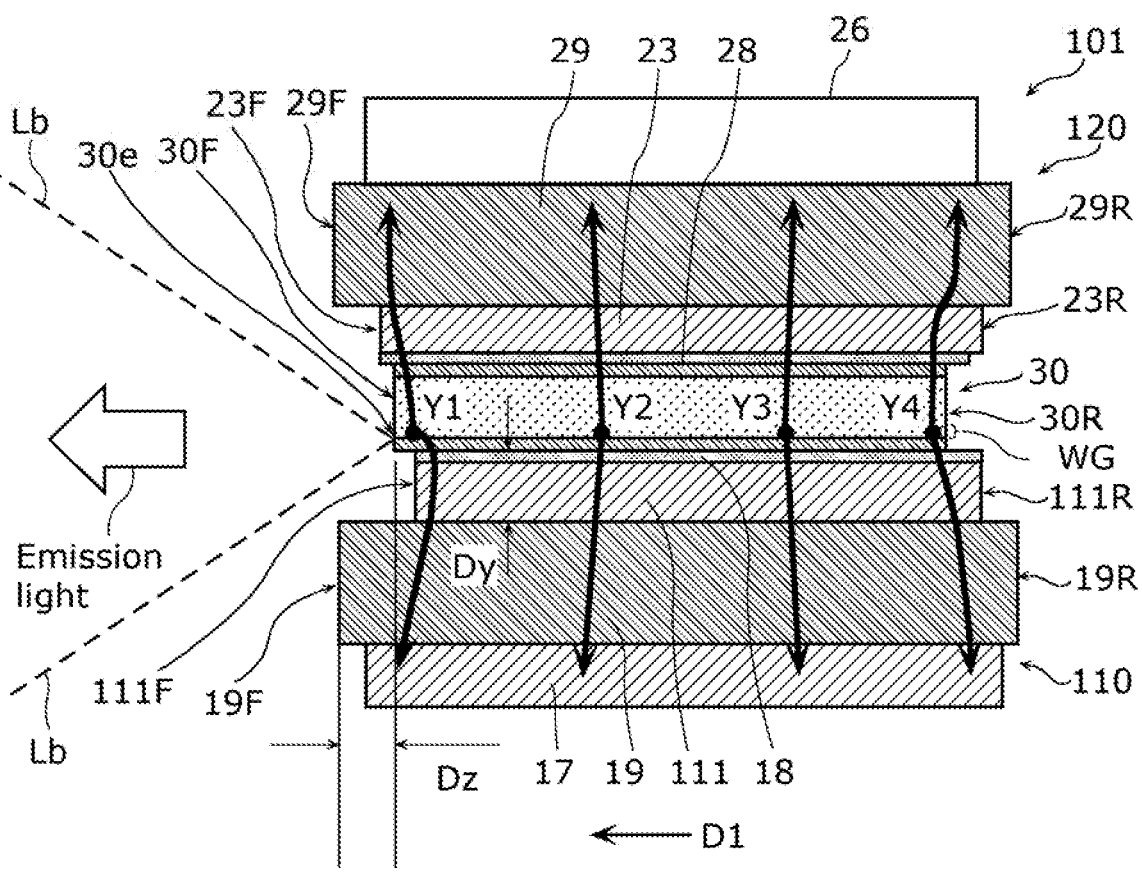
FIG. 14 is a second cross-sectional view schematically illustrating heat dissipation paths of the semiconductor light-emitting device according to Embodiment 2.

Next, heat dissipation paths in semiconductor light-emitting device 101 according to the present embodiment will be described with reference to FIG. 13 and FIG. 14. FIG. 13 and FIG. 14 are respectively a first cross-sectional view and a second cross-sectional view that schematically illustrate heat dissipation paths of semiconductor light-emitting device 101 according to the present embodiment. FIG. 13 and FIG. 14 are cross-sectional views taken at lines VII-VII and VIII-VIII in FIG. 6, respectively. FIG. 13 and FIG. 14 illustrate an overview of the heat dissipation pathways with arrows.

As illustrated in FIG. 13, among heat generated by optical waveguide WG (in particular, the active layer) of semiconductor light-emitting chip 30, some of the heat is conducted directly to first submount 110 and diffused in second direction D2 while being discharged to a heat-dissipating component that, although not illustrated, is disposed in a position opposing backside surface 19*b* of first submount 110 and is connected to first submount 110. Among heat generated by optical waveguide WG of semiconductor light-emitting chip 30, some of the heat is also conducted to first submount 110 via second submount 120 as well as first sidewall 40 and second sidewall 50, and discharged to the heat-dissipating component that is not illustrated.

Thus, in semiconductor light-emitting device 101 according to the present embodiment, first submount 110, second submount 120, first sidewall 40, and second sidewall 50 can be used to effectively dissipate the heat generated in optical waveguide WG of semiconductor light-emitting chip 30. In second submount 120, third metal material 23 having high thermal conductivity and a predetermined thickness is disposed in the proximity of semiconductor light-emitting chip 30. This allows the heat generated in optical waveguide WG to dissipate more effectively. In first submount 110, spacer 111 having high thermal conductivity and a predetermined thickness is disposed in the proximity of optical waveguide WG of semiconductor light-emitting chip 30. This allows the heat generated in optical waveguide WG to dissipate more effectively. Since first submount 110 includes first base 19, which has insulating properties, an electrically conductive material, such as copper or other metal, can be used as a heat-dissipating component. This configuration allows the positive and negative electrodes of semiconductor light-emitting chip 30 and the heat-dissipating component to be insulated from each other, while effectively dissipating the heat generated by semiconductor light-emitting chip 30.

FIG. 14 illustrates the respective heat dissipation paths of the heat generated at point Y1 near emission surface 30F, points Y2 and Y3 near the center in first direction D1, and point Y4 near rear surface 30R on optical waveguide WG, indicated by arrows, to provide an overview of the heat dissipation paths. Some of the heat generated from any of the points is conducted to first submount 110, and some is conducted to second submount 120. At least some of the heat conducted to second submount 120 is conducted to first submount 110 via first sidewall 40 and second sidewall 50, as illustrated in FIG. 13.

As illustrated in FIG. 14, heat generated at point Y1 is conducted from semiconductor light-emitting chip 30 to third metal material 23 and second base 29 of second submount 120. Here, end surface 23F of third metal material 23 is positioned forward of emission surface 30F, and second front surface 29F is positioned forward of end surface 23F. Accordingly, heat generated at point Y1 can be effectively dissipated because heat generated at point Y1 is conducted to the front side of second submount 120 while being diffused.

On the other hand, heat generated at point Y4 near rear surface 30R is, on the second submount 120 side, conducted from semiconductor light-emitting chip 30 to the third metal material and second base 29 of second submount 120, and on the first submount 110 side, conducted from semiconductor light-emitting chip 30 to spacer 111 and first base 19 of first submount 110.

In the present embodiment, semiconductor light-emitting chip 30 includes rear surface 30R that faces away from emission surface 30F. First base 19 includes first rear surface 19R, which is the end surface located near rear surface 30R (i.e., is the rear end surface), and second base 29 of second submount 120 includes second rear surface 29R, which is the end surface located near rear surface 30R (i.e., is the rear end surface). Here, rear surface 30R is located forward of first rear surface 19R and forward of second rear surface 29R. Stated differently, first rear surface 19R is the end surface closer to rear surface 30R among the two end surfaces of first base 19 in first direction D1, and second rear surface 29R is the end surface closer to rear surface 30R among the two end surfaces of second base 29 in first direction D1.

More specifically, end surface 111R, which is the end surface in spacer 111 of first submount 110 that is located near rear surface 30R, is located rearward of rear surface 30R of semiconductor light-emitting chip 30. First rear surface 19R, which is the end surface of first base 19 of first submount 110 that is located near rear surface 30R, is located rearward of end surface 111R. Accordingly, heat generated at point Y4 can be effectively dissipated because heat generated at point Y4 is conducted to the rear side of first submount 110 while being diffused.

End surface 23R, which is the end surface in third metal material 23 of second submount 120 that is located near rear surface 30R, is located rearward of rear surface 30R of semiconductor light-emitting chip 30. Second rear surface 29R, which is the end surface of second base 29 of second submount 120 that is located near rear surface 30R, is located rearward of end surface 23R. Accordingly, heat generated at point Y4 can be effectively dissipated because heat generated at point Y4 is conducted to the rear of second submount 120 while being diffused.

Variation 1 of Embodiment 2

Next, the semiconductor light-emitting device according to Variation 1 of Embodiment 2 will be described. The semiconductor light-emitting device according to the present variation differs from semiconductor light-emitting device 101 according to Embodiment 2 mainly in that it includes a first optical element and a second optical element. The following description will focus on the differences between the semiconductor light-emitting device according to the present variation and semiconductor light-emitting device 101 according to Embodiment 2.

Overall Configuration

Figure 15:
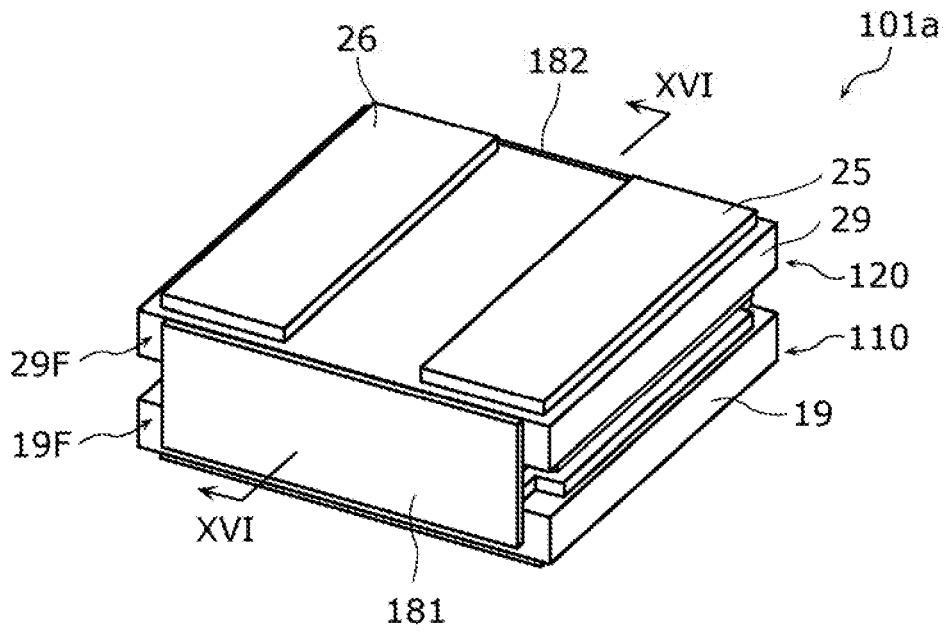
FIG. 15 is a perspective view schematically illustrating a semiconductor light-emitting device according to Variation 1 of Embodiment 2.
Figure 16:
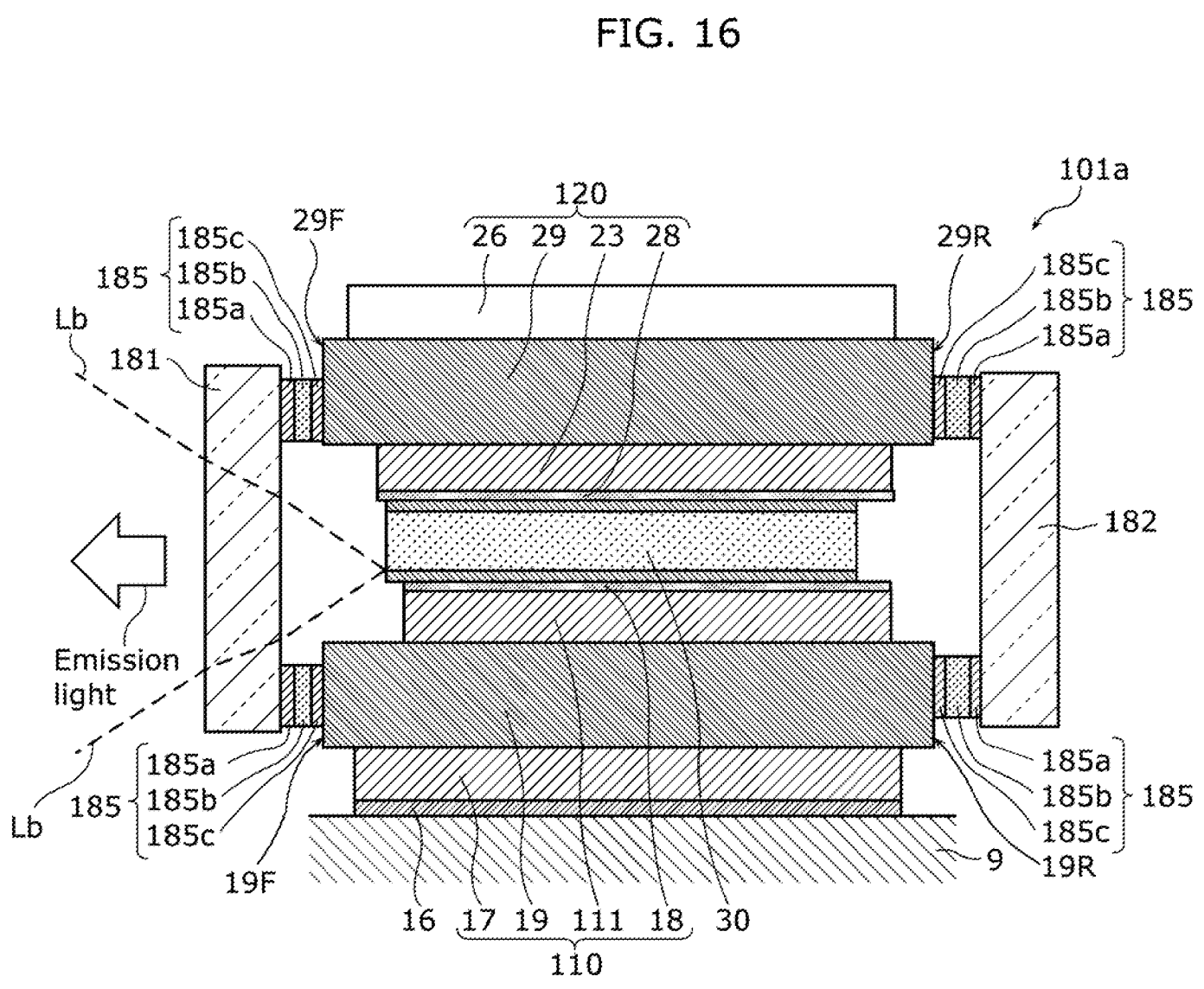

First, the overall configuration of the semiconductor light-emitting device according to the present variation will be described with reference to FIG. 15 and FIG. 16. FIG. 15 and FIG. 16 are respectively perspective and cross-sectional views that schematically illustrate semiconductor light-emitting device 101*a* according to the present variation. FIG. 16 is a cross-sectional view taken at line XVI-XVI in FIG. 15, illustrating semiconductor light-emitting device 101*a* fixed to heat-dissipating component 9 with second bonding material 16.

As illustrated in FIG. 16, semiconductor light-emitting device 101*a* according to the present variation includes semiconductor light-emitting chip 30, first submount 110, and second submount 120, just like semiconductor light-emitting device 101 according to Embodiment 2. Although not illustrated in FIG. 15 or FIG. 16, semiconductor light-emitting device 101*a* includes first sidewall 40 and second sidewall 50. Semiconductor light-emitting device 101*a* according to the present variation further includes first optical element 181, second optical element 182, and four bonding portions 185.

First optical element 181 is one example of the light-transmissive component that transmits at least part of the emission light, and in the present embodiment, is a light-transmissive plate having a flat, rectangular shape, as illustrated in FIG. 15. The thickness of first optical element 181 is, for example, approximately between 10 μm and 300 μm, inclusive. First optical element 181 is one example of the optical element connected to first submount 110 and second submount 120. First optical element 181 is disposed forward of emission surface 30F of semiconductor light-emitting chip 30. More specifically, as illustrated in FIG. 15 and FIG. 16, first optical element 181 is disposed on first front surface 19F and second front surface 29F. In the present variation, first optical element 181 is bonded to first base 19 and second base 29 by bonding portion 185 disposed on each of first front surface 19F and second front surface 29F.

Second optical element 182 is one example of the third sidewall disposed on first rear surface 19R of first base 19 and second rear surface 29R of second base 29, and like first optical element 181, is a light-transmissive plate having a flat, rectangular shape. The thickness of second optical element 182 is, for example, approximately between 10 μm and 1000 μm, inclusive. Second optical element 182 is one example of the optical element connected to first submount 110 and second submount 120. Second optical element 182 is disposed rearward of rear surface 30R of semiconductor light-emitting chip 30. More specifically, as illustrated in FIG. 16, second optical element 182 is disposed on first rear surface 19R and second rear surface 29R. In the present variation, second optical element 182 is bonded to first base 19 and second base 29 by bonding portion 185 disposed on each of first rear surface 19R and second rear surface 29R. Although second optical element 182, which is a light-transmissive component, is used as one example of the third sidewall in the present variation, the third sidewall need not be light-transmissive.

Bonding portion 185 includes preliminary bonding films 185*a* and 185*c* and bonding material 185*b*. Preliminary bonding films 185*a* and 185*c* have the same configuration as preliminary bonding films 85*a* and 85*c* according to Variation 1 of Embodiment 1. Bonding material 185*b* has the same configuration as bonding material 85*b* according to Variation 1 of Embodiment 1.

In semiconductor light-emitting device 101*a* according to the present variation, semiconductor light-emitting chip 30 is surrounded by first submount 110, second submount 120, first optical element 181, second optical element 182, first sidewall 40, and second sidewall 50. This makes it possible to reduce contact between semiconductor light-emitting chip 30 and the outside air around semiconductor light-emitting device 101*a*. It is therefore possible to inhibit the degradation of semiconductor light-emitting chip 30 due to contact with the outside air during, for example, transportation of semiconductor light-emitting device 101*a*. Power can then be supplied to semiconductor light-emitting chip 30 from an external source using fifth metal material 25 and sixth metal material 26, while surrounding semiconductor light-emitting chip 30. By using a light-transmissive material as first optical element 181, the emission light emitted from the semiconductor light-emitting chip can be extracted out and the semiconductor light-emitting chip can be protected.

End surfaces 40F and 50F, which are the respective end surfaces of first sidewall 40 and second sidewall 50 that are near emission surface 30F (i.e., are the front end surfaces), may be coplanar with first front surface 19F and second front surface 29F. End surfaces 40R and 50R, which are the respective end surfaces of first sidewall 40 and second sidewall 50 that are near rear surface 30R (i.e., are the rear end surfaces), may be coplanar with first rear surface 19R and second rear surface 29R. Since this can reduce the gap between (i) first sidewall 40 and second sidewall 50 and (ii) first optical element 181 and second optical element 182, contact between semiconductor light-emitting chip 30 and the outside air can be further reduced.

Manufacturing Method

Figure 17:
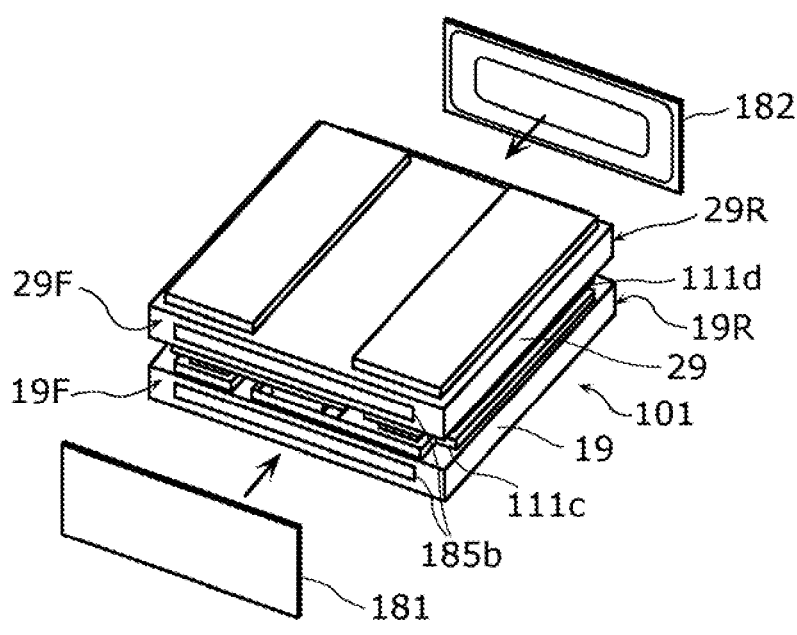
FIG. 17 is a perspective view schematically illustrating the manufacturing method of a semiconductor light-emitting device according to Variation 1 of Embodiment 2.

Next, the manufacturing method of semiconductor light-emitting device 101*a* according to the present variation will be described with reference to FIG. 17. FIG. 17 is a perspective view schematically illustrating the manufacturing method of semiconductor light-emitting device 101*a* according to the present variation.

First, semiconductor light-emitting device 101 according to Embodiment 2 is manufactured. Here, on first submount 110 and second submount 120, preliminary bonding film 185*c* and bonding material 185*b* are formed on each of first front surface 19F, first rear surface 19R, second front surface 29F, and second rear surface 29R using the same manufacturing method as in Variation 1 of Embodiment 1. First optical element 181 is prepared, and preliminary bonding film 185*a* is formed on first optical element 181 at positions opposite each of first front surface 19F and second front surface 29F. Second optical element 182 is prepared, and preliminary bonding film 185*a* is formed on second optical element 182 at positions opposite each of first rear surface 19R and second rear surface 29R.

Next, first optical element 181 is disposed on first front surface 19F and second front surface 29F. Second optical element 182 is also disposed on first rear surface 19R and second rear surface 29R. Next, bonding material 185*b* is heated and melted, and then cooled to solidify. With this, first optical element 181 and second optical element 182 can be bonded to first base 19 and second base 29.

Semiconductor light-emitting device 101*a* according to the present variation can be manufactured as described above.

Variation 2 of Embodiment 2

Next, the semiconductor light-emitting device according to Variation 2 of Embodiment 2 will be described. The semiconductor light-emitting device according to the present variation differs from semiconductor light-emitting device 101*a* according to Variation 1 of Embodiment 2 mainly in regard to the configuration for sealing areas between (i) first optical element 181 and second optical element 182 and (ii) first base 19 and second base 29. The following description will focus on the differences between the semiconductor light-emitting device according the present variation and semiconductor light-emitting device 101*a* according to Variation 1 of Embodiment 2, with reference to FIG. 18.

Figure 18:
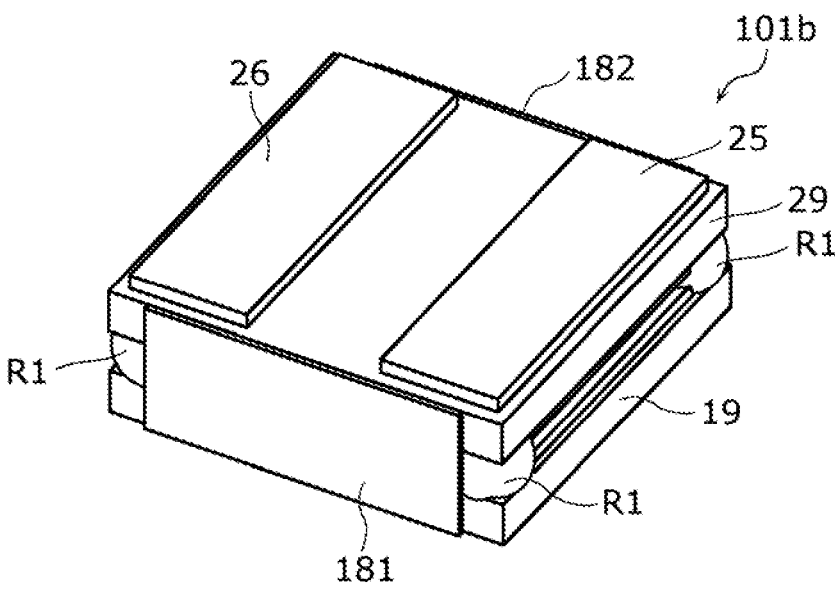
FIG. 18 is a perspective view schematically illustrating the overall configuration of a semiconductor light-emitting device according to Variation 2 of Embodiment 2.

FIG. 18 is a perspective view schematically illustrating the overall configuration of semiconductor light-emitting device 101*b* according to the present variation. As illustrated in FIG. 18, sealing material R1 seals areas between (i) first optical element 181 and second optical element 182 and (ii)

first base 19 and second base 29. For example, siloxane-free or low-siloxane ultraviolet curable resin or thermoset resin can be used as sealing material R1.

More specifically, the gap surrounded by first optical element 181, first base 19, second base 29, and first sidewall 40, the gap surrounded by first optical element 181, first base 19, second base 29, and second sidewall 50, the gap surrounded by second optical element 182, first base 19, second base 29, and first sidewall 40, and the gap surrounded by second optical element 182, first base 19, second base 29, and second sidewall 50 are each filled with sealing material R1. With this, semiconductor light-emitting chip 30 is tightly sealed by first base 19, second base 29, first optical element 181, second optical element 182, and sealing material R1. In this way, semiconductor light-emitting chip 30 is hermetically sealed by first submount 110, second submount 120, first optical element 181, second optical element 182, first sidewall 40, and second sidewall 50. Contact between semiconductor light-emitting chip 30 and the outside air can therefore be reduced, inhibiting degradation of semiconductor light-emitting chip 30. Moreover, the optical tweezer effect inhibits foreign matter from adhering to emission surface 30F of semiconductor light-emitting chip 30 while semiconductor light-emitting device 101*b* is operating. This allows semiconductor light-emitting device 101*b* to be operated for longer periods of time.

In semiconductor light-emitting device 101*b* according to the present variation, sealing material R1 can be formed by, for example, manufacturing semiconductor light-emitting device 101*a* according to Variation 1 of Embodiment 2, disposing sealing material R1 in each of first recess 111*c*, second recess 112*c*, third recess 111*d*, and fourth recess 112*d* using a nozzle or the like, and curing sealing material R1 by ultraviolet irradiation, heating, or other some other means. Since first recess 111*c*, second recess 112*c*, third recess 111*d*, and fourth recess 112*d* are formed in first submount 110 and second submount 120, a predetermined volume of sealing material R1 can be easily retained in each recess. This makes it easy to hermetically seal semiconductor light-emitting chip 30.

Variation 3 of Embodiment 2

Next, the semiconductor light-emitting device according to Variation 3 of Embodiment 2 will be described. The semiconductor light-emitting device according to the present variation differs from semiconductor light-emitting device 101*b* according to Variation 2 of Embodiment 2 mainly in that the rear surface 30R side of semiconductor light-emitting chip 30 is sealed by sealing material instead of second optical element 182. The following description will focus on the differences between the semiconductor light-emitting device according the present variation and semiconductor light-emitting device 101*b* according to Variation 2 of Embodiment 2, with reference to FIG. 19A and FIG. 19B.

Figure 19A:
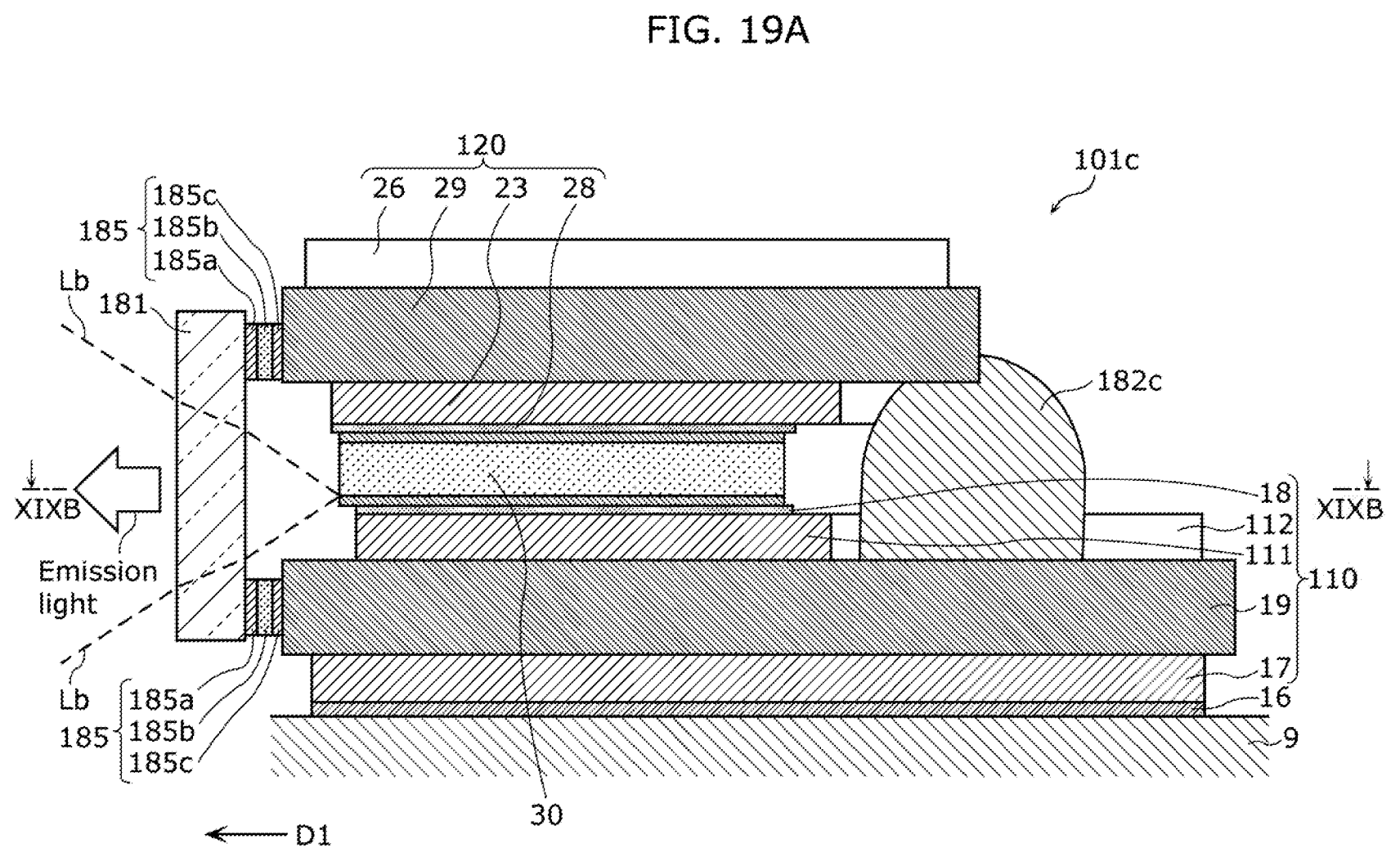
Figure 19B:
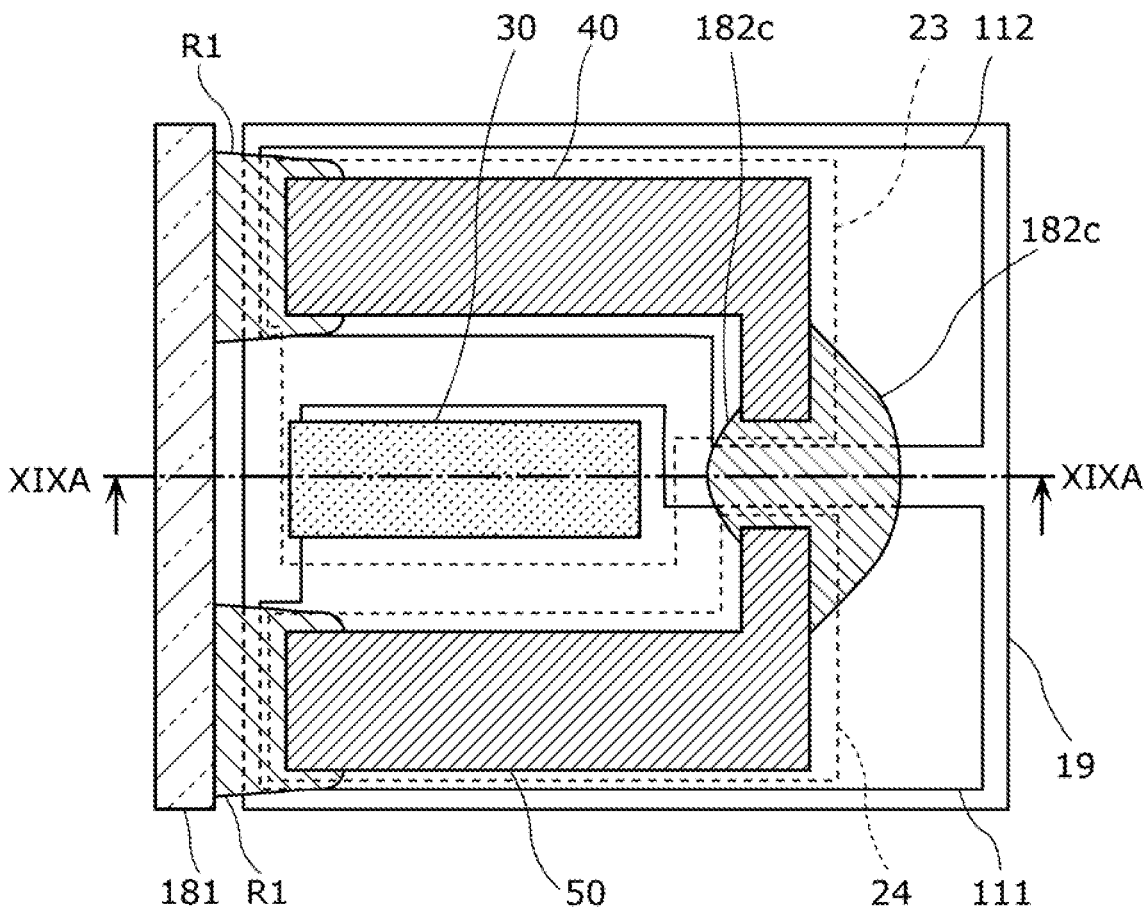
FIG. 19B is a cross-sectional view schematically illustrating the semiconductor light-emitting device according to Variation 3 of Embodiment 2.

FIG. 19A is a cross-sectional view schematically illustrating the overall configuration of semiconductor light-emitting device 101*c* according to the present variation. FIG. 19A illustrates a cross section taken perpendicular to first surface 30*a* of semiconductor light-emitting chip 30, through semiconductor light-emitting chip 30. FIG. 19B is a cross-sectional view schematically illustrating semiconductor light-emitting device 101*c* according to the present variation. FIG. 19B illustrates a cross section taken at line XIXB-XIXB in FIG. 19A. FIG. 19B illustrates the outlines of third metal material 23 and fourth metal material 24 with dashed lines to illustrate the shapes of third metal material 23 and fourth metal material 24. The cross section illustrated in FIG. 19A corresponds to a cross section taken at line XIXA-XIXA in FIG. 19B.

As illustrated in FIG. 19A, semiconductor light-emitting device 101*c* according to the present variation includes semiconductor light-emitting chip 30, first submount 110, second submount 120, first optical element 181, two bonding portions 185, and sealing material 182*c*. Although not illustrated in FIG. 19A, semiconductor light-emitting device 101*c* includes first sidewall 40, second sidewall 50, and sealing material R1, just like semiconductor light-emitting device 101*b* according to Variation 2 of Embodiment 2.

First submount 110 according to the present variation is longer than second submount 120 in first direction D1, and first submount 110 protrudes more rearwardly than second submount 120, with respect to second rear surface 29R. This allows for sealing material 182*c* to be easily disposed on first submount 110. In the present variation, each of first sidewall 40 and second sidewall 50 is L-shaped in plan view, rather than rectangular. First sidewall 40 and second sidewall 50 are arranged to surround rear surface 30R of semiconductor light-emitting chip 30. In other words, first sidewall 40 and second sidewall 50 include portions arranged to oppose rear surface 30R of semiconductor light-emitting chip 30. Spacer 111, second metal material 112, third metal material 23, and fourth metal material 24 are also formed in a shape, such as L-shaped, to match the shapes of first sidewall 40 and second sidewall 50.

This reduces the gap between first sidewall 40 and second sidewall 50, the gap between spacer 111 and second metal material 112, and the gap between third metal material 23 and fourth metal material 24, whereby a small amount of sealing material 182*c* can be used to seal semiconductor light-emitting chip 30.

For example, siloxane-free or low-siloxane ultraviolet curable resin or thermoset resin can be used as sealing material 182*c*, just like sealing material R1. Glass having a low melting point can be used as sealing material 182*c*.

Next, the manufacturing method of semiconductor light-emitting device 101*c* according to the present variation will be described. First, just like in semiconductor light-emitting device 101*a* according to Variation 1 of Embodiment 2, semiconductor light-emitting chip 30, first submount 110, second submount 120, first sidewall 40, second sidewall 50, and first optical element 181 are assembled.

Next, sealing material R1 is disposed in first recess 111*c* and second recess 112*c* using a nozzle or the like. Sealing material 182*c* is placed in the gap surrounded by first submount 110, second submount 120, first sidewall 40, and second sidewall 50 rearward of rear surface 30R of semiconductor light-emitting chip 30, using a nozzle or the like.

Sealing material R1 and sealing material 182*c* are then cured by ultraviolet irradiation, heating, or some other means.

Semiconductor light-emitting device 101*c* according to the present variation can be manufactured via such processes.

Semiconductor light-emitting device 101*c* according to the present variation achieves the same advantageous effects as semiconductor light-emitting device 101*b* according to Variation 2 of Embodiment 2. Furthermore, since semiconductor light-emitting device 101*c* according to the present variation does not use second optical element 182, the configuration and manufacturing method can be simplified compared to semiconductor light-emitting device 101*b* according to Variation 2 of Embodiment 2. Note that the shape of first sidewall 40 and second sidewall 50 can be any shape, and is not limited to L-shaped. For example, one of first sidewall 40 and second sidewall 50 may be rectangular in shape, and the other may be L-shaped. With this, by disposing the L-shaped sidewall to partially face rear surface 30R of semiconductor light-emitting chip 30, sealing material 182*c* can be disposed in a position where it does not face rear surface 30R of semiconductor light-emitting chip 30.

Variation 4 of Embodiment 2

Next, the semiconductor light-emitting device according to Variation 4 of Embodiment 2 will be described. The semiconductor light-emitting device according to the present variation differs from semiconductor light-emitting device 101 according to Embodiment 2 mainly in that it includes a fast axis collimator lens. The following description will focus on the differences between the semiconductor light-emitting device according the present variation and semiconductor light-emitting device 101 according to Embodiment 2, with reference to FIG. 20.

Figure 20:
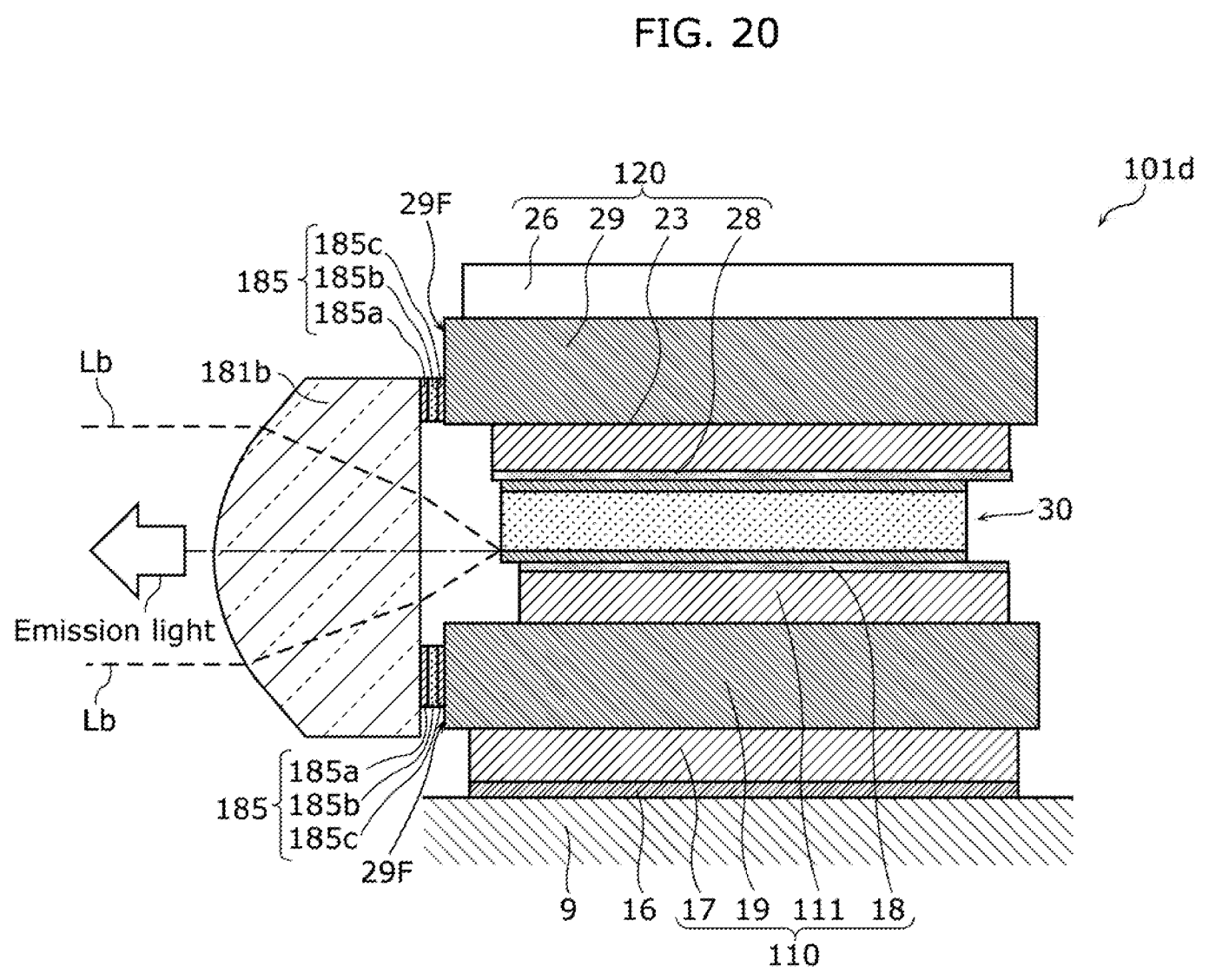

FIG. 20 is a cross-sectional view schematically illustrating the overall configuration of semiconductor light-emitting device 101*d* according to the present variation. As illustrated in FIG. 20, semiconductor light-emitting device 101*d* according to Embodiment 2 includes semiconductor light-emitting device 101, first optical element 181*b*, and bonding portion 185.

First optical element 181*b* is a fast axis collimator lens. First optical element 181*b* is connected to first submount 110 and second submount 120. First optical element 181*b* is bonded to first base 19 and second base 29 by bonding portion 185, just like first optical element 181 according to Variation 1 of Embodiment 2.

This makes it possible to collimate the emission light from semiconductor light-emitting chip 30 in the fast axis direction. First optical element 181*b* is bonded not only to first submount 110, but also to second submount 120, which is fixed to semiconductor light-emitting chip 30. The positional relationship between light-emitting point 30*e* of semiconductor light-emitting chip 30 and first optical element 181*b* can therefore be inhibited from changing over time.

Variation 5 of Embodiment 2

Next, the light source device according to Variation 5 of Embodiment 2 will be described. The light source device according to the present variation includes semiconductor light-emitting device 101*b* according to Variation 2 of Embodiment 2. The following description will focus on the configuration of the light source device according to the present variation, excluding semiconductor light-emitting device 101*b*.

Overall Configuration

Figure 21:
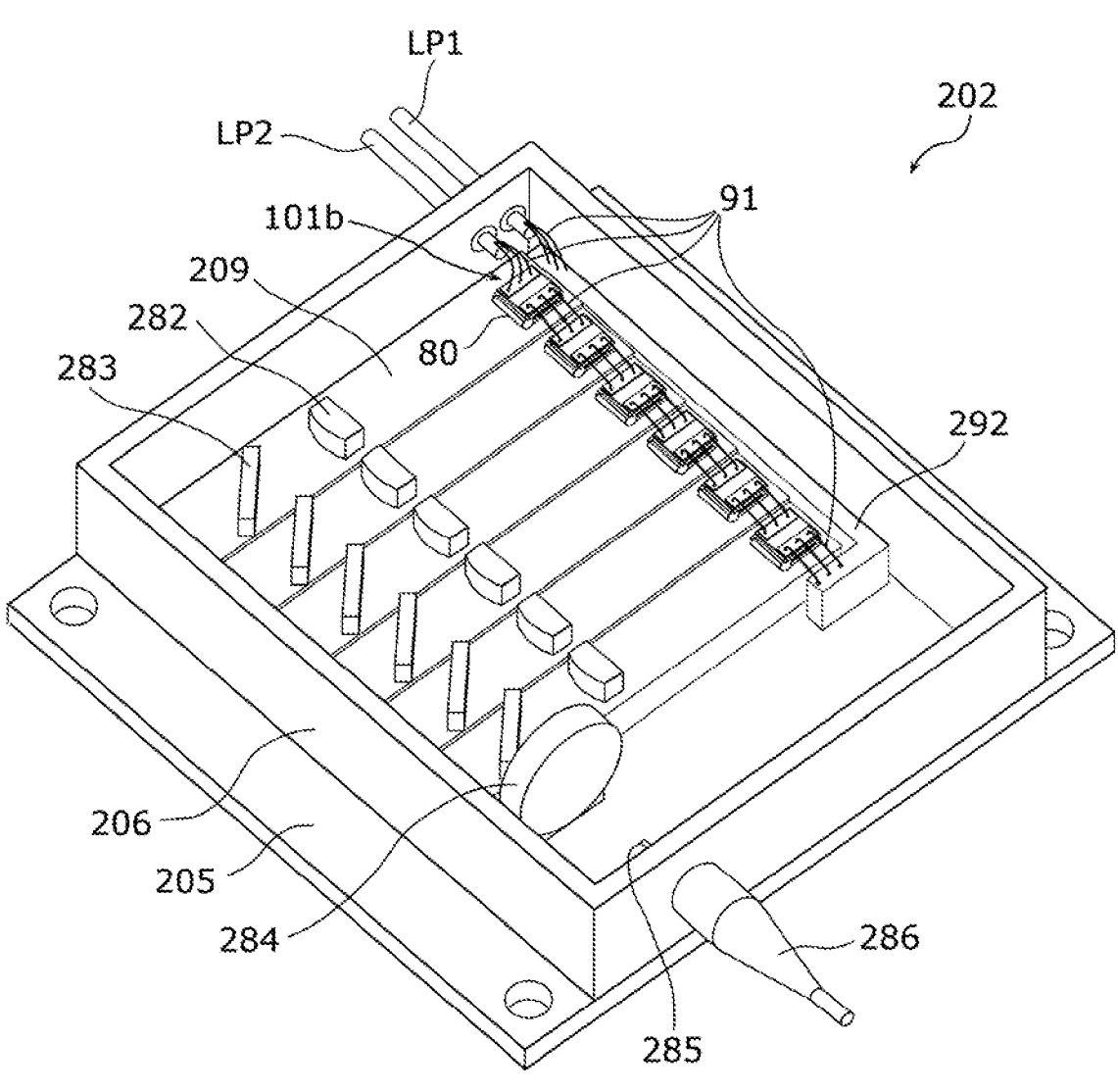
FIG. 21 is a perspective view schematically illustrating the overall configuration of a light source device according to Variation 5 of Embodiment 2.

First, the overall configuration of the light source device according to the present variation will be described with reference to FIG. 21. FIG. 21 is a perspective view schematically illustrating the overall configuration of light source device 202 according to the present variation. Light source device 202 includes a plurality of semiconductor light-emitting devices 101*b*. As illustrated in FIG. 21, light source device 202 according to the present variation further includes base plate 205, frame 206, mounting base 209, first lead pin LP1, second lead pin LP2, wiring component 292, a plurality of lens optical elements 80, a plurality of slow axis collimator lenses 282, a plurality of reflecting mirrors 283, focusing lens 284, optical fiber 285, and optical fiber holding component 286. Light source device 202 may also include a lid that covers frame 206.

Base plate 205 is a plate-shaped component that serves as the base for light source device 202. Base plate 205, frame 206, and mounting base 209 form the housing of light source device 202. Base plate 205 may have a through-hole or the like for fixing light source device 202. Base plate 205 and mounting base 209 also function as heat-dissipating components that dissipate heat generated by the semiconductor light-emitting devices, and are formed of a metal material with high thermal conductivity, such as Cu, Cu—W alloy, Al, Ni, or Au or the like.

Frame 206 is a rectangular tubular component disposed on base plate 205. One opening of frame 206 is covered by base plate 205 to form the housing of light source device 202. Frame 206 includes holes through which first lead pin LP1, second lead pin LP2, and optical fiber 285 pass. Frame 206 is formed of a metal material such as Kovar, Fe—Ni alloy, Fe, Cu, Al, Ni, or Au or the like.

First lead pin LP1 and second lead pin LP2 are columnar terminals for supplying power to light source device 202. First lead pin LP1 and second lead pin LP2 are connected to an external power source which is not illustrated. First lead pin LP1 and second lead pin LP2 are fixed in place while passing through frame 206. The space between (i) first lead pin LP1 and second lead pin LP2 and (ii) frame 206 is filled with an insulating material such as glass. First lead pin LP1 and second lead pin LP2 are formed of a metal material such as Kovar, Fe—Ni alloy, Cu, Ni, Au, or Al or the like. As illustrated in FIG. 21, first lead pin LP1 is electrically connected to wiring component 292. In the present variation, first lead pin LP1 is electrically connected to wiring component 292 by three metal wires 91. Second lead pin LP2 is electrically connected to semiconductor light-emitting device 101*b*. In the present variation, second lead pin LP2 is electrically connected to semiconductor light-emitting device 101*b* by three metal wires 91.

Wiring component 292 is a conductive component for supplying power to the plurality of semiconductor light-emitting devices 101*b*. Wiring component 292 is disposed inside frame 206 on base plate 205. The shape of wiring component 292 is not particularly limited, but in the present variation, it is exemplified as being L-shaped. Wiring component 292 includes, for example, an L-shaped ceramic plate and a metal layer formed on the upper surface of the ceramic plate. One end portion of wiring component 292 is disposed near first lead pin LP1 and is electrically connected to first lead pin LP1 with metal wires 91. The other end portion of wiring component 292 is disposed near semiconductor light-emitting device 101*b* positioned farthest from first lead pin LP1 among the plurality of semiconductor light-emitting devices 101*b*, and is electrically connected to that semiconductor light-emitting device 101*b* with metal wires 91. This makes it easy to electrically connect first lead pin LP1 and semiconductor light-emitting device 101*b* located away from first lead pin LP1.

Mounting base 209 is a stepped platform disposed inside frame 206 on base plate 205, and includes mounting surfaces at different heights from base plate 205. In the present variation, mounting base 209 includes six mounting surfaces at different heights from base plate 205. Semiconductor light-emitting device 101*b*, slow axis collimator lens 282, and reflecting mirror 283 are disposed on each mounting surface.

Figure 22:
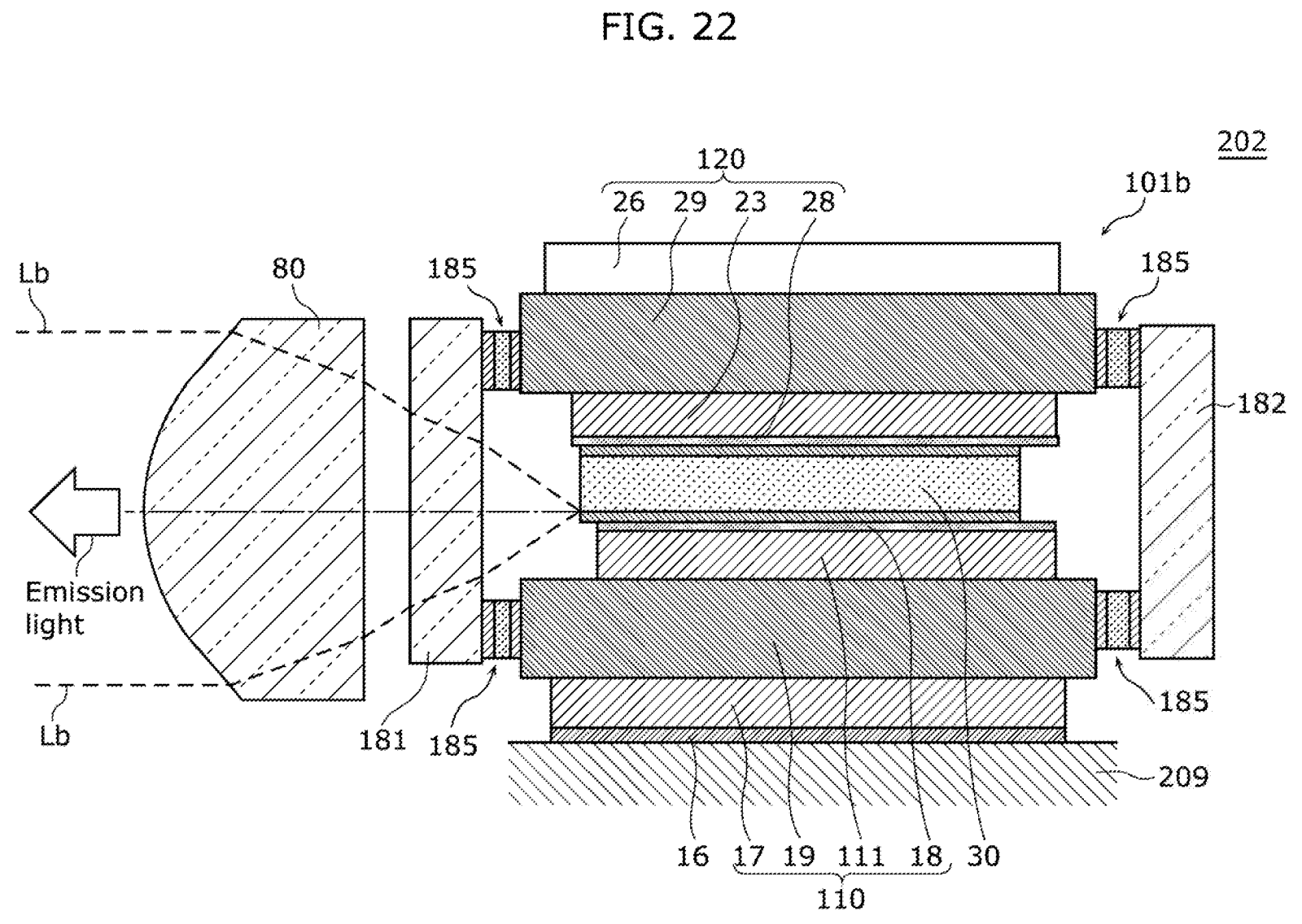

Semiconductor light-emitting device 101*b* is a device that generates light in light source device 202. The configurations of semiconductor light-emitting device 101*b* and surrounding components will be described with reference to FIG. 22. FIG. 22 is a cross-sectional view schematically illustrating the configuration in the vicinity of semiconductor light-emitting device 101*b* in light source device 202 according to the present variation. FIG. 22 illustrates a cross section taken perpendicular to first surface 30*a* of semiconductor light-emitting chip 30 of semiconductor light-emitting device 101*b*, through semiconductor light-emitting chip 30. As illustrated in FIG. 22, near first optical element 181 of semiconductor light-emitting device 101*b* in light source device 202, lens optical element 80, which is a fast axis collimator lens, is fixed at a predetermined distance from first optical element 181. Lens optical element 80 is bonded to first front surface 19F and second front surface 29F of semiconductor light-emitting device 101*b*. Semiconductor light-emitting device 101*b* is fixed to mounting base 209 by second bonding material 16, one example of which is SnAgCu solder.

As illustrated in FIG. 21, light source device 202 includes six semiconductor light-emitting devices 101*b* in the present variation. The six semiconductor light-emitting devices 101*b* are disposed on respective mounting surfaces of mounting base 209. One semiconductor light-emitting device 101*b* is disposed on each mounting surface. This allows for the optical axes of the emission light from the six semiconductor light-emitting devices 101*b* to be at mutually different heights from base plate 205. In the present variation, the heights of the mounting surfaces on which semiconductor light-emitting devices 101*b* are disposed successively increase with decreasing distance to second lead pin LP2.

The six semiconductor light-emitting devices 101*b* are arranged in a single row. Wiring component 292 is arranged along the direction in which the six semiconductor light-emitting devices 101*b* are arranged. Among the six semiconductor light-emitting devices 101*b*, sixth metal material 26 of semiconductor light-emitting device 101*b* located closest to second lead pin LP2 is electrically connected to second lead pin LP2. In the present variation, sixth metal material 26 and second lead pin LP2 are connected by three metal wires 91. Among two adjacent semiconductor light-emitting devices 101*b*, fifth metal material 25 of semiconductor light-emitting device 101*b* closer to second lead pin LP2 is electrically connected to sixth metal material 26 of semiconductor light-emitting device 101*b* farther from second lead pin LP2. In the present variation, fifth metal material 25 is connected to sixth metal material 26 of the adjacent semiconductor light-emitting device by three metal wires 91. Fifth metal material 25 of semiconductor light-emitting device 101*b* located farthest from second lead pin LP2 is electrically connected to wiring component 292. In the present variation, fifth metal material 25 and wiring component 292 are connected by three metal wires 91. With this configuration, power can be supplied from first lead pin LP1 and second lead pin LP2 to the six semiconductor light-emitting devices 101*b* electrically connected in series. Accordingly, the same current can be supplied to the six semiconductor light-emitting devices 101*b*, whereby the difference in intensity of the emission light from each semiconductor light-emitting device 101*b* can be inhibited.

In light source device 202 according to the present variation, in semiconductor light-emitting device 101*b*, since fifth metal material 25 and sixth metal material 26 provided for supplying electric power are disposed on the top surface of semiconductor light-emitting device 101*b*, it is possible to reduce interference of capillaries and the like with each element of light source device 202 when connecting metal wires 91 to fifth metal material 25 and sixth metal material 26 via wire bonding. This advantageous effect is also achieved when any of semiconductor light-emitting devices 101, 101*a*, 101*c*, or 101*d* is used in the light source device.

Lens optical element 80 is a lens that collimates the emission light in the fast axis direction (i.e., the first direction). In the present variation, light source device 202 includes six lens optical elements 80. The six lens optical elements 80 are fixed to the respective six semiconductor light-emitting devices 101*b*. More specifically, each lens optical element 80 is connected to first submount 110 and second submount 120 of semiconductor light-emitting device 101*b*.

Slow axis collimator lens 282 is a lens that collimates the emission light in the slow axis direction (i.e., the second direction). In the present variation, light source device 202 includes six slow axis collimator lenses 282. The six slow axis collimator lenses 282 are disposed on respective mounting surfaces of mounting base 209. Each slow axis collimator lens 282 is disposed on the optical axis of the emission light from the corresponding semiconductor light-emitting device 101*b*.

Reflecting mirror 283 is an optical element that reflects the emission light from semiconductor light-emitting device 101*b*. In the present variation, light source device 202 includes six reflecting mirrors 283. The six reflecting mirrors 283 are disposed on respective mounting surfaces of mounting base 209. Each reflecting mirror 283 is disposed on the optical axis of the emission light from the corresponding semiconductor light-emitting device 101*b*, in a position further away from semiconductor light-emitting device 101*b* relative to slow axis collimator lens 282. Emission light collimated by slow axis collimator lens 282 is incident on reflecting mirror 283, and reflecting mirror 283 reflects the incident emission light toward focusing lens 284. In the present variation, the reflective surface of each of reflecting mirror 283 is inclined 45 degrees relative to the optical axis of the emission light so that the emission light from semiconductor light-emitting device 101*b* is incident at an angle of incidence of 45 degrees.

Focusing lens 284 is a lens that focuses the emission light reflected by the plurality of reflecting mirrors 283. Focusing lens 284 focuses the emission light onto the incident surface of optical fiber 285. This allows the emission light from the plurality of semiconductor light-emitting devices 101*b* to be combined and coupled into single optical fiber 285.

Optical fiber 285 is a light guiding component that guides the emission light from the plurality of semiconductor light-emitting devices 101*b* out of frame 206. The incident surface of optical fiber 285 is disposed inside frame 206. The incident surface of optical fiber 285 is positioned at a distance approximately equal to the focal length of focusing lens 284 from focusing lens 284 in the traveling direction of the emission light. Optical fiber 285 is fixed in place while passing through frame 206. The emission light from the plurality of semiconductor light-emitting devices 101*b* is output from the emission surface of optical fiber 285, which is the end surface located outside frame 206.

Optical fiber holding component 286 is a component that fixes optical fiber 285 to the frame. Optical fiber holding component 286 includes a through-hole through which optical fiber 285 passes, and holds optical fiber 285 in the through-hole. Fixing optical fiber holding component 286 to frame 206 thereby fixes optical fiber 285 to frame 206.

Manufacturing Method

Figure 23A:
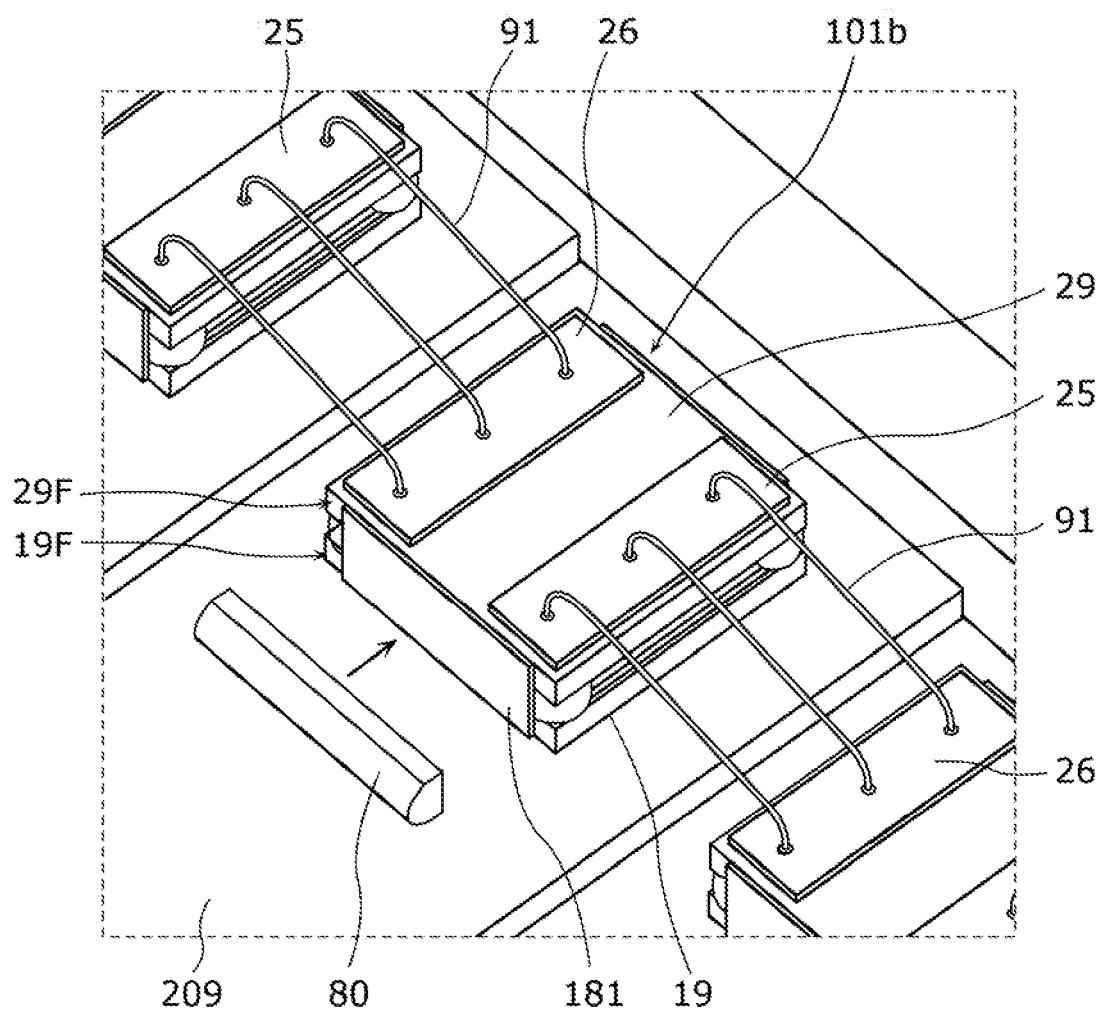
FIG. 23A is a perspective view illustrating a first process of the manufacturing method of the light source device according to Variation 5 of Embodiment 2.
Figure 23B:
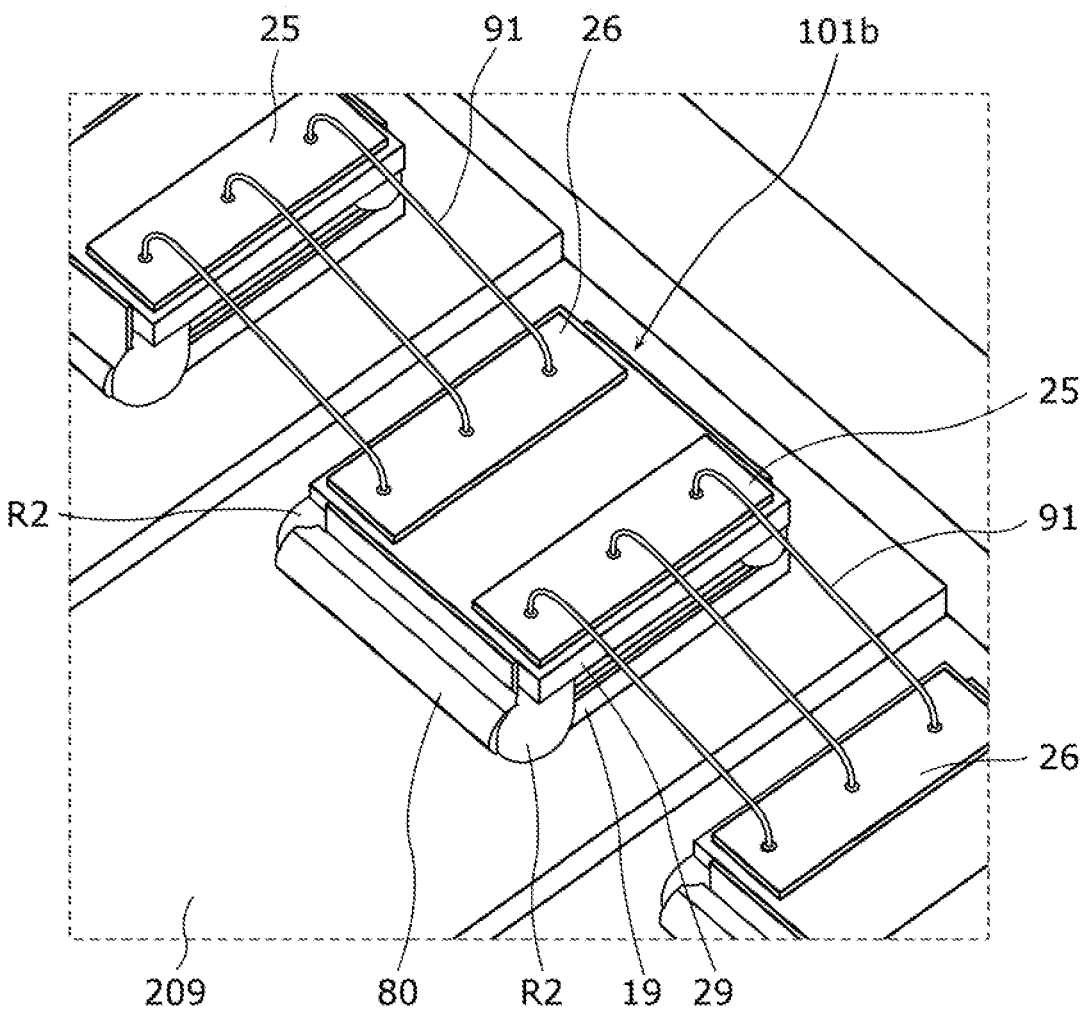
FIG. 23B is a perspective view illustrating a second process of the manufacturing method of the light source device according to Variation 5 of Embodiment 2.

Next, one example of the manufacturing method of light source device 202 according to the present variation will be described with reference to FIG. 23A and FIG. 23B. FIG. 23A and FIG. 23B are perspective views schematically illustrating processes in the manufacturing method of light source device 202. FIG. 23A and FIG. 23B illustrate, in the manufacturing method of light source device 202, in particular the manufacturing process of fixing lens optical element 80 to semiconductor light-emitting device 101b.

First, frame 206 and mounting base 209 are disposed and fixed on base plate 205. Note that first lead pin LP1 and second lead pin LP2 are fixed to frame 206 in advance.

Next, optical fiber 285 and optical fiber holding component 286 are fixed to frame 206. After adjusting the position of focusing lens 284, focusing lens 284 is fixed to base plate 205. Next, the six reflecting mirrors 283 are positioned on and fixed to the mounting surfaces of mounting base 209.

Next, semiconductor light-emitting devices 101b according to Variation 2 of Embodiment 2 are prepared and fixed to the mounting surfaces of mounting base 209. Semiconductor light-emitting devices 101b can be fixed to the mounting surfaces using, for example, solder material. The six semiconductor light-emitting devices 101b are then electrically connected in series as described above using metal wires 91 comprising Au or Al. The six semiconductor light-emitting devices 101b connected in series are then electrically connected to second lead pin LP2 and wiring component 292. Wiring component 292 and first lead pin LP1 are further electrically connected so that power can be supplied to the six semiconductor light-emitting devices 101b.

Next, as illustrated in FIG. 23A, lens optical element 80, which is a fast axis collimator lens, and slow axis collimator lens 282 are disposed on the mounting surface of mounting base 209, in front of semiconductor light-emitting device 101b, and a predetermined current is applied to each semiconductor light-emitting device 101b to cause emission light to be emitted from each semiconductor light-emitting device 101b (i.e., from each semiconductor light-emitting chip 30).

The emission light passes through lens optical element 80 (the fast axis collimator lens) and slow axis collimator lens 282, and is then incident on optical fiber 285. Here, the positions of lens optical element 80 and slow axis collimator lens 282 are adjusted to maximize the amount of emission light from optical fiber 285.

Next, as illustrated in FIG. 23B, bonding material R2, such as an ultraviolet curable resin, is disposed on both ends of lens optical element 80, and lens optical element 80 is fixed to semiconductor light-emitting device 101b by irradiating it with ultraviolet light. This makes it possible to fix the position of lens optical element 80 with respect to the light-emitting point of the emission light of semiconductor light-emitting device 101b with high precision. Next, slow axis collimator lenses 282 are fixed to the mounting surfaces in the same manner.

In the above, since bonding material R2 is made of the same resin as the sealing material of semiconductor light-emitting device 101b, lens optical element 80 and the like can be firmly fixed.

Light source device 202 according to the present variation can be manufactured as described above. Note that light source device 202 may further include a lid that covers frame 206.

In light source device 202 according to the present variation, in mounted semiconductor light-emitting device 101b, the semiconductor light-emitting chip is hermetically sealed in advance by the first submount and the second submount and the like. Therefore, even if foreign matter such as siloxane is generated from the optical components included in light source device 202 or from the bonding material fixing slow axis collimator lens 282, it is still possible to inhibit degradation of emission light characteristics from the foreign matter adhering to light-emitting point 30e of the semiconductor light-emitting chip.

Embodiment 3

Next, the semiconductor light-emitting device according to Embodiment 3 will be described. The semiconductor light-emitting device according to the present embodiment differs from semiconductor light-emitting device 101 according to Embodiment 2 mainly in regard to the configuration of the first submount. The following description will focus on the differences between the semiconductor light-emitting device according the present embodiment and semiconductor light-emitting device 1 according to Embodiment 1, with reference to FIG. 24 and FIG. 25.

Figures 24, 25:
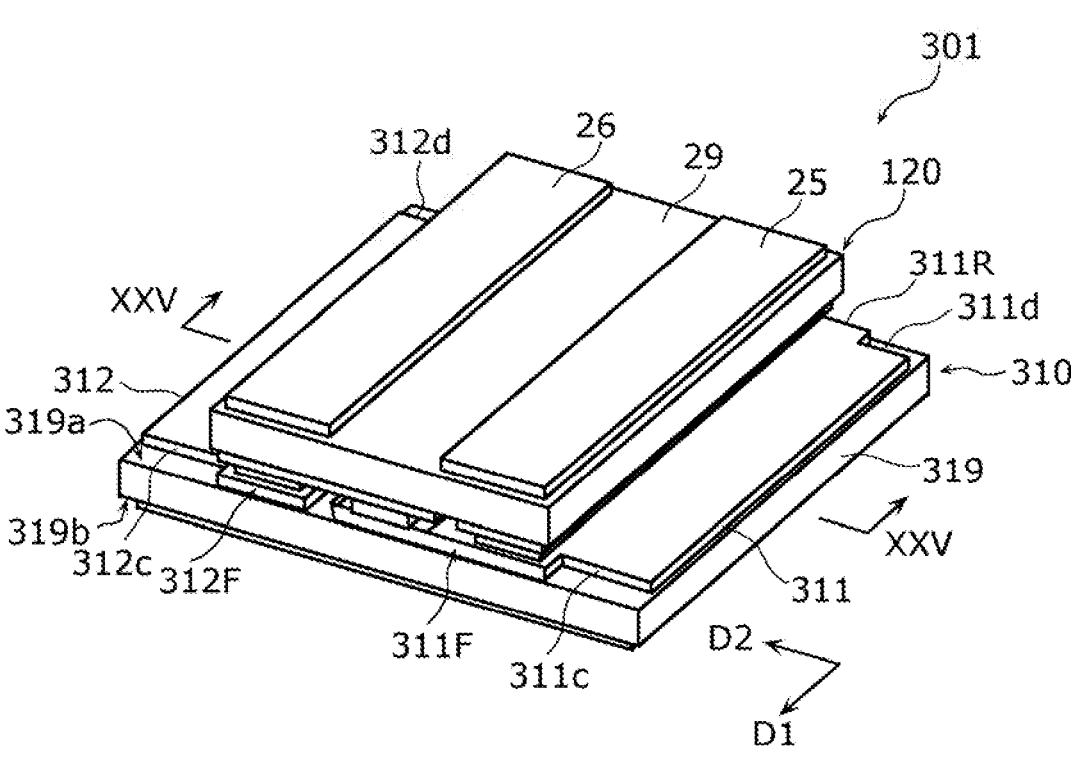
FIG. 24 is a perspective view illustrating the overall configuration of a semiconductor light-emitting device according to Embodiment 3.
FIG. 25 is a cross-sectional view illustrating the overall configuration of the semiconductor light-emitting device according to Embodiment 3.

FIG. 24 and FIG. 25 are respectively perspective and cross-sectional views of the overall configuration of semiconductor light-emitting device 301 according to the present embodiment. FIG. 25 is a cross-sectional view taken at line XXV-XXV in FIG. 24.

As illustrated in FIG. 25, semiconductor light-emitting device 301 according to the present embodiment includes semiconductor light-emitting chip 30, first submount 310, second submount 120, first sidewall 40, and second sidewall 50.

First submount 310 according to the present embodiment includes first base 319, spacer 311, second metal material 312, backside metal material 317, bonding material 18, bonding material 48, and bonding material 58. In the present embodiment, the dimension of first submount 310 in second direction D2 is larger than that of second submount 120.

First base 319 is one example of the first insulating member comprising an insulating material. First base 19 includes third surface 319a, and spacer 311 and second metal material 312 are disposed on third surface 319a. First base 319 includes backside surface 319b on the opposite side relative to third surface 319a, and backside metal material 317 is disposed on backside surface 319b. As illustrated in FIG. 24, first base 319 is exposed from second submount 120 in a top view of third surface 319a. More specifically, the dimension of first base 319 in second direction D2 is larger than that of second base 29, and protrudes from second submount 120 in second direction D2 in a top view of third surface 319a.

Spacer 311 has same configuration as spacer 111 according to Embodiment 2, except for the dimensions in second direction D2. Spacer 311 is exposed from second submount 120 in a top view of third surface 319a. More specifically, spacer 311 protrudes from second submount 120 in second direction D2 in a top view of third surface 319a.

As illustrated in FIG. 24, in a top view of third surface 319a of first base 319, spacer 311 includes first recess 311c, which is recessed inwardly of spacer 311, at the end edge located near emission surface 30F (i.e., the front end edge).

In the present embodiment, first recess 311c is located at the end portion in second direction D2 of spacer 311 that is farther from second metal material 312. In a top view of third surface 319a, first recess 311c is a portion recessed from end surface 311F of spacer 311 located near emission surface 30F (i.e., from the front end edge), toward rear surface 30R (i.e., rearward). In a top view of third surface 319a of first base 319, spacer 311 includes third recess 311d, which is recessed inwardly of spacer 311, at the end edge located near rear surface 30R (i.e., the rear end edge). In a top view of third surface 19a, third recess 311d is a portion recessed from end surface 311R of spacer 311 located near rear surface 30R (i.e., from the rear end edge), toward emission surface 30F (i.e., forward). In the present embodiment, third recess 311d is located at the end portion in second direction D2 of spacer 311 that is farther from second metal material 312.

Second metal material 312 has the same configuration as second metal material 112 according to Embodiment 2, except for the dimensions in second direction D2. As illustrated in FIG. 24, second metal material 312 is exposed from second submount 120 in a top view of third surface 319a. More specifically, second metal material 312 protrudes from second submount 120 in second direction D2 in a top view of third surface 319a.

As illustrated in FIG. 24, in a top view of third surface 319a of first base 319, second metal material 312 includes second recess 312c, which is recessed inwardly of second metal material 312, at the end edge located near emission surface 30F (i.e., the front end edge). In a top view of third surface 319a, second recess 312c is a portion recessed from end surface 312F of second metal material 312 located near emission surface 30F (i.e., from the front end edge), toward rear surface 30R (i.e., rearward). In the present embodiment, second recess 312c is located at the end portion in second direction D2 of second metal material 312 that is farther from spacer 311. In a top view of third surface 319a of first base 319, second metal material 312 includes fourth recess 312d, which is recessed inwardly of second metal material 312, at the end edge located near rear surface 30R (i.e., the rear end edge). In a top view of third surface 319a, fourth recess 312d is a portion recessed from end surface 312R of second metal material 312 located near rear surface 30R (i.e., from the rear end edge), toward emission surface 30F (i.e., forward). In the present embodiment, fourth recess 312d is located at the end portion in second direction D2 of second metal material 312 that is farther from spacer 311.

Backside metal material 317 has the same configuration as backside metal material 17 according to Embodiment 2, except for the dimensions in second direction D2.

As described above, in semiconductor light-emitting device 301 according to the present embodiment, first recess 311c, second recess 312c, third recess 311d, and fourth recess 312d are exposed from second submount 120 in a top view of third surface 319a. The bonding material and the like can therefore be easily disposed in each recess from above.

Variation 1 of Embodiment 3

Next, the light source device according to Variation 1 of Embodiment 3 will be described. The light source device according to the present variation differs from light source device 202 according to Variation 5 of Embodiment 2 in the manner in which the semiconductor light-emitting device is fixed. The following description will focus on the differences between the light source device according the present variation and light source device 202 according to Variation 5 of Embodiment 2.

Overall Configuration

Figure 26:
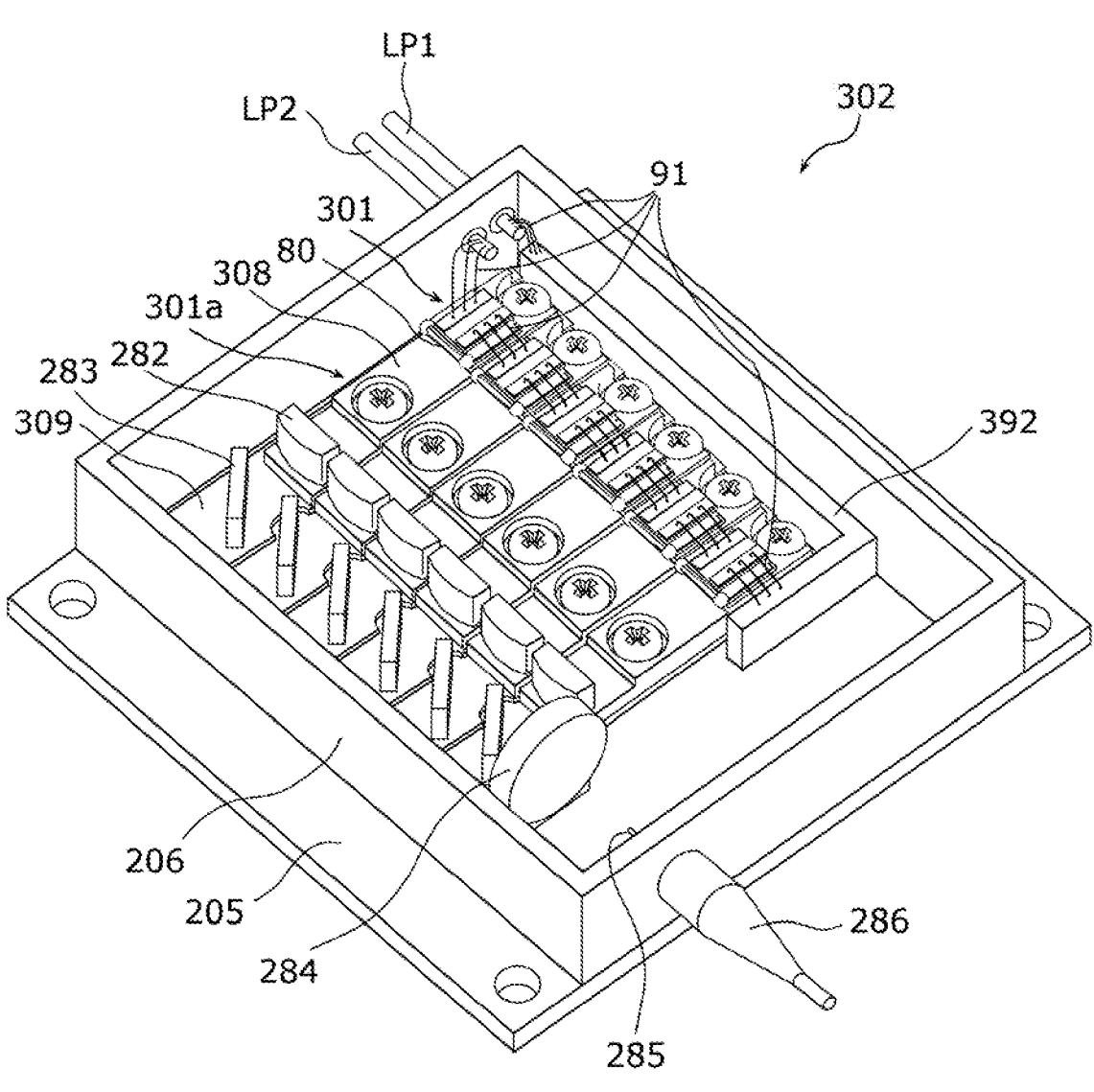
FIG. 26 is a perspective view schematically illustrating the overall configuration of a light source device according to Variation 1 of Embodiment 3.

First, the overall configuration of light source device 302 according to the present variation will be described with reference to FIG. 26. FIG. 26 is a perspective view schematically illustrating the overall configuration of light source device 302 according to the present variation. As illustrated in FIG. 26, light source device 302 according to the present variation includes base plate 205, frame 206, mounting base 309, first lead pin LP1, second lead pin LP2, a plurality of semiconductor light-emitting devices 301a, wiring component 392, a plurality of lens optical elements 80, a plurality of slow axis collimator lenses 282, a plurality of reflecting mirrors 283, focusing lens 284, optical fiber 285, and optical fiber holding component 286. Semiconductor light-emitting device 301a according to the present variation includes semiconductor light-emitting device 301 according to Embodiment 3 and auxiliary plate 308.

Wiring component 392 is a conductive component for supplying power to the plurality of semiconductor light-emitting devices 301a. Wiring component 392 has the same configuration as wiring component 292 according to Variation 5 of Embodiment 2.

Mounting base 309 is a stepped platform disposed inside frame 206 on base plate 205, and includes mounting surfaces at different heights from base plate 205. In the present variation, mounting base 309 includes six mounting surfaces at different heights from base plate 205. Semiconductor light-emitting device 301a, lens optical element 80, slow axis collimator lens 282, and reflecting mirror 283 are disposed on each mounting surface. Each mounting surface includes a screw hole (not illustrated in FIG. 26) for fixing auxiliary plate 308 of semiconductor light-emitting device 301a. The shape of the mounting surface should be determined according to the shape of the elements and the like disposed on the mounting surface. For example, as illustrated in FIG. 26, a notch may be formed in reflecting mirror 283 and the mounting surface one level above the mounting surface on which reflecting mirror 283 is disposed to avoid interference with reflecting mirror 283. Mounting base 309 also functions as a heat-dissipating component, and is formed of a metal material such as Cu or Au, for example.

Figure 27:
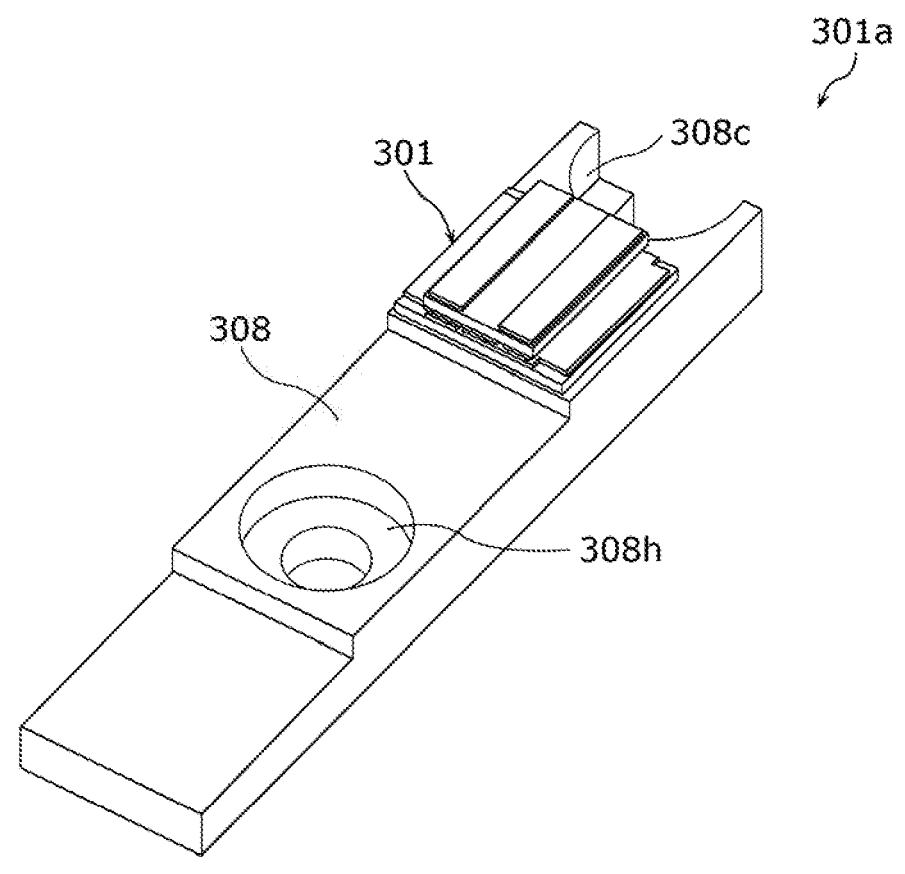
FIG. 27 is a perspective view schematically illustrating the configuration of a semiconductor light-emitting device according to Variation 1 of Embodiment 3.
Figure 28:
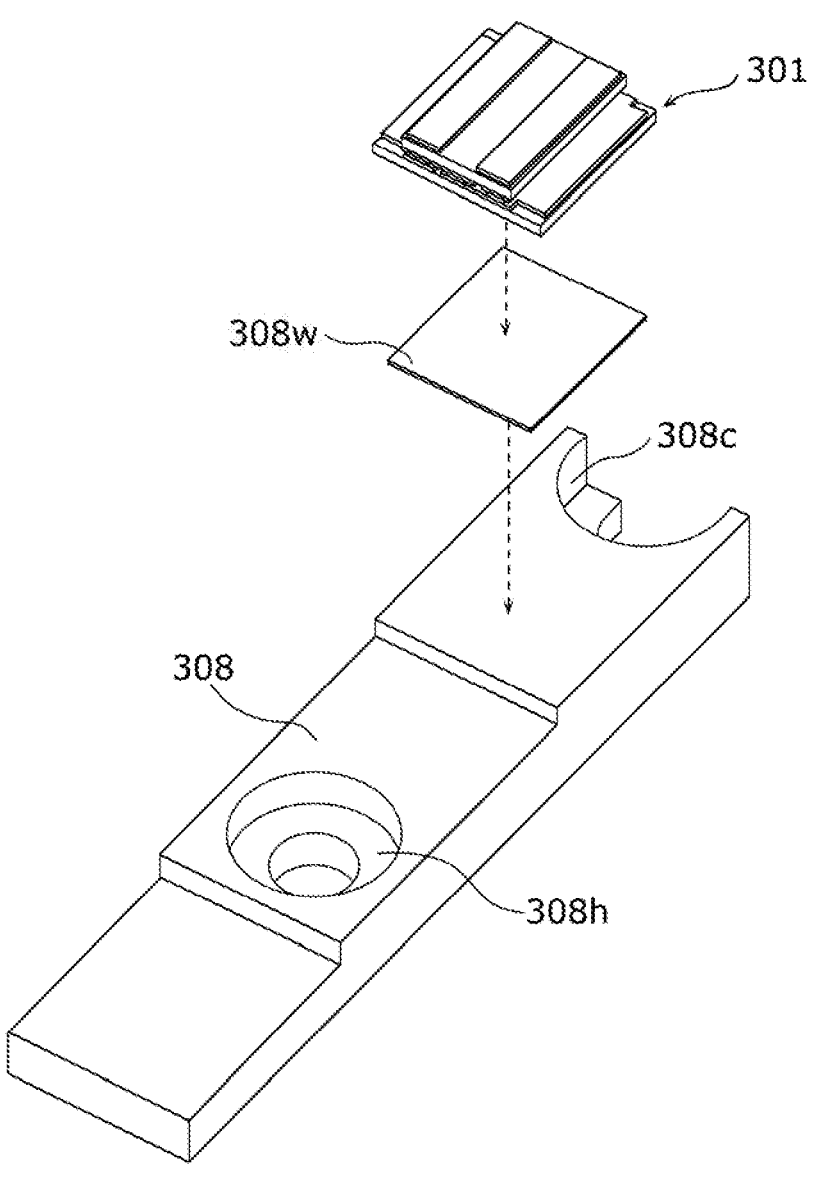
FIG. 28 is an exploded perspective view schematically illustrating the manufacturing method of a semiconductor light-emitting device according to Variation 1 of Embodiment 3.

As described above, semiconductor light-emitting device 301a includes semiconductor light-emitting device 301 according to Embodiment 3 and auxiliary plate 308. Auxiliary plate 308 is a plate to which semiconductor light-emitting device 301 is bonded. Next, semiconductor light-emitting device 301a will be described with reference to FIG. 27 and FIG. 28. FIG. 27 is a perspective view of the configuration of semiconductor light-emitting device 301a according to the present variation. FIG. 28 is an exploded perspective view illustrating the manufacturing method of semiconductor light-emitting device 301a according to the present variation.

As illustrated in FIG. 27 and FIG. 28, auxiliary plate 308 is a plate-shaped component, and includes opening 308h for accommodating a screw, and notch 308c. In the present variation, auxiliary plate 308 has a stepped structure and includes two mounting surfaces. Auxiliary plate 308 is achieved by plating, with Ni or Au or the like, a body formed of, for example, oxygen-free copper (for example, JIS standard C1020, which is pure copper with a purity of 99.96% or higher). Semiconductor light-emitting device 301 is disposed on the highest of the mounting surfaces of auxiliary plate 308.

As illustrated in FIG. 28, solder sheet 308w and semiconductor light-emitting device 301 are disposed on auxiliary plate 308 in this order and pressurized. Next, auxiliary plate 308 is heated to melt solder sheet 308w and then cooled. Solidifying solder sheet 308w bonds first submount 310 of semiconductor light-emitting device 301 to auxiliary plate 308, whereby semiconductor light-emitting device 301a can be easily manufactured. Solder sheet 308w is formed of a solder material such as SnSb or SnAgCu, for example.

As a result of semiconductor light-emitting device 301a having the above configuration, semiconductor light-emitting device 301a including semiconductor light-emitting device 301 can be easily fixed to mounting base 309 with a screw. Semiconductor light-emitting device 301 can therefore be fixed to mounting base 309 without heating base plate 205 and mounting base 309. This configuration also allows semiconductor light-emitting device 301 to be fixed without heating base plate 205 and the like, thus inhibiting degradation of components on base plate 205 due to a rise in temperature.

Figure 29:
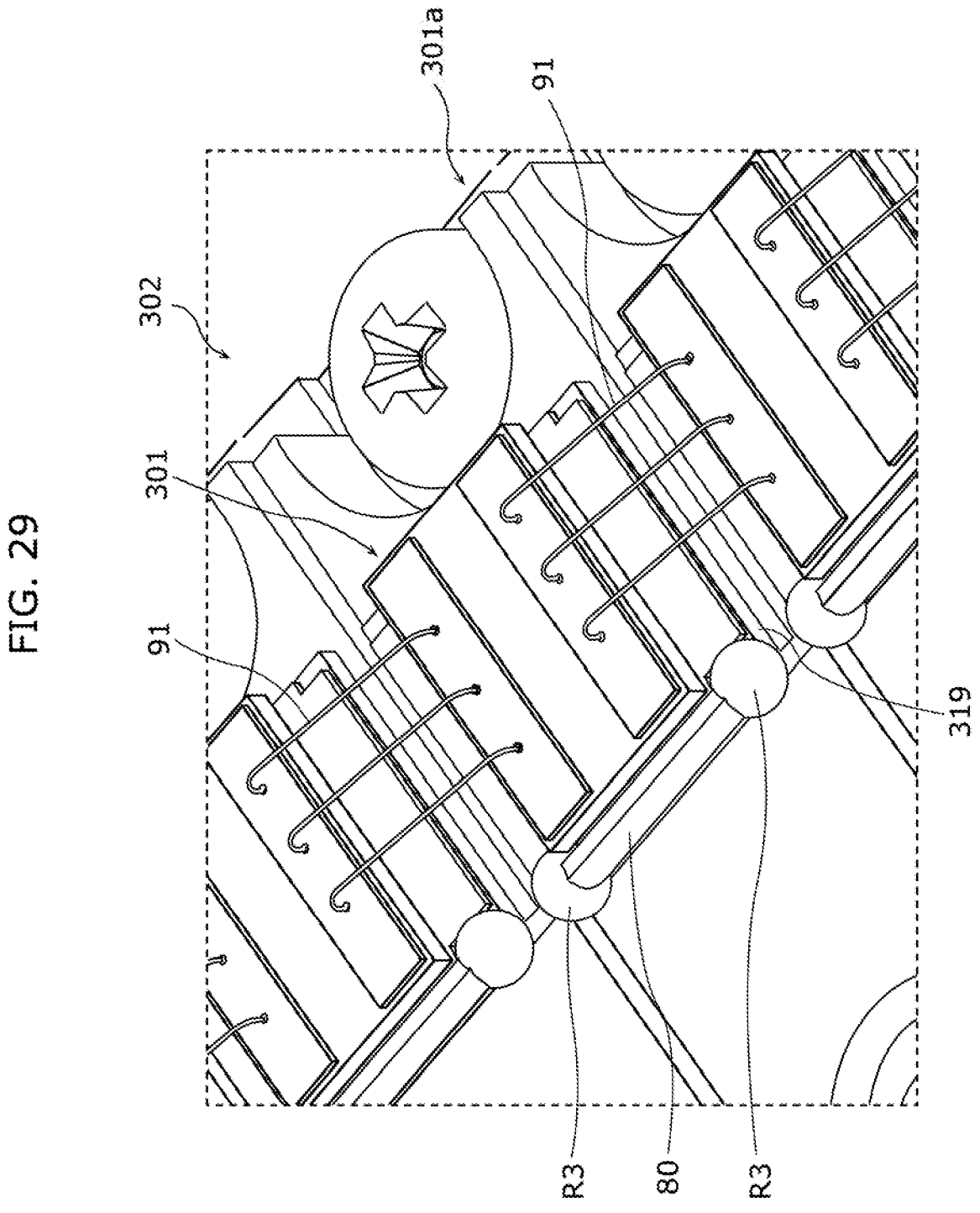
FIG. 29 is a perspective view schematically illustrating the configuration in the vicinity of the semiconductor light-emitting device in the light source device according to Variation 1 of Embodiment 3.

Next, the configuration around semiconductor light-emitting device 301a of light source device 302 according to the present variation will be described with reference to, for example, FIG. 29. FIG. 29 is a perspective view schematically illustrating the configuration around semiconductor light-emitting device 301a of light source device 302 according to the present variation. As illustrated in FIG. 29, lens optical element 80 is bonded to first base 319 of semiconductor light-emitting device 301 included in semiconductor light-emitting device 301a by bonding material R3. Bonding material R3 is disposed in positions corresponding to first recess 311c and second recess 312c of semiconductor light-emitting device 301 (see FIG. 24).

In the present variation, auxiliary plate 308 of semiconductor light-emitting device 301a extends forward from the portion where semiconductor light-emitting device 301 is mounted. This allows, for example, slow axis collimator lens 282 disposed forward of semiconductor light-emitting device 301 to be fixed on auxiliary plate 308. The relative positioning precision between semiconductor light-emitting device 301 and, for example, slow axis collimator lens 282 can therefore be improved. In the present variation, lens optical element 80 is bonded to semiconductor light-emitting device 301 as illustrated in FIG. 29, but lens optical element 80 may be bonded to auxiliary plate 308.

Manufacturing Method

Figure 30A:
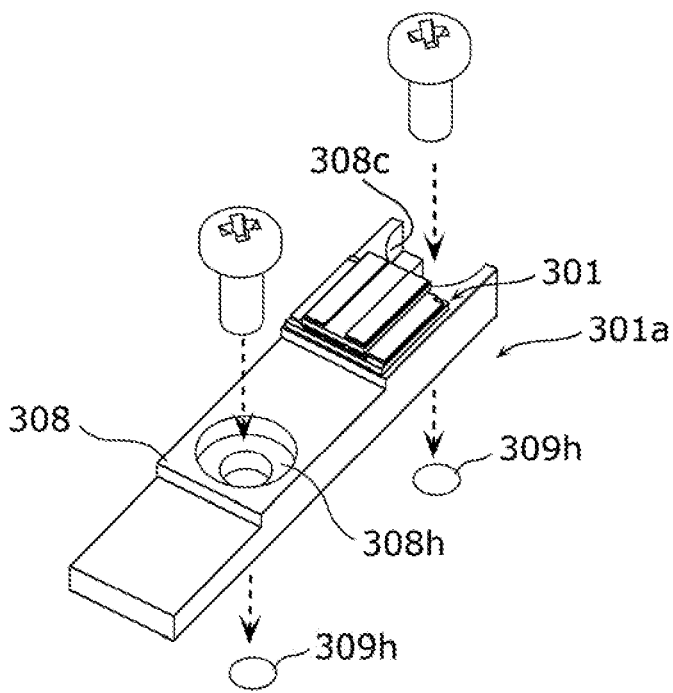
FIG. 30A is a perspective view schematically illustrating a first process of the manufacturing method of the light source device according to Variation 1 of Embodiment 3.
Figure 30B:
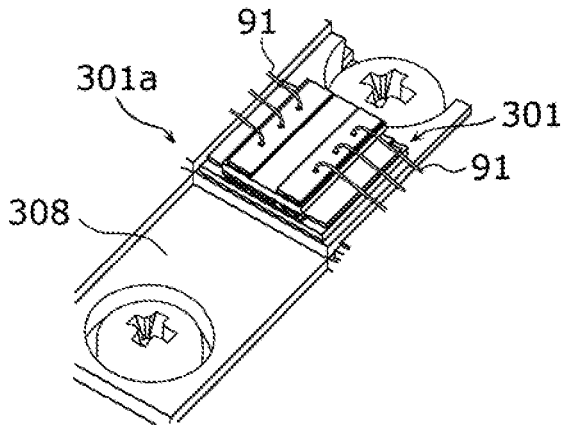
FIG. 30B is a perspective view schematically illustrating a second process of the manufacturing method of the light source device according to Variation 1 of Embodiment 3.
Figure 30C:
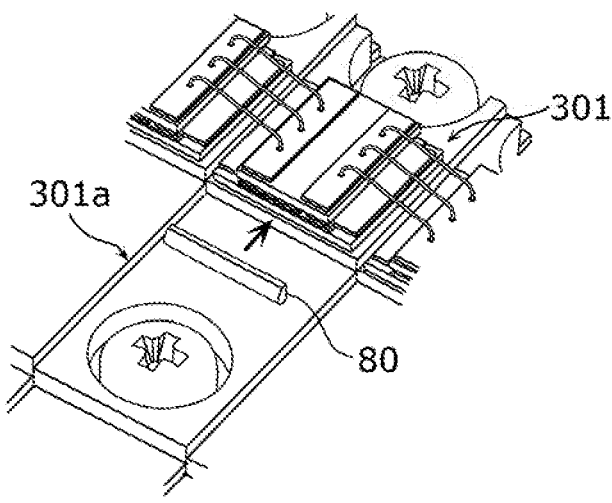
FIG. 30C is a perspective view schematically illustrating a third process of the manufacturing method of the light source device according to Variation 1 of Embodiment 3.

Next, the manufacturing method of light source device 302 according to the present variation will be described with reference to FIG. 30A through FIG. 30C. FIG. 30A through FIG. 30C are perspective views schematically illustrating processes in the manufacturing method of light source device 302 according to the present variation.

First, frame 206 and mounting base 309 are fixed to base plate 205 in the same manner as the manufacturing method of light source device 202 according to Variation 5 of Embodiment 2. Next, optical fiber 285 and optical fiber holding component 286 are fixed to frame 206. Next, focusing lens 284 is fixed to base plate 205 with an adhesive not illustrated, and the six reflecting mirrors 283 are fixed to the mounting surfaces of mounting base 309 with an adhesive not illustrated.

Next, semiconductor light-emitting device 301a, which is manufactured as described above and to which semiconductor light-emitting device 301 is bonded, is fixed to mounting base 309 using screws. In the present variation, one screw is screwed through opening 308h in auxiliary plate 308 and into screw hole 309h formed in the mounting surface of mounting base 309. The other screw is screwed through notch 308c in auxiliary plate 308 and into screw hole 309h formed in the mounting surface of mounting base 309. This allows semiconductor light-emitting device 301a, to which semiconductor light-emitting device 301 is bonded, to be fixed to the mounting surface of mounting base 309 without raising the temperature of base plate 205. This makes it possible to inhibit the degradation of, for example, adhesives on base plate 205. A heat-dissipating sheet made of, for example, In (indium) may be disposed between auxiliary plate 308 and the mounting surface of mounting base 309. Since this can increase the thermal conductivity between auxiliary plate 308 and mounting base 309, the heat generated by semiconductor light-emitting device 301 can be more efficiently released to mounting base 309.

Next, as illustrated in FIG. 30B, metal wires 91 are connected to the metal material of semiconductor light-emitting device 301.

Next, as illustrated in FIG. 30C, the positioning of lens optical element 80 and slow axis collimator lens 282 (not illustrated in FIG. 30C) are adjusted while emission light is emitted by supplying power to semiconductor light-emitting device 301, and after the adjustment is complete, lens optical element 80 is bonded to semiconductor light-emitting device 301 and slow axis collimator lens 282 is bonded to auxiliary plate 308. Here, a bonding material is disposed in first recess 311c and second recess 312c of semiconductor light-emitting device 301 (see FIG. 24). This inhibits the bonding material from adhering to positions not required for bonding lens optical element 80 and to semiconductor light-emitting chip 30, etc., because the bonding material is held in the recesses. This achieves a highly reliable semiconductor light-emitting device 301a and light source device 302. This enables the manufacture device 301a including of semiconductor light-emitting semiconductor light-emitting device 301 and lens optical element 80.

Light source device 302 according to the present variation can be easily manufactured as described above.

Variation 2 of Embodiment 3

Next, a semiconductor light-emitting device and a light source device including the semiconductor light-emitting device according to Variation 2 of Embodiment 3 will be described. The semiconductor light-emitting device according to the present variation differs from semiconductor light-emitting device 301 according to Embodiment 3 mainly in that it includes a first optical element and a second optical element and in regard to the structure of the spacer and the recesses of the second metal material. The following description will focus on how the semiconductor light-emitting device and the light source device according to the present variation differ from semiconductor light-emitting device 301 according to Embodiment 3 and light source device 302 according to Variation 1 of Embodiment 3.

Figure 31:
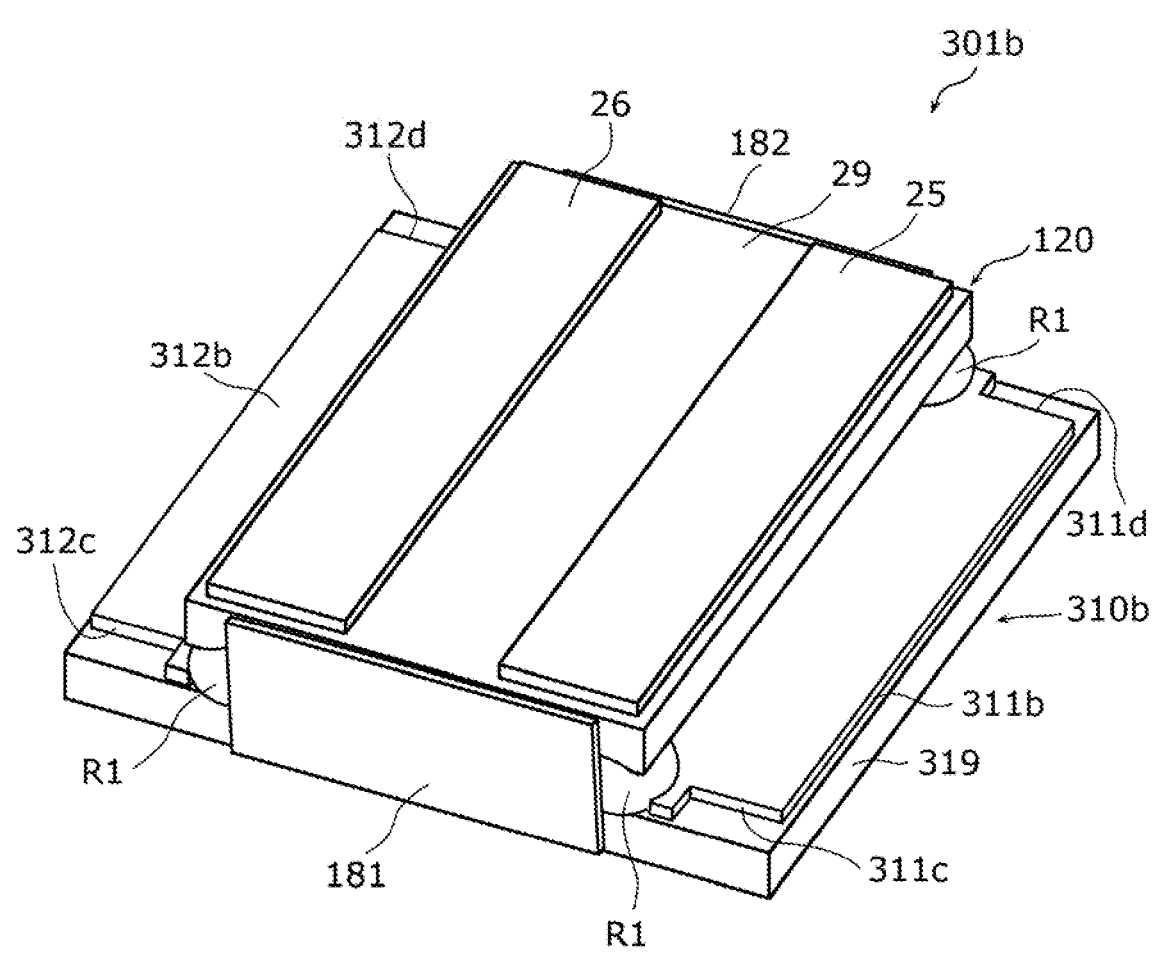
FIG. 31 is a perspective view schematically illustrating the overall configuration of a semiconductor light-emitting device according to Variation 2 of Embodiment 3.
Figure 32:
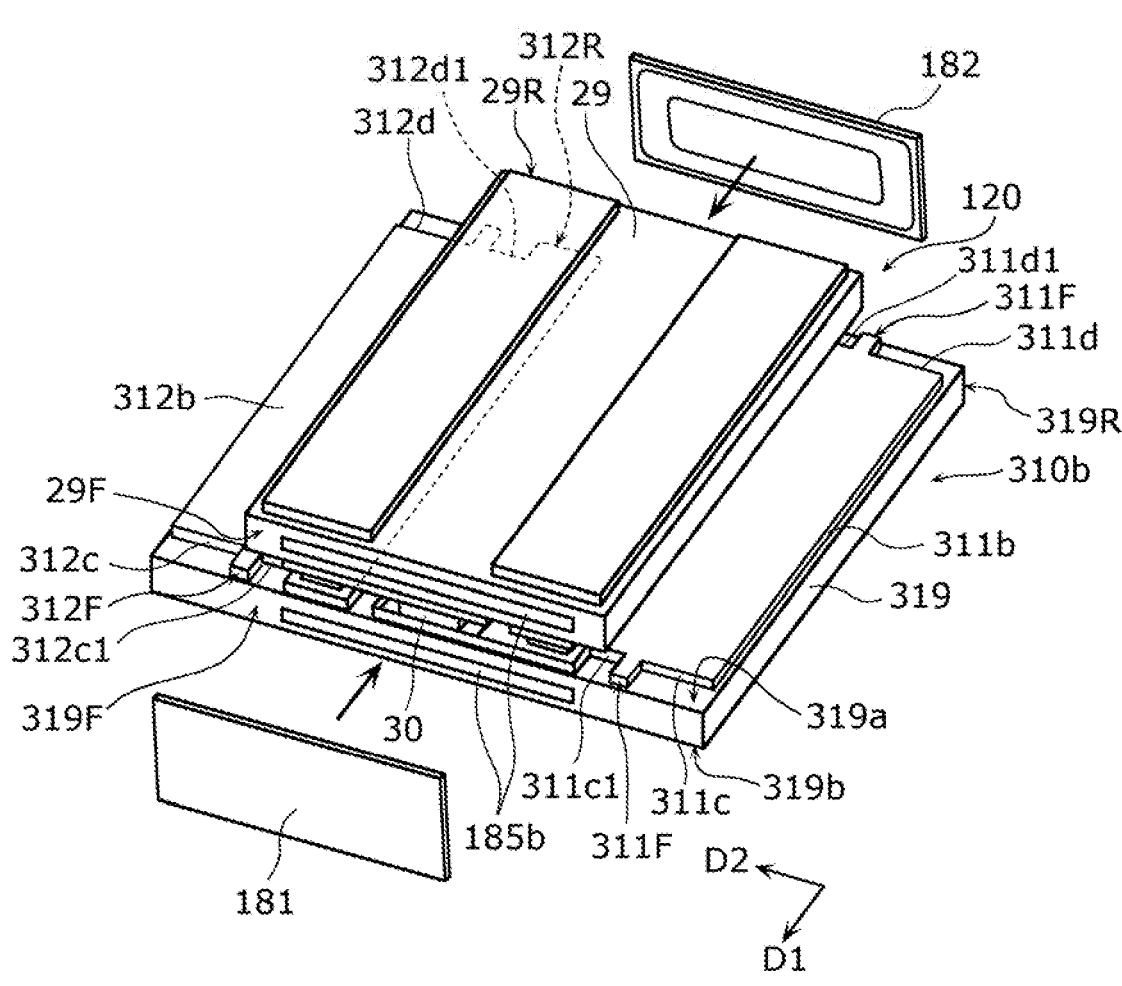
FIG. 32 is an exploded perspective view schematically illustrating the overall configuration of the semiconductor light-emitting device according to Variation 2 of Embodiment 3.

FIG. 31 and FIG. 32 are respectively perspective and exploded perspective views schematically illustrating the overall configuration of semiconductor light-emitting device 301b according to the present variation.

Semiconductor light-emitting device 301b according to the present variation includes semiconductor light-emitting chip 30, first submount 310*b*, second submount 120, first sidewall 40, second sidewall 50, first optical element 181, and second optical element 182.

First submount 310*b* according to the present variation differs from semiconductor light-emitting device 301 according to Embodiment 3 in regard to the configuration of spacer 311*b* and second metal material 312*b*.

As illustrated in FIG. 32, spacer 311*b* differs from spacer 311 according to Embodiment 3 in that it includes first inner recess 311*c*1 and third inner recess 311*d*1 in addition to first recess 311*c* and third recess 311*d*, and is otherwise identical.

In a top view of third surface 319*a* of first base 319, first inner recess 311*c*1 is located at the end edge near emission surface 30F (i.e., the front end edge), and is a recessed portion that recedes inward of spacer 311*b*. In a top view of third surface 319*a* of first base 319, third inner recess 311*d*1 is located at the end edge near rear surface 30R (i.e., the rear end edge), and is a recessed portion that recedes inward of spacer 311*b*. First inner recess 311*c*1 and third inner recess 311*d*1 are arranged overlapping second submount 120 in a top view of third surface 319*a*.

As illustrated in FIG. 32, second metal material 312*b* differs from second metal material 312 according to Embodiment 3 in that it includes second inner recess 312*c*1 and fourth inner recess 312*d*1 in addition to second recess 312*c* and fourth recess 312*d*, and is otherwise identical.

In a top view of third surface 319*a* of first base 319, second inner recess 312*c*1 is located at the end edge near emission surface 30F (i.e., the front end edge), and is a recessed portion that recedes inward of second metal material 312*b*. In a top view of third surface 319*a* of first base 319, fourth inner recess 312*d*1 is located at the end edge near rear surface 30R (i.e., the rear end edge), and is a recessed portion that recedes inward of second metal material 312*b*. Second inner recess 312*c*1 and fourth inner recess 312*d*1 are arranged overlapping second submount 120 in a top view of third surface 319*a*.

First optical element 181 and second optical element 182 are bonded to first submount 310*b* and second submount 120, just as in Variation 1 of Embodiment 2. The gap between (i) first optical element 181 and second optical element 182 and (ii) first submount 310*b*, etc., is hermetically sealed by sealing material R1. In the present variation, sealing material R1 is disposed in first inner recess 311*c*1, second inner recess 312*c*1, third inner recess 311*d*1, and fourth inner recess 312*d*1, as illustrated in FIG. 31. Because spacer 311*b* and second metal material 312*b* include these inner recesses, sealing material R1 can be inhibited from leaking out of the inner recesses.

Figure 33:
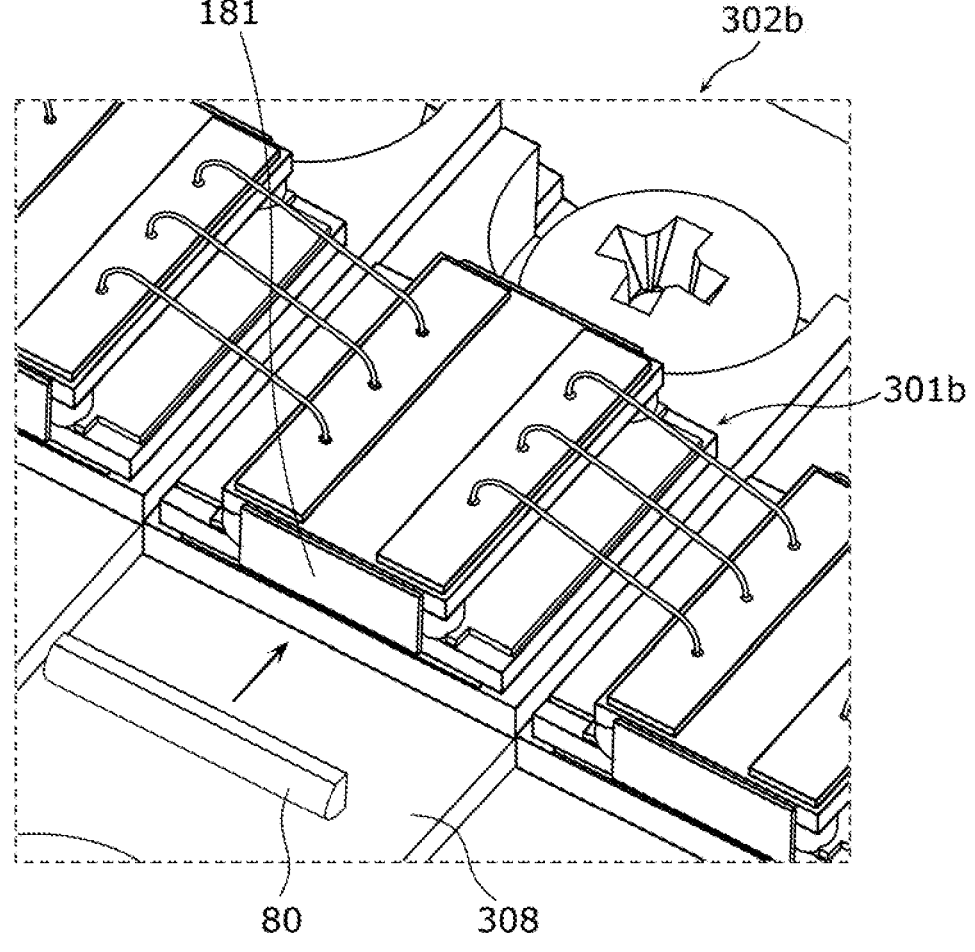
FIG. 33 is an exploded perspective view schematically illustrating a light source device according to Variation 2 of Embodiment 3.
Figure 34:
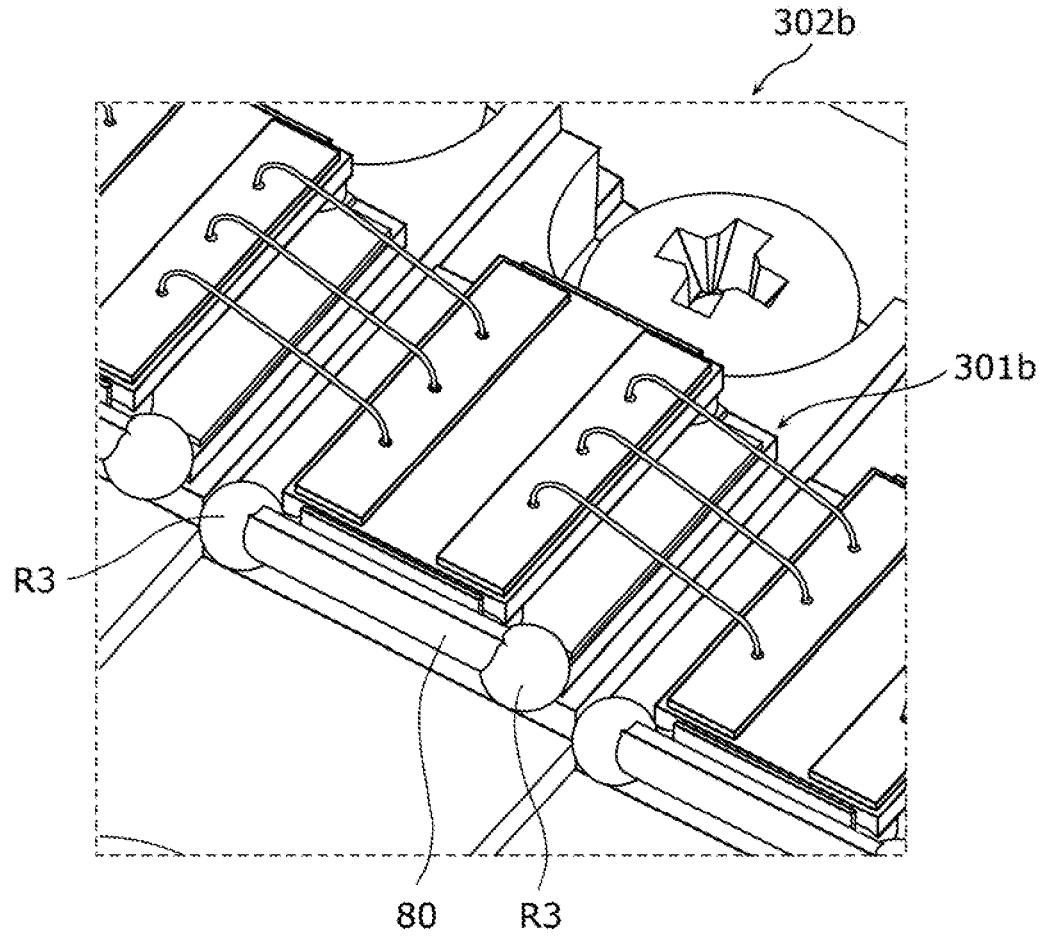
FIG. 34 is a perspective view schematically illustrating the light source device according to Variation 2 of Embodiment 3.

Next, the light source device according to the present variation will be described with reference to FIG. 33 and FIG. 34. FIG. 33 and FIG. 34 are respectively exploded perspective and perspective views schematically illustrating the light source device according to the present variation. FIG. 33 and FIG. 34 are enlarged views of the vicinity of one semiconductor light-emitting device 301*b* included in the light source device according to the present variation.

Light source device 302*b* according to the present variation differs from light source device 302 according to Variation 1 of Embodiment 3 in that it includes semiconductor light-emitting device 301*b* as illustrated in FIG. 33, and is identical in other respects.

As illustrated in FIG. 34, light source device 302*b* according to the present variation includes semiconductor light-emitting device 301*b* and lens optical element 80. As illustrated in FIG. 33, lens optical element 80 is disposed forward of first optical element 181 of semiconductor light-emitting device 301*b*, and after the positioning of lens optical element 80 is adjusted, lens optical element 80 is connected to first recess 311*c* and second recess 312*c* illustrated in FIG. 31 via bonding material R3. More specifically, lens optical element 80 is bonded to first base 319 of semiconductor light-emitting device 301*b* by bonding material R3 disposed in first recess 311*c* and second recess 312*c*. In a top view of third surface 319*a*, first recess 311*c* and second recess 312*c* of first submount 310*b* are located at positions protruding from second submount 120 in second direction D2. Bonding material R3 can therefore be precisely applied in a predetermined position between first submount 310*b* and lens optical element 80, and precisely fix first submount 310*b* and lens optical element 80. Lens optical element 80 can therefore be precisely fixed at a predetermined position on the semiconductor light-emitting device 301*b*.

Semiconductor light-emitting device 301*b* may be a semiconductor light-emitting device bonded to an auxiliary plate, just as in Variation 1.

Embodiment 4

Next, a semiconductor light-emitting device and a light source device including the semiconductor light-emitting device according to Embodiment 4 will be described. The semiconductor light-emitting device according to the present embodiment differs from semiconductor light-emitting device 301 according to Embodiment 3 mainly in regard to the configuration of the second submount. The following description will focus on how the semiconductor light-emitting device and the light source device according to the present variation differ from semiconductor light-emitting device 301 according to Embodiment 3 and light source device 302 according to Variation 1 of Embodiment 3, with reference to FIG. 35 through FIG. 37.

Figure 35:
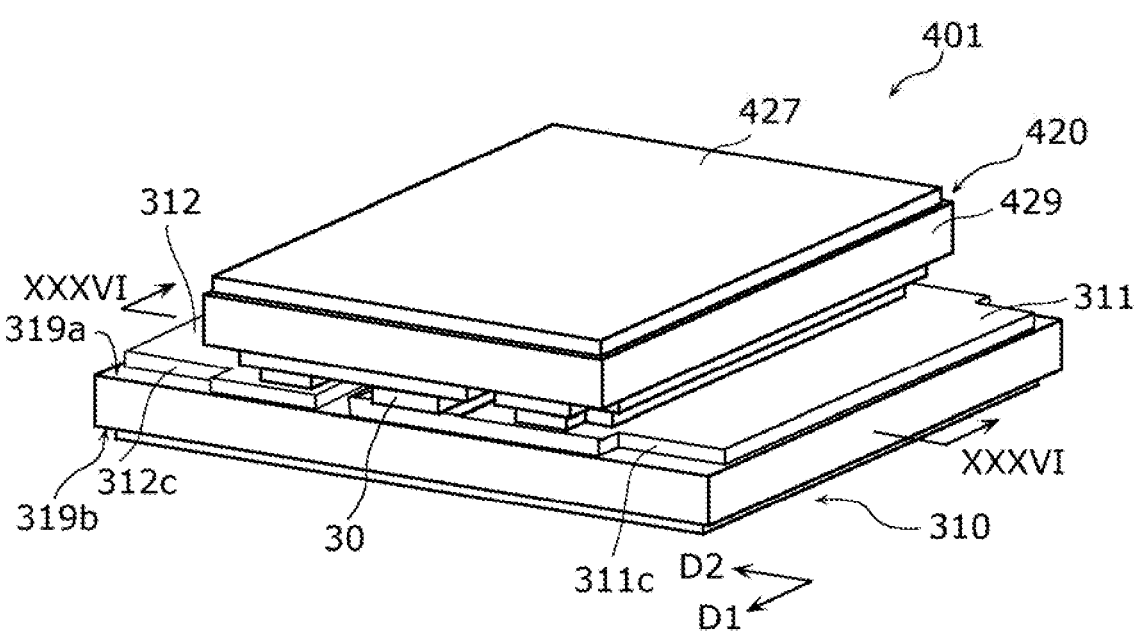
FIG. 35 is a perspective view schematically illustrating the overall configuration of a semiconductor light-emitting device according to Embodiment 4.
Figure 36:
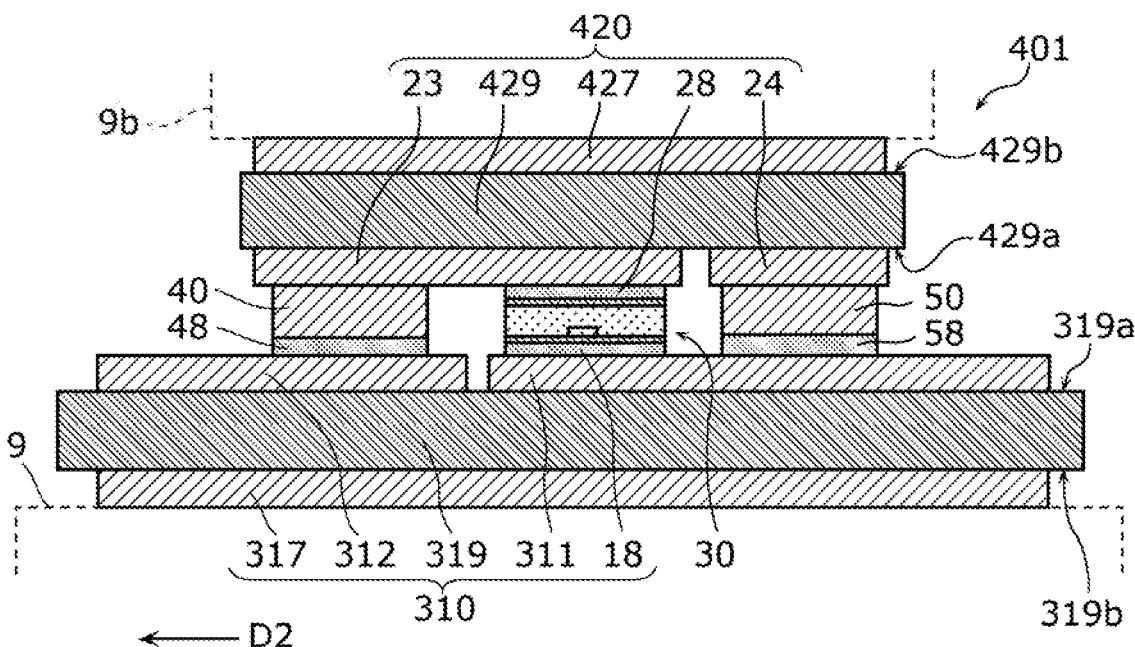
FIG. 36 is a cross-sectional view schematically illustrating the overall configuration of the semiconductor light-emitting device according to Embodiment 4.

FIG. 35 and FIG. 36 are respectively perspective and cross-sectional views schematically illustrating the overall configuration of semiconductor light-emitting device 401 according to the present embodiment. FIG. 36 is a cross-sectional view taken at line XXXVI-XXXVI in FIG. 35. For illustrative purposes, heat-dissipating component 9 and second heat-dissipating component 9*b* are also shown with dashed lines in the illustration of semiconductor light-emitting device 401 in FIG. 36.

As illustrated in FIG. 36, semiconductor light-emitting device 401 according to the present embodiment includes semiconductor light-emitting chip 30, first submount 310, second submount 420, first sidewall 40, and second sidewall 50. Semiconductor light-emitting device 401 according to the present embodiment differs from semiconductor light-emitting device 301 according to Embodiment 3 in regard to the configuration of second submount 420, and is identical in other respects.

Second submount 420 includes second base 429, third metal material 23, fourth metal material 24, and backside metal material 427.

Second base 429 according to the present embodiment differs from second base 29 according to Embodiment 3 in that it does not include first via B1 or second via B2. Second base 429 includes fourth surface 429*a* and fifth surface 429*b* on opposite sides. Second base 429 is one example of the second insulating member comprising an insulating material. For example, second base 429 is a ceramic substrate, a polycrystalline substrate, or a monocrystalline substrate comprising a material with high thermal conductivity such as alumina, AlN, SiC, or diamond or the like. Second base 429 may comprise a composite material of an insulating material formed on the fourth surface 429a side and an electrically conductive material. For example, second base 429 may be a substrate including an oxide film formed on a surface of a silicon substrate. Second base 429 may therefore include an insulating material. Just like with the second base according to Embodiment 3, third metal material 23 and fourth metal material 24 are disposed on fourth surface 429a. Backside metal material 427 is disposed on fifth surface 429b.

Backside metal material 427 is a metal material disposed on fifth surface 429b of second base 429. Backside metal material 427 is, for example, a plate-shaped metal material consisting mainly of a metal with high thermal conductivity such as Cu, with a protective metal film of, for example, Ni or Au or the like formed on the surface. Backside metal material 427 may be made of the same material and have the same thickness as third metal material 23 and fourth metal material 24. This inhibits warping of second base 429 since the same metal material is disposed on both sides of second base 429. Note that backside metal material 427 is not an essential element of semiconductor light-emitting device 401.

In semiconductor light-emitting device 401 according to the present embodiment, power is supplied to semiconductor light-emitting chip 30 from spacer 311 and second metal material 312. Since spacer 311 and second metal material 312 of semiconductor light-emitting device 401 protrude in second direction D2 from second submount 420 in a top view of third surface 319a, metal wires, for example, can be connected from above spacer 311 and second metal material 312. In semiconductor light-emitting device 401 according to the present embodiment, unlike the semiconductor light-emitting device according to Embodiment 1, semiconductor light-emitting chip 30 and second metal material 312 can be connected without using metal wires 91, to achieve a wireless structure. This configuration reduces the electrical resistance of the power supply path when supplying power from an external source to semiconductor light-emitting chip 30, since the power does not pass through metal material such as first via B1 and second via B2 of Embodiment 3. The electrical resistance of the power supply path can be further reduced because the wiring is done using third metal material 23 and first sidewall 40 and the like, which are rectangular pieces of metal with a larger cross-sectional area than the metal wire, rather than using metal wire.

Third metal material 23 and fourth metal material 24 of second submount 420 are electrically insulated. Thus, second sidewall 50 and fourth metal material 24, which are electrically connected to spacer 311, and first sidewall 40 and third metal material 23, which are electrically connected to second metal material 312, are electrically insulated. Therefore, when power is supplied using spacer 311 and second metal material 312, current can be prevented from flowing through paths other than semiconductor light-emitting chip 30. On the other hand, third metal material 23, fourth metal material 24, and second base 429 included in second submount 420 comprise a metal or insulator with high thermal conductivity. This allows some of the heat generated by semiconductor light-emitting chip 30 to be transferred to second submount 420, first sidewall 40, and second sidewall 50, and efficiently discharged to the outside from first submount 310. More specifically, the heat is efficiently discharged to heat-dissipating component 9 connected to backside surface 319b of first submount 310. Second heat-dissipating component 9b may be disposed at a position opposite fifth surface 429b of second submount 420, and may be thermally connected to second submount

420. In such cases, since second submount 420 includes second base 429, which has insulating properties, the positive and negative electrodes of semiconductor light-emitting chip 30 are not shorted through second submount 420. Thus, according to the present embodiment, some of the heat generated by semiconductor light-emitting chip 30 can be efficiently discharged to second heat-dissipating component 9b via second submount 420 while supplying power to the positive and negative electrodes of semiconductor light-emitting chip 30.

Figure 37:
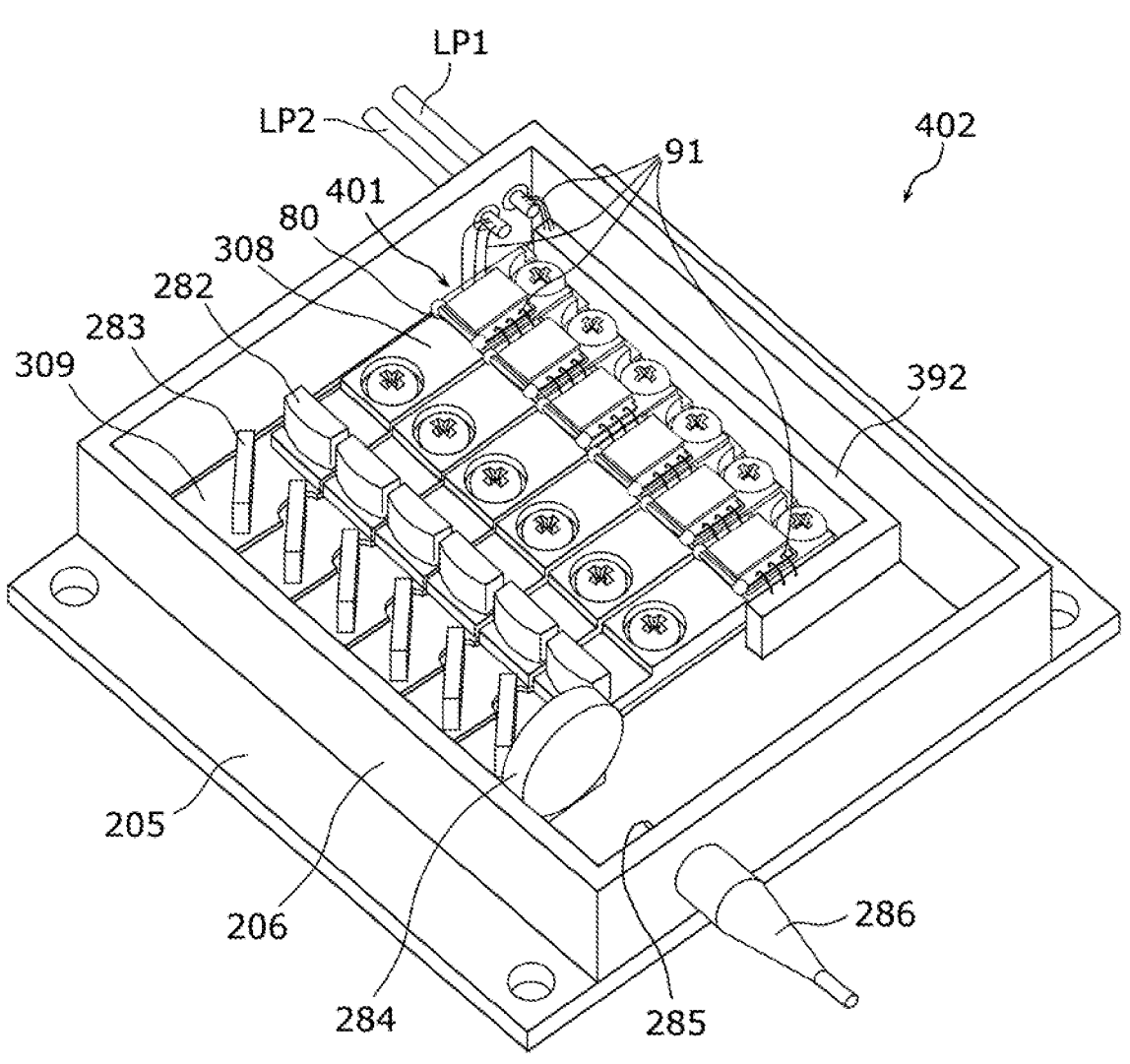
FIG. 37 is a perspective view schematically illustrating the overall configuration of a light source device according to Embodiment 4.
Figure 38:
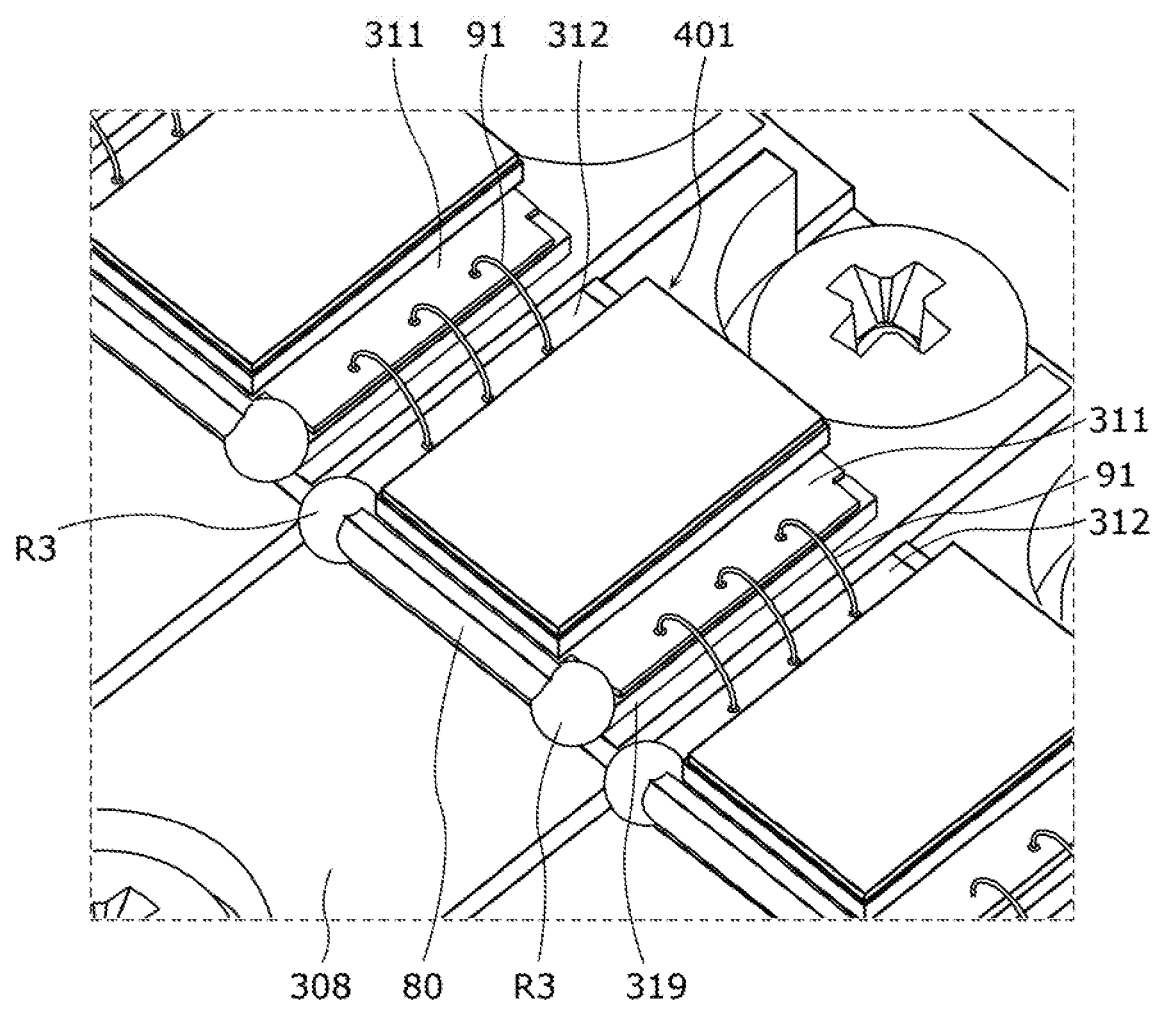
FIG. 38 is an enlarged perspective view schematically illustrating the configuration in the vicinity of the semiconductor light-emitting device included in the light source device according to Embodiment 4.

Next, the light source device according to the present embodiment will be described with reference to FIG. 37 and FIG. 38. FIG. 37 is a perspective view schematically illustrating the overall configuration of light source device 402 according to the present embodiment. FIG. 38 is an enlarged perspective view schematically illustrating the configuration in the vicinity of semiconductor light-emitting device 401 included in light source device 402 according to the present embodiment.

As illustrated in FIG. 37, light source device 402 according to the present embodiment differs from light source device 302 according to Variation 1 of Embodiment 3 in that it includes a plurality of semiconductor light-emitting devices 401 instead of a plurality of semiconductor light-emitting devices 301, and is identical in other respects.

As illustrated in FIG. 38, light source device 402 supplies power to semiconductor light-emitting device 401 via metal wires 91 connected to spacer 311 and second metal material 312. As described above, since spacer 311 and second metal material 312 protrude in second direction D2 from second submount 420 in a top view of third surface 319a, metal wires 91 can be easily connected from above spacer 311 and second metal material 312. In a top view of third surface 319a, first recess 311c and second recess 312c of first submount 310b are located at positions protruding from second submount 420 in second direction D2. Therefore, by applying bonding material R3 to first recess 311c and second recess 312c, bonding material R3 can be disposed precisely at a predetermined position between first submount 310 and lens optical element 80, and lens optical element 80 can be precisely fixed at the predetermined position on semiconductor light-emitting device 401.

Semiconductor light-emitting device 401 may be a semiconductor light-emitting device bonded to an auxiliary plate, just as in Variation 1 of Embodiment 3.

Second heat-dissipating component 9b may be disposed on top of each of semiconductor light-emitting devices 401 and thermally connected to second submount 420, base plate 205, frame 206, etc. In such cases, the heat generated by the semiconductor light-emitting chip in light source device 402 can be effectively discharged.

Embodiment 5

Next, a semiconductor light-emitting device and a light source device including the semiconductor light-emitting device according to Embodiment 5 will be described. The semiconductor light-emitting device according to the present embodiment differs from semiconductor light-emitting device 101d according to Variation 4 of Embodiment 2 mainly in that it includes an optical fiber as an optical element, as well as a light-receiving element. The semiconductor light-emitting device and the light source device according to the present embodiment will be described with reference to FIG. 39 through FIG. 41, focusing on the differences from semiconductor light-emitting device 101*b* and light source device 202 according to Variation 5 of Embodiment 2.

Figure 39:
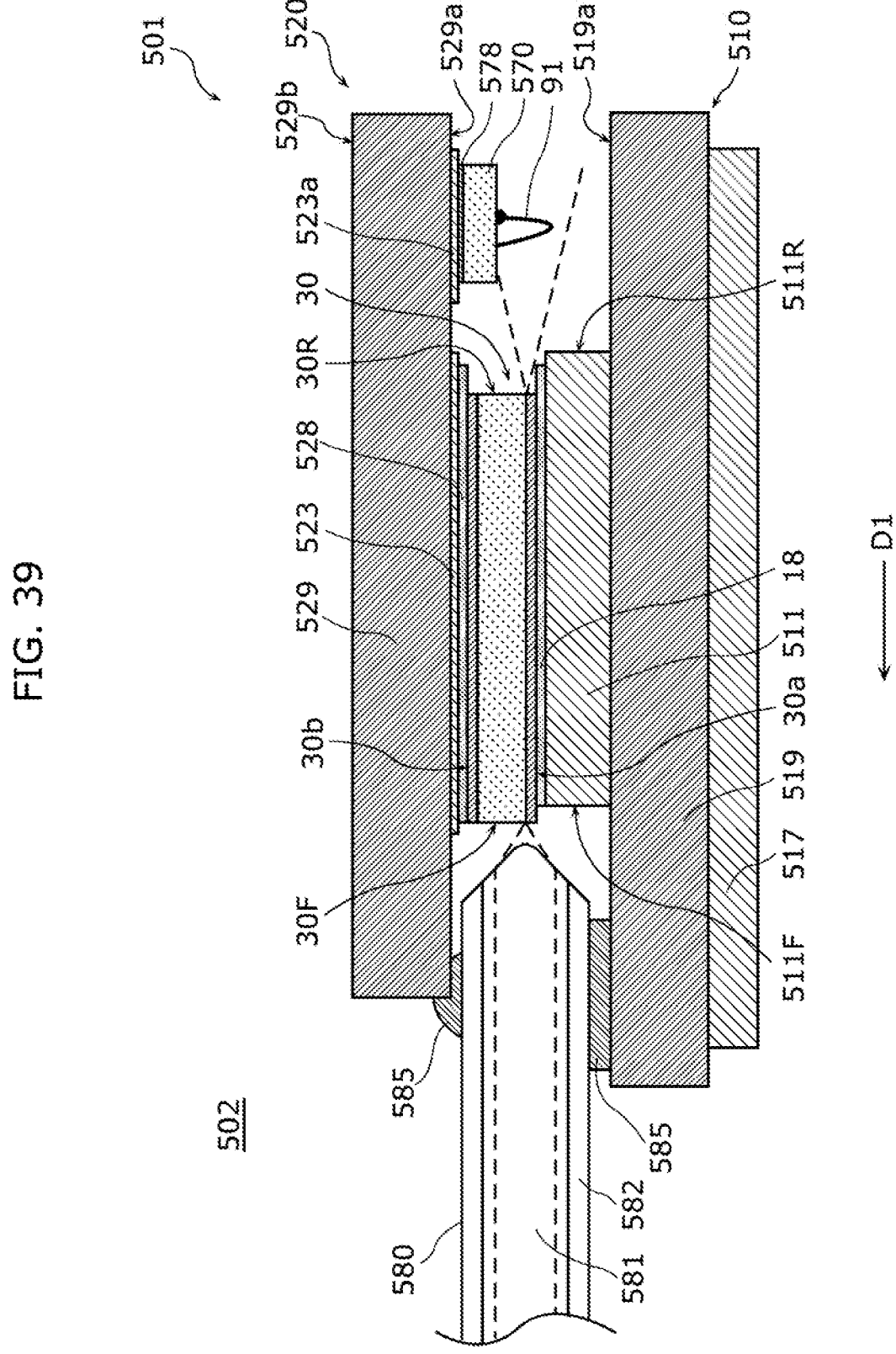
FIG. 39 is a partial cross-sectional view schematically illustrating the configuration in the vicinity of a semiconductor light-emitting device in a light source device according to Embodiment 5.
Figure 40A:
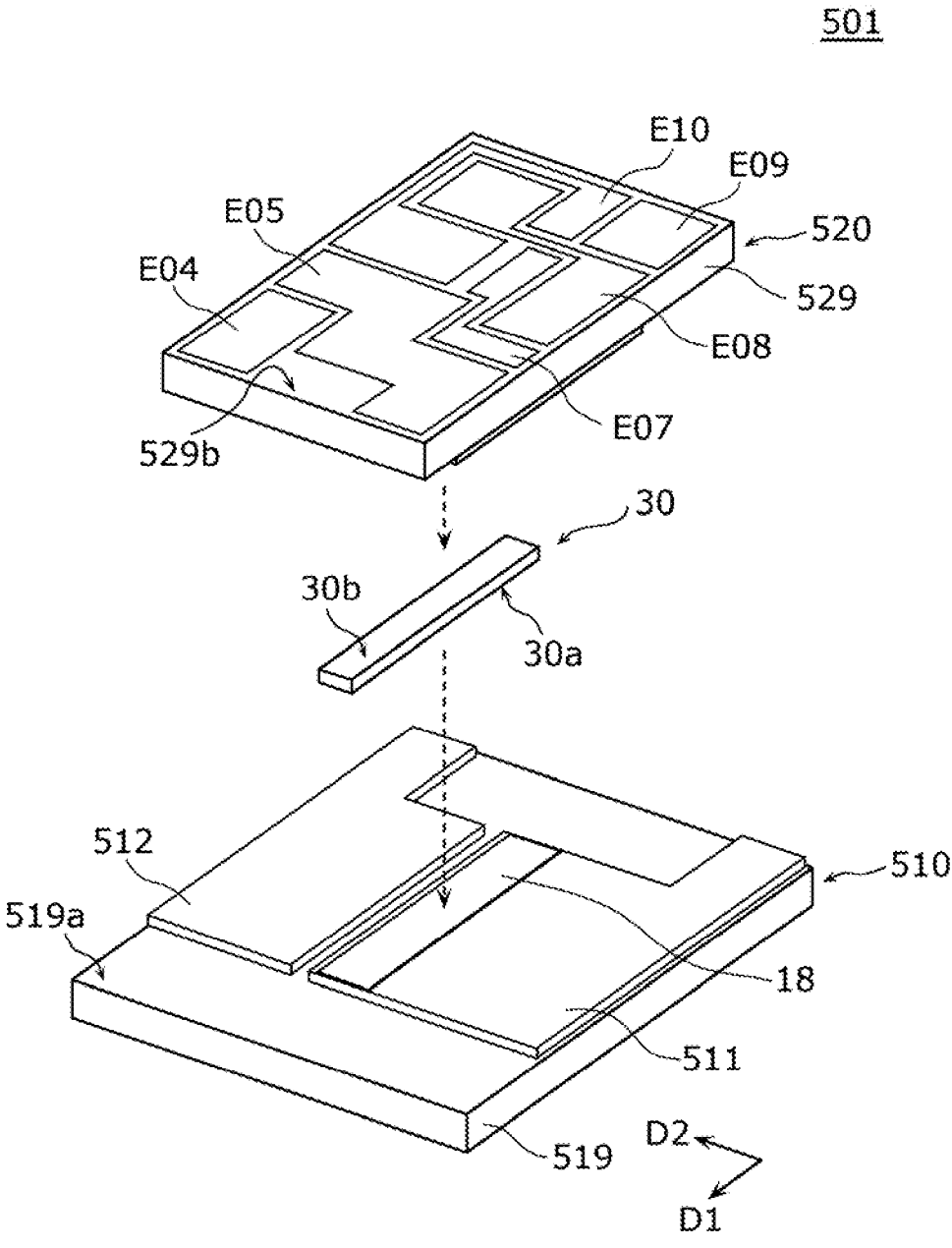
FIG. 40A is an exploded perspective view schematically illustrating the manufacturing method of the semiconductor light-emitting device according to Embodiment 5.
Figure 40B:
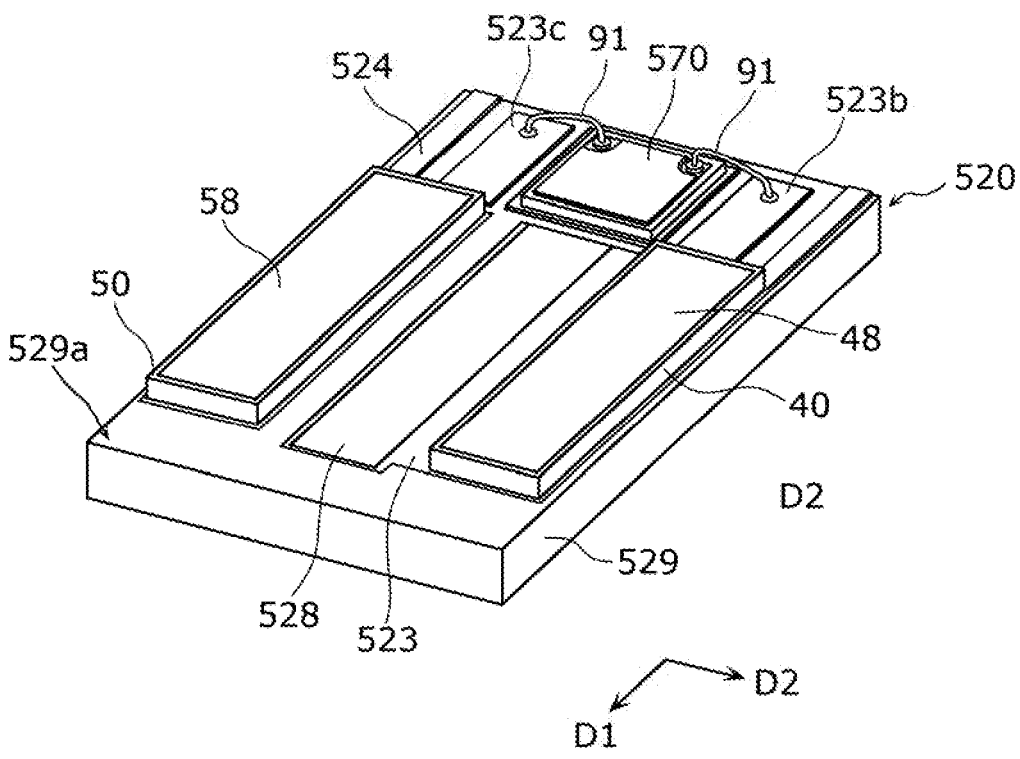
FIG. 40B is a perspective view schematically illustrating a second submount and components connected to the second submount according to Embodiment 5.

FIG. 39 is an enlarged perspective view schematically illustrating the configuration in the vicinity of semiconductor light-emitting device 501 of light source device 502 according to the present embodiment. FIG. 39 illustrates a cross section taken perpendicular to first surface 30*a* of semiconductor light-emitting chip 30 included in semiconductor light-emitting device 501, through semiconductor light-emitting chip 30. FIG. 40A is an exploded perspective view schematically illustrating the manufacturing method of semiconductor light-emitting device 501 according to the present embodiment. FIG. 40B is a perspective view schematically illustrating second submount 520 and the components connected to second d submount 520 according to the present embodiment.

As illustrated in FIG. 39, semiconductor light-emitting device 501 includes semiconductor light-emitting chip 30, first submount 510, second submount 520, and light-receiving element 570. Semiconductor light-emitting device 501 further includes first sidewall 40 and second sidewall 50, as illustrated in FIG. 40B. Light source device 502 further includes lens optical element 580, which is an optical fiber with a lens formed at its tip, and bonding material 585.

As illustrated in FIG. 39, first submount 510 includes first base 519, spacer 511, backside metal material 517, and bonding material 18. As illustrated in FIG. 40A, first submount 510 further includes second metal material 512. First submount 510 still further includes bonding material 48 and bonding material 58 illustrated in FIG. 40B.

First base 519 has the same configuration as first base 19 according to Variation 4 of Embodiment 2. Spacer 511 and second metal material 512 are disposed on third surface 519*a* of first base 519. Backside metal material 517 is disposed on the surface on the opposite side of first base 519 relative to third surface 519*a*.

Spacer 511 has the same configuration as spacer 111 according to Variation 4 of Embodiment 2, except for the top-view shape of third surface 519*a*. As illustrated in FIG. 40A, spacer 511 is notched in the area opposing light-receiving element 570. This inhibits contact between spacer 511 and light-receiving element 570 as well as metal wires 91.

Second metal material 512 has the same configuration as second metal material 112 according to Variation 4 of Embodiment 2, except for the top-view shape of third surface 519*a*. As illustrated in FIG. 40A, second metal material 512 is notched in the area opposing light-receiving element 570. This inhibits contact between second metal material 512 and light-receiving element 570 as well as metal wires 91.

Backside metal material 517 has the same configuration as backside metal material 17 according to Variation 4 of Embodiment 2.

Second submount 520 includes second base 529, third metal material 523, lower layer electrode 523*a*, bonding material 528, and bonding material 578, as illustrated in FIG. 39. As illustrated in FIG. 40A, second submount 520 further includes fourth electrode E04, fifth electrode E05, seventh electrode E07, eighth electrode E08, ninth electrode E09, and tenth electrode E10. Second submount 520 still further includes fourth metal material 524, eighth metal material 523*b*, and ninth metal material 523*c*, as illustrated in FIG. 40B.

Second base 529 includes fourth surface 529*a* and fifth surface 529*b* on opposite sides. In the present embodiment, second includes a second insulating member comprising an insulating material, and a plurality of vias (not illustrated) that penetrate between fourth surface 529*a* and fifth surface 529*b* of second base 529. For example, the second insulating member of second base 529 is a ceramic substrate, a polycrystalline substrate, or a monocrystalline substrate comprising a material such as alumina, AlN, SiC, or diamond or the like. The plurality of vias are made of a metal material such as W, Mo, Cu, or Au or the like. Third metal material 523, fourth metal material 524, lower layer electrode 523*a*, eighth metal material 523*b*, and ninth metal material 523*c* are disposed on fourth surface 529*a* of second base 529. Fourth electrode E04, fifth electrode E05, seventh electrode E07, eighth electrode E08, ninth electrode E09, and tenth electrode E10 are disposed on fifth surface 529*b* of second base 529.

Third metal material 523 has the same configuration as third metal material 23 according to Variation 4 of Embodiment 2, except for the top-view shape of fourth surface 529*a*. As illustrated in FIG. 40B, third metal material 523 is notched in the area where light-receiving element 570 and eighth metal material 523*b* are disposed. This inhibits contact between third metal material 523 and light-receiving element 570 as well as eighth metal material 523*b*.

Fourth metal material 524 has the same configuration as fourth metal material 24 according to Variation 4 of Embodiment 2, except for the top-view shape of fourth surface 529*a*. As illustrated in FIG. 40B, fourth metal material 524 is notched in the area where light-receiving element 570 and ninth metal material 523*c* are disposed. This inhibits contact between fourth metal material 524 and light-receiving element 570 as well as ninth metal material 523*c*.

Lower layer electrode 523*a*, eighth metal material 523*b*, and ninth metal material 523*c* are electrodes that are connected to light-receiving element 570 and disposed on fourth surface 529*a*. Lower layer electrode 523*a* is a metal material that is connected to light-receiving element 570 via bonding material 578. Eighth metal material 523*b* is the electrode to which one terminal of light-receiving element 570 is connected via metal wire 91. Ninth metal material 523*c* is the electrode to which the other terminal of light-receiving element 570 is connected via metal wire 91.

Lower layer electrode 523*a*, eighth metal material 523*b*, and ninth metal material 523*c* are electrodes that are connected to light-receiving element 570 and electrically insulated from each other. Lower layer electrode 523*a*, eighth metal material 523*b*, and ninth metal material 523*c* are disposed on fourth surface 529*a*. Lower layer electrode 523*a* is a metal material that is connected to light-receiving element 570 via bonding material 578. Eighth metal material 523*b* is the electrode to which one terminal of light-receiving element 570 is connected via metal wire 91. Ninth metal material 523*c* is the electrode to which the other terminal of light-receiving element 570 is connected via metal wire 91. Eighth metal material 523*b* is electrically connected to ninth electrode E09 through a via. Ninth metal material 523*c* is electrically connected to eighth electrode E08 through a via.

Fourth electrode E04, fifth electrode E05, seventh electrode E07, eighth electrode E08, ninth electrode E09, and tenth electrode E10 are electrodes disposed on fifth surface 529*b* and are electrically insulated from each other. Fourth electrode E04 is electrically connected to third metal material 523 through a via. Fifth electrode E05 is electrically connected to fourth metal material 524 through a via. Eighth electrode E08 is electrically connected to ninth metal material 523*c* through a via. Ninth electrode E09 is electrically connected to eighth metal material 523*b* through a via.

Seventh electrode E07 and tenth electrode E10 need not be connected to a via. This configuration allows voltage to be applied to light-receiving element 570 via eighth electrode E08 and ninth electrode E09. This configuration also allows power to be supplied to semiconductor light-emitting chip 30 via fourth electrode E04 and fifth electrode E05.

Bonding material 528 and bonding material 578 have the same configuration as bonding material 28 according to Variation 4 of Embodiment 2.

Light-receiving element 570 is an element for measuring the intensity of light leaking from rear surface 30R of semiconductor light-emitting chip 30, and is one example of the functional element disposed on fourth surface 529a. In the present embodiment, a functional element such as light-receiving element 570 is mounted on second submount 520. This makes it possible to select the position at which the functional element is disposed with respect to semiconductor light-emitting chip 30 from within a three-dimensional space. Stated differently, a functional element can be disposed not only in the plane in which semiconductor light-emitting chip 30 is disposed, but also in a location separated from the plane.

In the present embodiment, light-receiving element 570 is a photodiode. As illustrated in FIG. 39, light-receiving element 570 is disposed on second submount 520. More specifically, light-receiving element 570 is disposed on fourth surface 529a of second base 529 with lower layer electrode 523a and bonding material 578 disposed therebetween. Disposing light-receiving element 570 on second submount 520 inhibits the light from being blocked by spacer 511, which is disposed rearward (i.e., to the right in FIG. 39) of first rear surface 30R of semiconductor light-emitting chip 30, more so than when it is disposed on first submount 510. Light-receiving element 570 is electrically connected to eighth metal material 523b and ninth metal material 523c. More specifically, light-receiving element 570 includes two terminals, one of which is electrically connected to eighth metal material 523b via metal wire 91 and the other of which is electrically connected to ninth metal material 523c via metal wire 91.

Figure 41:
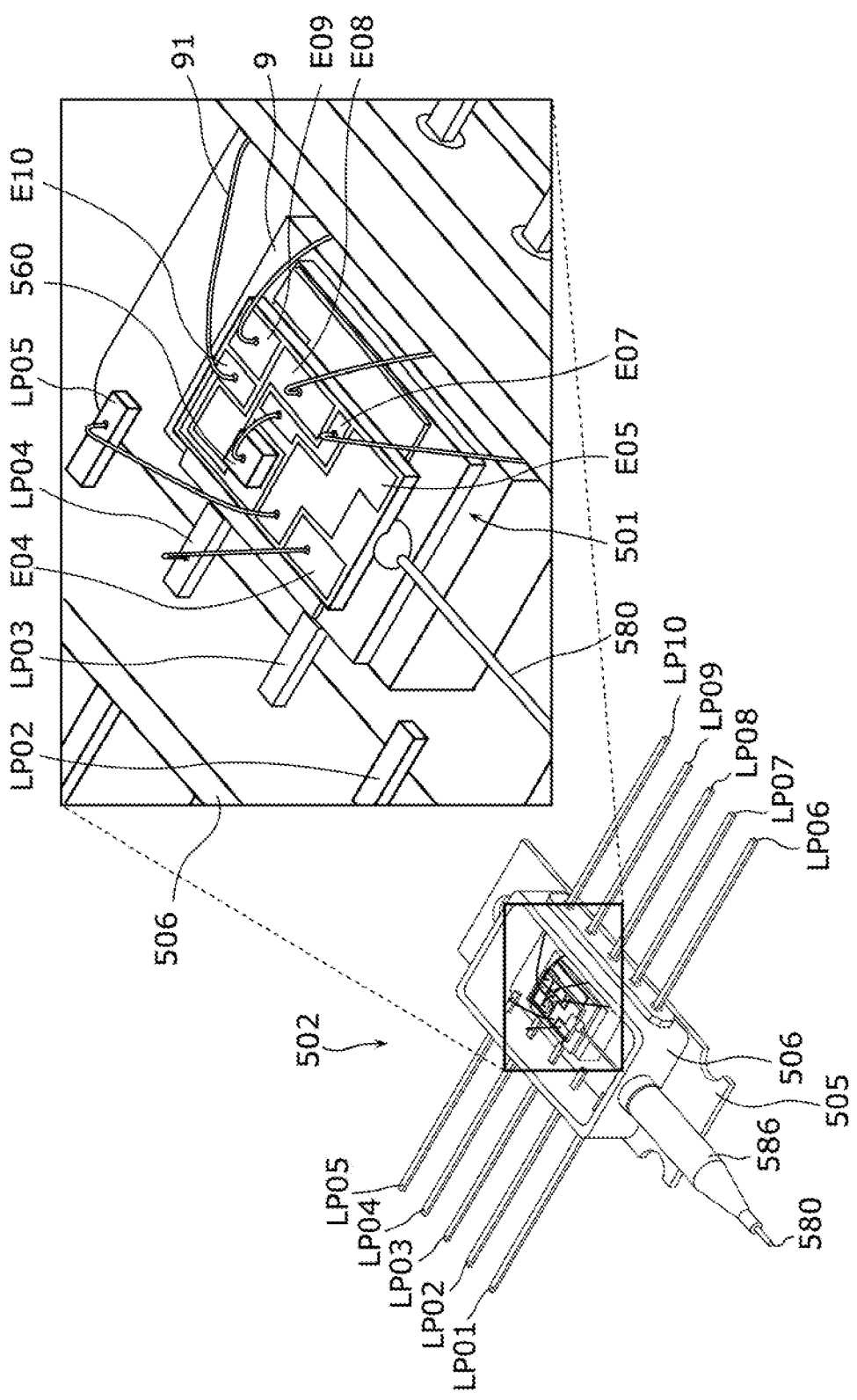
FIG. 41 is a perspective view schematically illustrating the configuration of the light source device according to Embodiment 5.

Next, light source device 502 that includes semiconductor light-emitting device 501 according to the present embodiment will be described with reference to FIG. 39 and FIG. 41. FIG. 41 is a perspective view schematically illustrating the configuration of light source device 502 according to the present embodiment. FIG. 41 illustrates an enlarged view of the area around semiconductor light-emitting device 501, along with an overall view of light source device 502.

Lens optical element 580 is one example of the optical element on which the emission light from semiconductor light-emitting chip 30 of semiconductor light-emitting device 501 is incident. Lens optical element 580 is a step-index optical fiber, and includes core 581 and cladding 582 covering core 581. One end of lens optical element 580 is what is known as a lensed fiber, which has a convex lens shape. This one end of lens optical element 580 is located near emission surface 30F of semiconductor light-emitting chip 30. This allows the emission light from emission surface 30F to be focused on core 581 of lens optical element 580, whereby the emission light can be coupled to lens optical element 580 with high efficiency.

As illustrated in FIG. 39, lens optical element 580 is connected to first submount 510 and second submount 520. In the present embodiment, lens optical element 580 is connected to first base 519 of first submount 510 and second base 529 of second submount 520 by bonding material 585. For example, an ultraviolet curable resin or thermoset resin can be used as bonding material 585. With the above configuration, lens optical element 580 is fixed not only to first submount 510 but also to second submount 520 bonded to semiconductor light-emitting chip 30. It is therefore possible to inhibit the coupling efficiency of the emission light from changing over time as the positional relationship between the lens shape at the tip of lens optical element 580 and the semiconductor light-emitting device changes over time.

Light source device 502 further includes a package including base plate 505, frame 506, and lead pins LP01 through LP10. Light source device 50 still further includes optical fiber holding component 586 that holds lens optical element 580, and heat-dissipating component 9 that holds semiconductor light-emitting device 501 to base plate 505. As illustrated in FIG. 41, the package of light source device 502 has what is known as a "butterfly" package structure.

Base plate 505 is a plate-shaped component that serves as the base for light source device 502. Base plate 505 and frame 506 form the housing of light source device 502. The outer circumferential portion of base plate 505 may have a through-hole or the like for fixing light source device 502 with a screw or the like. Base plate 505 is formed of a metal material such as Cu, Cu—W alloy, or Cu—Mo alloy, for example.

Frame 506 is a rectangular tubular component disposed on base plate 505. One opening of frame 506 is covered by base plate 505 to form the housing of light source device 502. Frame 506 includes holes through which the lead pins LP01 through LP10 and lens optical element 580 penetrate. Frame 506 is formed of a metal material such as Kovar or Fe—Ni alloy or the like.

Heat-dissipating component 9 is the component on which semiconductor light-emitting device 501 is placed. Heat-dissipating component 9 is disposed between base plate 505 and semiconductor light-emitting device 501, and discharges heat generated by semiconductor light-emitting device 501 to base plate 505.

Lead pins LP01 through LP10 are terminals used to supply power and electrical signals to light source device 502 from an outside source. Signals may also be output from lead pins LP01 through LP10. Lead pins LP01 through LP10 are fixed in place while passing through frame 506. The space between each of the lead pins LP01 through LP10 and frame 506 is filled with an insulating material such as glass or ceramic. Lead pints LP01 through LP10 are formed of a metal material such as Kovar or Fe—Ni alloy or the like.

In the present embodiment, lead pins LP04 and LP05 are respectively electrically connected to fourth electrode E04 and fifth electrode E05 of semiconductor light-emitting device 501 via metal wires 91. This allows power to be supplied to semiconductor light-emitting chip 30 from lead pins LP04 and LP05. Lead pins LP08 and LP09 are respectively electrically connected to eighth electrode E08 and ninth electrode E09 of semiconductor light-emitting device 501 via metal wires 91. This allows voltage to be applied from lead pins LP08 and LP09 to light-receiving element 570 of semiconductor light-emitting device 501, and allows monitoring of a signal corresponding to the amount of light emitted by semiconductor light-emitting chip 30 by measuring the value of the current flowing between lead pins LP08 and LP09.

In light source device 502, semiconductor light-emitting device 501 further includes thermistor 560. Thermistor 560 is an element for measuring temperature and is one example of the functional element disposed on fifth surface 529b. In the present embodiment, thermistor 560 is disposed on tenth electrode E10 of semiconductor light-emitting device 501. Thermistor 560 includes a terminal that is electrically connected to seventh electrode E07 via metal wire 91. This allows the temperature of semiconductor light-emitting device 501 to be monitored based on signals output from lead pins LP07 and LP10. In the present embodiment, semiconductor light-emitting device 501 includes second submount 520, and a functional element is mounted on second submount 520. This makes it possible to select the position at which the functional element is disposed with respect to semiconductor light-emitting chip 30 from within a three-dimensional space. Stated differently, not only two-dimensional mounting, in which functional elements are disposed in the same plane as semiconductor light-emitting chip 30, but also three-dimensional mounting can be realized, thereby increasing the degree of design freedom in disposing the functional element.

Embodiment 6

Next, the semiconductor light-emitting device according to Embodiment 6 will be described. The semiconductor light-emitting device according to the present embodiment differs from semiconductor light-emitting device 101 according to Embodiment 2 mainly in that it does not include first via B1 or second via B2, and that it includes a Zener diode. The following description will focus on the differences between the semiconductor light-emitting device according the present embodiment and semiconductor light-emitting device 101 according to Embodiment 2, with reference to FIG. 42A and FIG. 42B.

Figure 42A:
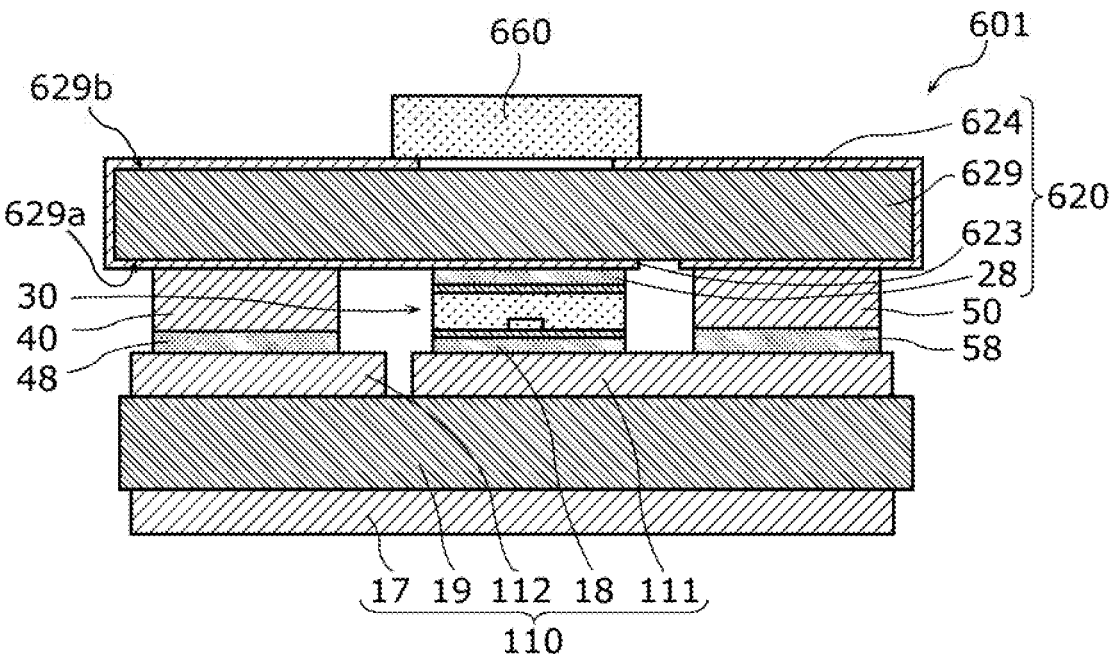
FIG. 42A is a cross-sectional view schematically illustrating the overall configuration of a semiconductor light-emitting device according to Embodiment 6.
Figure 42B:
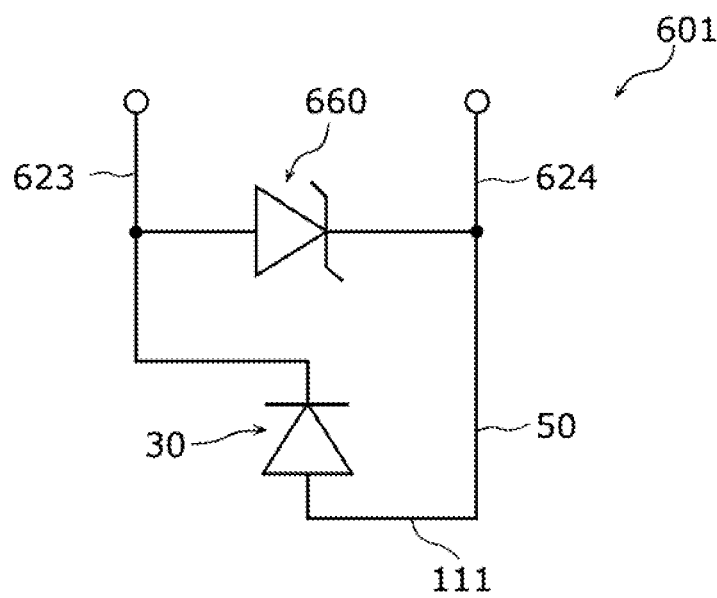
FIG. 42B illustrates an equivalent circuit of the semiconductor light-emitting device according to Embodiment 6.

FIG. 42A is a cross-sectional view schematically illustrating the overall configuration of semiconductor light-emitting device 601 according to the present embodiment. FIG. 42A illustrates a cross-section of semiconductor light-emitting device 601 taken perpendicular to first direction D1. FIG. 42B illustrates an equivalent circuit of semiconductor light-emitting device 601 according to the present embodiment.

As illustrated in FIG. 42A, semiconductor light-emitting device 601 according to the present embodiment includes semiconductor light-emitting chip 30, first submount 110, second submount 620, first sidewall 40, second sidewall 50, and Zener diode 660.

Second submount 620 includes second base 629, third metal material 623, fourth metal material 624, and bonding material 28.

Second base 629 differs from second base 29 of Embodiment 2 in that it does not include first via B1 or second via B2. Second base 629 is one example of the second insulating member comprising an insulating material. For example, second base 629 is a ceramic substrate, a polycrystalline substrate, or a monocrystalline substrate comprising a material with high thermal conductivity such as alumina, AlN, SiC, or diamond or the like. Second base 629 includes fourth surface 629a and fifth surface 629b on opposite sides. Third metal material 623 and fourth metal material 624 are disposed on fourth surface 629a, fifth surface 629b, and on the side surfaces connecting fourth surface 629a and fifth surface 629b. Zener diode 660 is disposed on fifth surface 629b.

Third metal material 623 is a metal material that is electrically connected to semiconductor light-emitting chip 30 and first sidewall 40. Third metal material 623 is disposed continuously from fourth surface 629a, over the side surface of second base 529, to fifth surface 629b. Third metal material 623 is connected to one terminal of Zener diode 660 at fifth surface 629b. As illustrated in FIG. 42B, in the present embodiment, third metal material 623 is connected to the anode terminal of Zener diode 660. Third metal material 623 is electrically insulated from fourth metal material 624. Third metal material 623 is, for example, a patterned metal film of Ni or Au or the like, which is formed by a plurality of vacuum evaporation processes.

Fourth metal material 624 is a metal material that is electrically connected to second sidewall 50. Fourth metal material 624 is disposed continuously from fourth surface 629a, over the side surface of second base 529, to fifth surface 629b. Fourth metal material 624 is connected to the other terminal of Zener diode 660 at fifth surface 629b. As illustrated in FIG. 42B, in the present embodiment, fourth metal material 624 is connected to the cathode terminal of Zener diode 660. Fourth metal material 624 is electrically insulated from third metal material 623. Fourth metal material 624 is, for example, a patterned metal film of Ni or Au or the like, which is formed by a plurality of vacuum evaporation processes.

Zener diode 660 is an element for protecting semiconductor light-emitting chip 30 by maintaining the voltage applied to semiconductor light-emitting chip 30 below a certain level, and is one example of the functional element disposed on fifth surface 629b. As illustrated in FIG. 42B, the anode and cathode terminals of the Zener diode are connected to third metal material 623 and fourth metal material 624, respectively.

As described above, since semiconductor light-emitting device 601 according to the present embodiment includes Zener diode 660 connected in parallel with semiconductor light-emitting chip 30 as illustrated in FIG. 42B, even if a surge is applied to semiconductor light-emitting device 601 from the outside, degradation of semiconductor light-emitting chip 30 can be inhibited. In the present embodiment, semiconductor light-emitting device 601 includes second submount 620, and a functional element is mounted on second submount 620. This makes it possible to select the position at which the functional element is disposed with respect to the semiconductor light-emitting chip from within a three-dimensional space. Stated differently, not only two-dimensional mounting, in which functional elements are disposed in the same plane as the semiconductor light-emitting chip, but also three-dimensional mounting can be realized, thereby increasing the degree of design freedom in disposing the functional element.

Embodiment 7

Next, the semiconductor light-emitting device according to Embodiment 7 will be described. The semiconductor light-emitting device according to the present embodiment differs from semiconductor light-emitting device 401 according to Embodiment 4 mainly in that it includes a plurality of semiconductor light-emitting chips. The following description will focus on the differences between the semiconductor light-emitting device according the present embodiment and semiconductor light-emitting device 401 according to Embodiment 4, with reference to FIG. 43A and FIG. 43B.

Figure 43A:
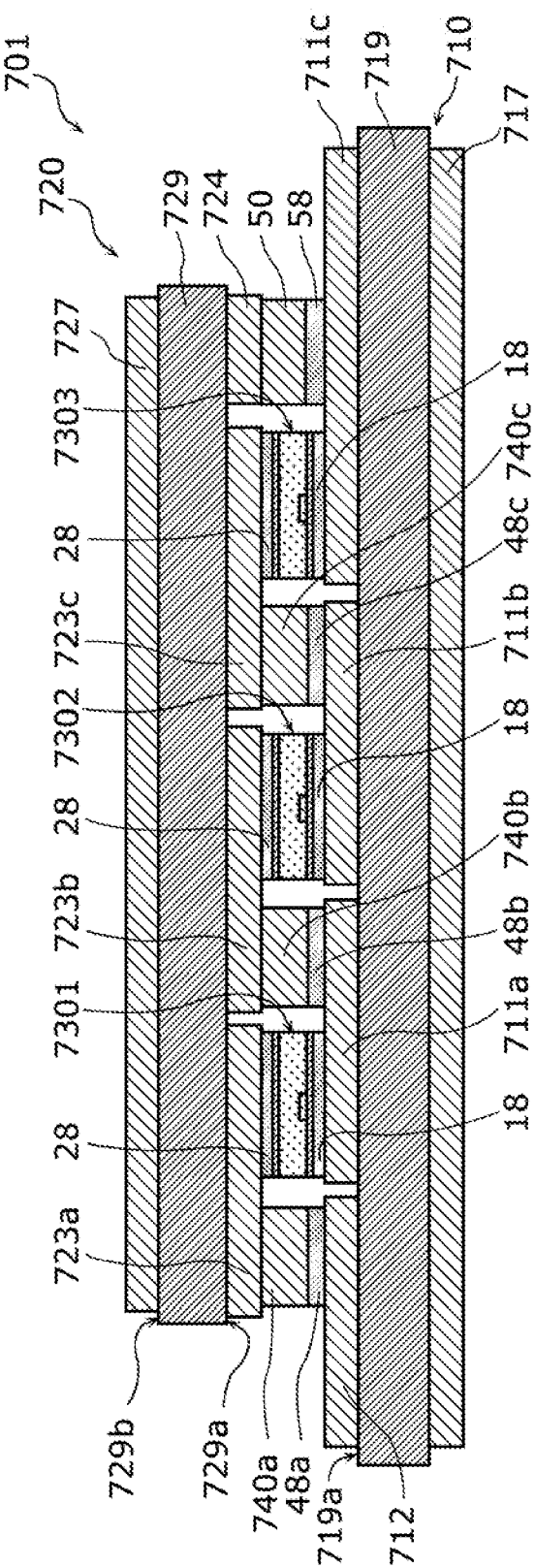
FIG. 43A is a cross-sectional view schematically illustrating the overall configuration of a semiconductor light-emitting device according to Embodiment 7.
Figure 43B:
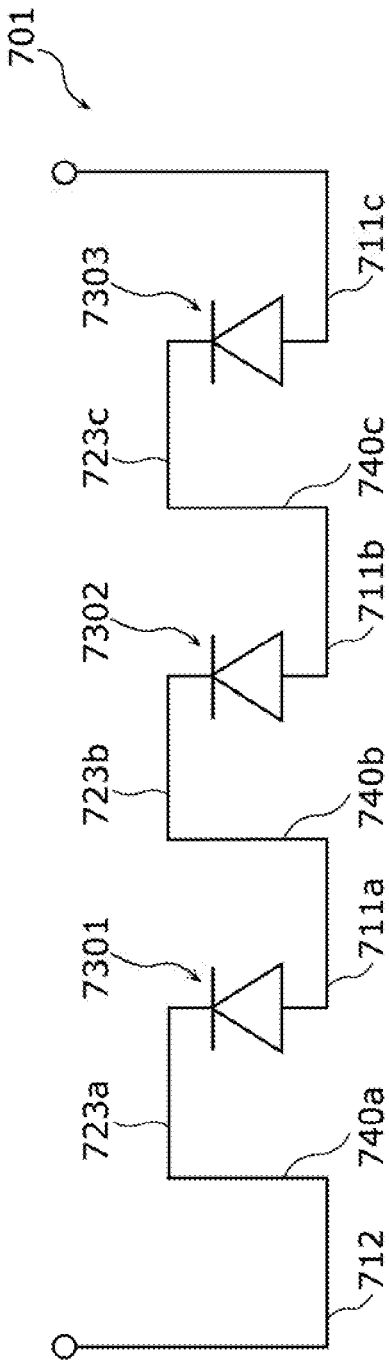
FIG. 43B illustrates an equivalent circuit of the semiconductor light-emitting device according to Embodiment 7.

FIG. 43A is a cross-sectional view schematically illustrating the overall configuration of semiconductor light-emitting device 701 according to the present embodiment. FIG. 43A illustrates a cross-section of semiconductor light-emitting device 701 taken perpendicular to first direction D1. FIG. 43B illustrates an equivalent circuit of semiconductor light-emitting device 701 according to the present embodiment.

As illustrated in FIG. 43A, semiconductor light-emitting device 701 according to the present embodiment includes first semiconductor light-emitting chip 7301, second semiconductor light-emitting chip 7302, third semiconductor light-emitting chip 7303, first submount 710, second submount 720, first sidewalls 740*a*, 740*b*, and 740*c*, and second sidewall 50.

First semiconductor light-emitting chip 7301, second semiconductor light-emitting chip 7302, and third semiconductor light-emitting chip 7303 are the same elements as semiconductor light-emitting chips 30 in each of the above embodiments, and are disposed on first submount 710.

First semiconductor light-emitting chip 7301, like semiconductor light-emitting chip 30, includes a first surface and a second surface on opposite sides, a first optical waveguide extending in the first direction parallel to the first surface and disposed closer to the first surface than to the second surface, and a first emission surface which is one of the side surfaces that connect the first surface and the second surface and intersect the first direction, and emits emission light in the first direction.

Second semiconductor light-emitting chip 7302 includes a sixth surface corresponding to the first surface of semiconductor light-emitting chip 30. The sixth surface is the portion of the surface of second semiconductor light-emitting chip 7302 that opposes first submount 710. Second semiconductor light-emitting chip 7302 includes a seventh surface on the opposite side of the sixth surface, a second optical waveguide extending in the first direction parallel to the sixth surface and disposed closer to the sixth surface than to the seventh surface, and a second emission surface which is one of the side surfaces that connect the sixth surface and the seventh surface and intersect the first direction, and emits emission light in the first direction.

Third semiconductor light-emitting chip 7303 includes an eighth surface the corresponding to first surface of semiconductor light-emitting chip 30. The eighth surface is the portion of the surface of third semiconductor light-emitting chip 7303 that opposes first submount 710. Third semiconductor light-emitting chip 7303 includes a ninth surface on the opposite side of the eighth surface, a third optical waveguide extending in the first direction parallel to the eighth surface, and a third emission surface which is one of the side surfaces that connect the eighth surface and the ninth surface and intersect the first direction, and emits emission light in the first direction.

First submount 710 includes first base 719, spacers 711*a*, 711*b*, and 711*c*, second metal material 712, backside metal material 717, bonding material 18, bonding material 48*a*, bonding material 48*b*, bonding material 48*c*, and bonding material 58.

First base 719 has the same configuration as first base 319 according to Embodiment 3. Spacers 711*a*, 711*b*, and 711*c* and second metal material 712 are disposed on third surface 719*a* of first base 719. Backside metal material 717 is disposed on the surface on the opposite side of first base 719 relative to third surface 719*a*.

Backside metal material 717 has the same configuration as backside metal material 317 according to Embodiment 4.

Second submount 720 includes second base 729, third metal material 723*a*, third metal material 723*b*, third metal material 723*c*, fourth metal material 724, backside metal material 727, and bonding material 28.

Second base 729 has the same configuration as second base 429 according to Embodiment 4. Second base 729 includes fourth surface 729*a* and fifth surface 729*b*.

The first surface of first semiconductor light-emitting chip 7301 is connected to spacer 711*a* and the second surface is connected to third metal material 723*a*. The sixth surface of second semiconductor light-emitting chip 7302 is connected to spacer 711*b* and the seventh surface is connected to third metal material 723*b*. The eighth surface of third semiconductor light-emitting chip 7303 is connected to spacer 711*c* and the ninth surface is connected to third metal material 723*c*.

First sidewalls 740*a*, 740*b*, and 740*c* and second sidewall 50 are disposed aligned between first submount 710 and second submount 720. First semiconductor light-emitting chip 7301, second semiconductor light-emitting chip 7302, and third semiconductor light-emitting chip 7303 are disposed between first sidewall 740*a* and second sidewall 50. First semiconductor light-emitting chip 7301 is further disposed between first sidewall 740*a* and first sidewall 740*b*. Second semiconductor light-emitting chip 7302 is disposed between first sidewall 740*b* and first sidewall 740*c*. Third semiconductor light-emitting chip 7303 is disposed between first sidewall 740*c* and second sidewall 50.

Spacer 711*a* is one example of the first metal material disposed on third surface 719*a* of first base 719. Spacer 711*a* is disposed at least between third surface 719*a* of first base 719 and the first surface of first semiconductor light-emitting chip 7301. In the present embodiment, spacer 711*a* is thermally and electrically connected to the first surface of first semiconductor light-emitting chip 7301 via bonding material 18. First semiconductor light-emitting chip 7301 is junction-down bonded to first submount 710 with the first surface facing spacer 711*a*. Spacer 711*a* is connected to first sidewall 740*b* via bonding material 48*b*.

Spacer 711*b* is one example of the seventh metal material disposed on third surface 719*a* of first base 719. Spacer 711*b* is disposed at least between third surface 719*a* of first base 719 and the sixth surface of second semiconductor light-emitting chip 7302. In the present embodiment, spacer 711*b* is thermally and electrically connected to the sixth surface of second semiconductor light-emitting chip 7302 via bonding material 18. Second semiconductor light-emitting chip 7302 is junction-down bonded to first submount 710 with the sixth surface facing spacer 711*b*.

Spacer 711*c* is one example of the metal material disposed on third surface 719*a* of first base 719. Spacer 711*c* is disposed at least between third surface 719*a* of first base 719 and the eighth surface of third semiconductor light-emitting chip 7303. In the present embodiment, spacer 711*c* is thermally and electrically connected to the eighth surface of third semiconductor light-emitting chip 7303 via bonding material 18. Third semiconductor light-emitting chip 7303 is junction-down bonded to first submount 710 with the eighth surface facing spacer 711*c*. Second sidewall 50 is connected to spacer 711*c* via bonding material 58.

Second metal material 712 has the same configuration as second metal material 312 according to Embodiment 4.

Spacers 711*a*, 711*b*, 711*c* and second metal material 712 are electrically insulated from each other. Each of spacers 711*a*, 711*b*, and 711*c* and second metal material 712 is, for example, a plate-shaped metal material consisting mainly of a metal with high thermal conductivity such as Cu, with a metal film of, for example, Ni or Au or the like formed on the surface.

Next, each element of second submount 720 will be described.

Third metal material 723*a* is a metal material disposed on fourth surface 729*a* of second base 729. The second surface of first semiconductor light-emitting chip 7301 faces third metal material 723*a*. Third metal material 723*a* is disposed at least between fourth surface 729*a* of second base 729 and the second surface of first semiconductor light-emitting chip 7301. In the present embodiment, third metal material 723*a* is thermally and electrically connected to second the surface of first semiconductor light-emitting chip 7301 via bonding material 28. First semiconductor light-emitting chip 7301 is bonded to second submount 720 with the second surface facing third metal material 723*a*. Third metal material 723*a* is connected to first sidewall 740*a*. First sidewall 740*a* is thermally and electrically connected to second metal material 712 via bonding material 48*a*. Stated differently, third metal material 723*a* is electrically connected to second metal material 712 via first sidewall 740*a* and bonding material 48*a*.

Third metal material 723*b* is a metal material disposed on fourth surface 729*a* of second base 729. The seventh surface of second semiconductor light-emitting chip 7302 faces third metal material 723*b*. Third metal material 723*b* is disposed at least between fourth surface 729*a* of second base 729 and the seventh surface of second semiconductor light-emitting chip 7302. In the present embodiment, third metal material 723*b* is thermally and electrically connected to the seventh surface of second semiconductor light-emitting chip 7302 via bonding material 28. Second semiconductor light-emitting chip 7302 is bonded to second submount 720 with the seventh surface facing third metal material 723*b*. Third metal material 723*b* is connected to first sidewall 740*b*. First sidewall 740*b* is thermally and electrically connected to spacer 711*a* via bonding material 48*b*. Stated differently, third metal material 723*b* is electrically connected to spacer 711*a* via first sidewall 740*b* and bonding material 48*b*. Third metal material 723*b* is also one example of the fourth metal material connected to the seventh surface. First sidewall 740*b* is also one example of the second sidewall that (thermally and electrically) connects spacer 711*a* to third metal material 723*b*, which is the fourth metal material.

Third metal material 723*c* is a metal material disposed on the fourth surface of second base 729. The ninth surface of third semiconductor light-emitting chip 7303 faces third metal material 723*c*. Third metal material 723*c* is disposed at least between fourth surface 729*a* of second base 729 and the ninth surface of third semiconductor light-emitting chip 7303. In the present embodiment, third metal material 723*c* is thermally and electrically connected to the ninth surface of third semiconductor light-emitting chip 7303 via bonding material 28. Third semiconductor light-emitting chip 7303 is bonded to second submount 720 with the ninth surface facing third metal material 723*c*. Third metal material 723*c* is connected to first sidewall 740*c*. First sidewall 740*c* is thermally and electrically connected to spacer 711*b* via bonding material 48*c*. Stated differently, third metal material 723*c* is electrically connected to spacer 711*b* via first sidewall 740*c* and bonding material 48*c*.

Fourth metal material 724 is a metal material disposed on the fourth surface of second base 729. Fourth metal material 724 is electrically connected to second sidewall 50. Second sidewall 50 is thermally connected to spacer 711*c* via bonding material 58. Stated differently, fourth metal material 724 is thermally connected to spacer 711*c* via second sidewall 50 and bonding material 58.

Each of third metal material 723*a*, third metal material 723*b*, third metal material 723*c*, and fourth metal material 724 is a plate-shaped metal material consisting mainly of a metal with high thermal conductivity such as Cu, with a metal film of, for example, Ni or Au or the like formed on the surface. Backside metal material 727 and bonding material 28 respectively have the same configurations as backside metal material 427 and bonding material 28 according to Embodiment 4.

With the above configuration, first semiconductor light-emitting chip 7301, second semiconductor light-emitting chip 7302, and third semiconductor light-emitting chip 7303 of semiconductor light-emitting device 701 according to the present embodiment can be electrically connected in series as illustrated in FIG. 43B. Stated differently, first semiconductor light-emitting chip 7301, second semiconductor light-emitting chip 7302, and third semiconductor light-emitting chip 7303 are electrically connected in series between spacer 711*c*, which also functions as an electrode for external connection, and second metal material 712.

According to semiconductor light-emitting device 701, a plurality of semiconductor light-emitting chips can be disposed in a small space, which makes it possible to realize a compact, high-power semiconductor light-emitting device.

The positional relationship in the first direction between (i) each semiconductor light-emitting chip according to the present embodiment and (ii) first submount 710 and second submount 720 is the same as the positional relationship between (i) semiconductor light-emitting chip 30 and (ii) first submount 110 and second submount 120 according to Embodiment 2. In other words, first semiconductor light-emitting chip 7301 may include a first emission surface, which is the side surface that emits emission light, the first emission surface may be positioned forward of the end surface of spacer 711*a* located near the first emission surface (i.e., the front end surface of spacer 711*a*), and a second front surface, which is the end surface of second base 729 located near the first emission surface (i.e., the front end surface of second base 729), may be positioned forward of the first emission surface. Second semiconductor light-emitting chip 7302 may include a second emission surface, which is the side surface that emits emission light, the second emission surface may be positioned forward of the end surface of spacer 711*b*-which is one example of the seventh metal material-located near the second emission surface (i.e., the front end surface of spacer 711*b*), and the second front surface may be positioned forward of the second emission surface. Third semiconductor light-emitting chip 7303 may include a third emission surface, which is the side surface that emits emission light, the third emission surface may be positioned forward of the end surface of spacer 711*c* located near the third emission surface, and the second front surface may be positioned forward of the third emission surface. The end surface of third metal material 723*a* located near the first emission surface (i.e., the front end surface of third metal material 723*a*) may be positioned forward of the first emission surface and positioned rearward of the second front surface. The end surface of third metal material 723*b* located near the second emission surface (i.e., the front end surface of third metal material 723*b*) may be positioned forward of the second emission surface and positioned rearward of the second front surface. The end surface of third metal material 723*c* located near the third emission surface (i.e., the front end surface of third metal material 723*c*) may be positioned forward of the third emission surface and positioned rearward of the second front surface. Here, the second emission surface is, among the two end surfaces of second semiconductor light-emitting chip 7302 in first direction D1, the end surface closer to the first emission surface, and the third emission surface is, among the two end surfaces of third semiconductor light-emitting chip 7303 in first direction D1, the end surface closer to the first emission surface.

This produces the same advantageous effect as Embodiment 2 with respect to the emission light from each semiconductor light-emitting chip.

Although the number of semiconductor light-emitting chips is exemplified as three in the present embodiment, the number of semiconductor light-emitting chips may be two, four, or more.

Embodiment 8

Next, the semiconductor light-emitting device according to Embodiment 8 will be described. The semiconductor light-emitting device according to the present embodiment differs from semiconductor light-emitting device 401 according to Embodiment 4 in that the semiconductor light-emitting chip is a semiconductor laser diode array chip including a plurality of optical waveguides. The following description will focus on the differences between the semiconductor light-emitting device according the present embodiment and semiconductor light-emitting device 401 according to Embodiment 4, with reference to FIG. 44.

Figure 44:
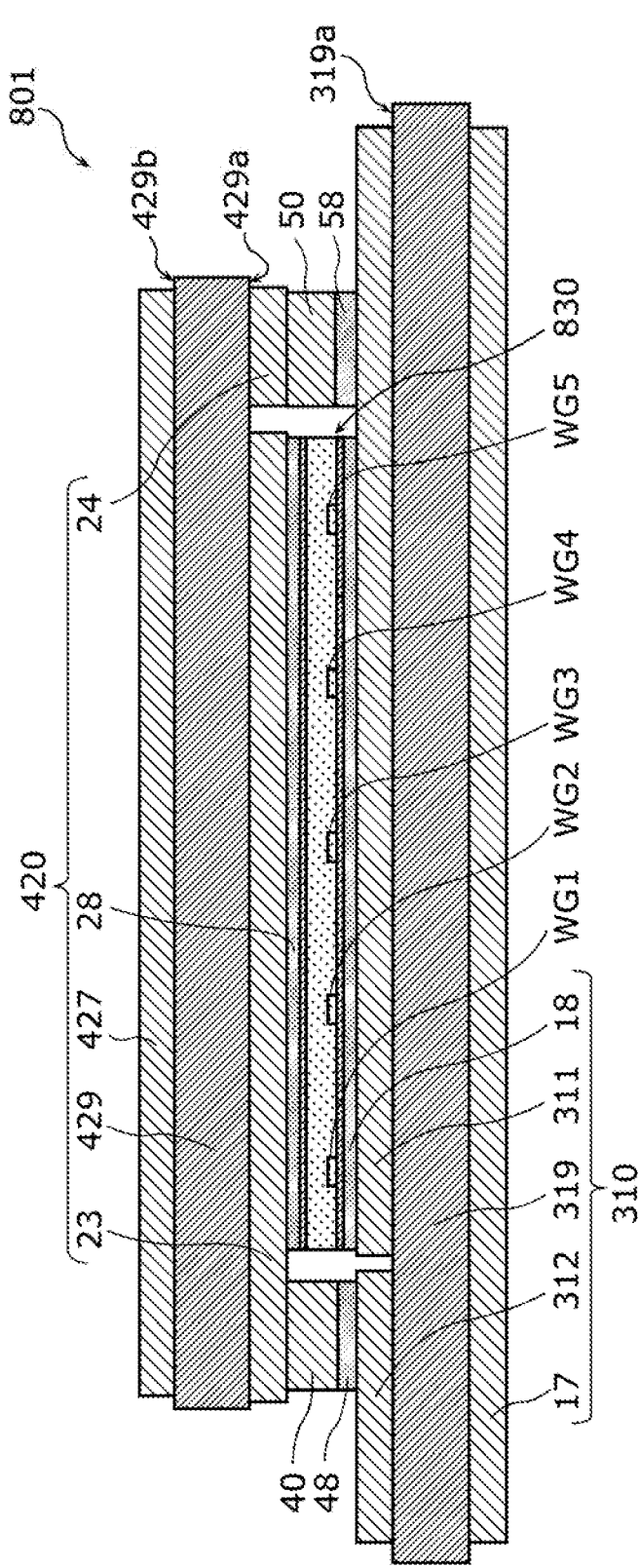
FIG. 44 is a cross-sectional view schematically illustrating the overall configuration of a semiconductor light-emitting device according to Embodiment 8.

FIG. 44 is a cross-sectional view schematically illustrating the overall configuration of semiconductor light-emitting device 801 according to the present embodiment.

As illustrated in FIG. 44, semiconductor light-emitting device 801 according to the present embodiment includes semiconductor light-emitting chip 830, first submount 310, second submount 420, first sidewall 40, and second sidewall 50. Semiconductor light-emitting chip 830 differs from semiconductor light-emitting chip 30 according to Embodiment 4 in that it includes a plurality of optical waveguides, as illustrated in FIG. 44, and is identical in other respects. In the present embodiment, semiconductor light-emitting chip 830 includes five optical waveguides WG1 through WG5.

This configuration makes it possible to produce a plurality of emission lights from a single semiconductor light-emitting chip, resulting in a compact, high-output semiconductor light-emitting device 801. By sandwiching semiconductor light-emitting chip 830 between first submount 310 and second submount 420, the warping of semiconductor light-emitting chip 830 due to differences in coefficients of thermal expansion can be inhibited.

Variations, etc.

Hereinbefore, the semiconductor light-emitting device according to the present disclosure has been described based on embodiments, but the present disclosure is not limited to the above embodiments.

For example, in each of the above embodiments, an example is given in which the semiconductor light-emitting chip is a semiconductor laser diode chip, but the semiconductor light-emitting chip is not limited to a semiconductor laser diode chip. For example, the semiconductor light-emitting chip may be a quantum cascade laser diode or a super luminescent diode.

The spacer may also comprise a material other than a metal material. For example, the spacer may comprise an insulating material.

The functional element, such as Zener diode 660 included in semiconductor light-emitting device 601 according to Embodiment 6, may be included in semiconductor light-emitting devices according to other embodiments and variations. For example, if semiconductor light-emitting device 101 according to Embodiment 2 is to be provided with a Zener diode, a functional element, such as Zener diode 660, may be disposed on fifth surface 29*b* and electrically connected to fifth metal material 25 and sixth metal material 26. The functional element is not limited to a light-receiving element, a thermistor, or a Zener diode; the functional element may be some other element such as a transistors or a capacitor. The semiconductor light-emitting device may include a plurality of functional elements. The semiconductor light-emitting device may include a plurality of mutually different functional elements. Different metal material may be used in the electrical wiring according to the type and quantity of functional elements. The second submount itself may also function as a functional element.

Various modifications of the above embodiments that may be conceived by those skilled in the art, as well as embodiments resulting from arbitrary combinations of elements and functions from different embodiments that do not depart from the essence of the present disclosure are included the present disclosure.

INDUSTRIAL APPLICABILITY

The semiconductor light-emitting device according to the present disclosure is applicable as, for example, as high-power and high-efficiency light source in, for example, projectors, laser devices for welding, laser devices for processing, automotive headlamp devices, light detection and ranging (LiDAR) devices, analysis devices, inspection devices, laser devices for endoscopy, laser devices for optical communication, and optical fiber communication amplifiers.

The invention claimed is:

1. A semiconductor light-emitting device comprising:
   a first submount;
   a first semiconductor light-emitting chip disposed on the first submount; and
   a second submount, wherein
   the first semiconductor light-emitting chip includes:
      a first surface;
      a second surface on an opposite side relative to the first surface;
      a first optical waveguide extending in a first direction parallel to the first surface and disposed closer to the first surface than to the second surface; and
      a first emission surface that is one of side surfaces that connect the first surface and the second surface and intersect the first direction, and emits emission light in the first direction,
   the first submount includes:
      a first base including a third surface; and
      a spacer disposed on the third surface,
   the first semiconductor light-emitting chip is bonded to the first submount with the first surface facing the spacer,
   in a traveling direction of the emission light, the first emission surface is positioned forward of, among two end surfaces of the spacer in the first direction, an end surface closer to the first emission surface,
   among two end surfaces of the first base in the first direction, a first front surface is positioned forward of the first emission surface in the traveling direction of the emission light, the first front surface being an end surface closer to the first emission surface,
   the second submount is disposed on the second surface,
   the second submount includes:
      a second base including a fourth surface; and
      a third metal material disposed on the fourth surface,
   the second surface faces the third metal material, and among two end surfaces of the third metal material in the first direction, an end surface closer to the first emission surface is positioned forward of the first emission surface in the traveling direction of the emission light.

2. A semiconductor light-emitting device comprising:

a first submount;

a first semiconductor light-emitting chip disposed on the first submount; and a second submount, wherein the first semiconductor light-emitting chip includes:

a first surface;

a second surface on an opposite side relative to the first surface;

a first optical waveguide extending in a first direction parallel to the first surface and disposed closer to the first surface than to the second surface; and a first emission surface that is one of side surfaces that connect the first surface and the second surface and intersect the first direction, and emits emission light in the first direction, the first submount includes:

a first base including a third surface; and a spacer disposed on the third surface, the first semiconductor light-emitting chip is bonded to the first submount with the first surface facing the spacer, in a traveling direction of the emission light, the first emission surface is positioned forward of, among two end surfaces of the spacer in the first direction, an end surface closer to the first emission surface, among two end surfaces of the first base in the first direction, a first front surface is positioned forward of the first emission surface in the traveling direction of the emission light, the first front surface being an end surface closer to the first emission surface, the second submount is disposed on the second surface, the semiconductor light-emitting device comprises a first sidewall and a second sidewall connected to the second submount, the first sidewall and the second sidewall are arranged in a second direction parallel to the first surface and orthogonal to the first direction, the first semiconductor light-emitting chip is disposed between the first sidewall and the second sidewall, the first sidewall includes a first metal column, the first submount includes a second metal material disposed on the third surface, and the first metal column is electrically connected to the second metal material.

3. A semiconductor light-emitting device comprising:

a first submount;

a first semiconductor light-emitting chip disposed on the first submount; and a second submount, wherein the first semiconductor light-emitting chip includes:

a first surface;

a second surface on an opposite side relative to the first surface;

a first optical waveguide extending in a first direction parallel to the first surface and disposed closer to the first surface than to the second surface; and a first emission surface that is one of side surfaces that connect the first surface and the second surface and intersect the first direction, and emits emission light in the first direction, the first submount includes:

a first base including a third surface; and a spacer disposed on the third surface, the first semiconductor light-emitting chip is bonded to the first submount with the first surface facing the spacer, in a traveling direction of the emission light, the first emission surface is positioned forward of, among two end surfaces of the spacer in the first direction, an end surface closer to the first emission surface, among two end surfaces of the first base in the first direction, a first front surface is positioned forward of the first emission surface in the traveling direction of the emission light, the first front surface being an end surface closer to the first emission surface, the second submount is disposed on the second surface, the second submount includes:

a second base including a fourth surface; and a third metal material disposed on the fourth surface, the second surface faces the third metal material, the first semiconductor light-emitting chip includes a first electrode, the second base includes a fifth surface on an opposite side relative to the fourth surface, the second submount includes a fifth metal material disposed on the fifth surface, and the first electrode is electrically connected to the fifth metal material.

4. The semiconductor light-emitting device according to claim 3, wherein the first semiconductor light-emitting chip includes a second electrode, the second submount includes a sixth metal material disposed on the fifth surface, and the second electrode is electrically connected to the sixth metal material.

5. A semiconductor light-emitting device comprising:

a first submount;

a first semiconductor light-emitting chip disposed on the first submount; and a second submount, wherein the first semiconductor light-emitting chip includes:

a first surface:

a second surface on an opposite side relative to the first surface;

a first optical waveguide extending in a first direction parallel to the first surface and disposed closer to the first surface than to the second surface; and a first emission surface that is one of side surfaces that connect the first surface and the second surface and intersect the first direction, and emits emission light in the first direction, the first submount includes:

a first base including a third surface; and a spacer disposed on the third surface, the first semiconductor light-emitting chip is bonded to the first submount with the first surface facing the spacer, in a traveling direction of the emission light, the first emission surface is positioned forward of, among two end surfaces of the spacer in the first direction, an end surface closer to the first emission surface, among two end surfaces of the first base in the first direction, a first front surface is positioned forward of the first emission surface in the traveling direction of the emission light, the first front surface being an end surface closer to the first emission surface, the second submount is disposed on the second surface, the second submount includes:

a second base including a fourth surface; and a third metal material disposed on the fourth surface, the second surface faces the third metal material, and among two end surfaces of the second base in the first direction, a second front surface is positioned forward of the first emission surface in the traveling direction of the emission light, the second front surface being an end surface closer to the first emission surface.

6. The semiconductor light-emitting device according to claim 5, comprising:

a light-transmissive component disposed on the first front surface and the second front surface;

a first sidewall and a second sidewall arranged in a second direction parallel to the first surface and orthogonal to the first direction; and a third sidewall, wherein the first base includes a first rear surface facing away from the first front surface, the second base includes a second rear surface facing away from the second front surface, the third sidewall is disposed on the first rear surface and the second rear surface, the first semiconductor light-emitting chip is disposed between the first sidewall and the second sidewall, and the first semiconductor light-emitting chip is hermetically sealed by the first submount, the second submount, the light-transmissive component, the first sidewall, the second sidewall, and the third sidewall.

7. The semiconductor light-emitting device according to claim 2, wherein in a top view of the third surface, the spacer and the second metal material protrude from the second submount in the second direction.

8. The semiconductor light-emitting device according to claim 3, comprising:

a functional element disposed on the fifth surface.

9. The semiconductor light-emitting device according to claim 8, wherein the second submount includes a sixth metal material disposed on the fifth surface, and the functional element is electrically connected to the fifth metal material and the sixth metal material.

10. The semiconductor light-emitting device according to claim 3, comprising:

a second semiconductor light-emitting chip disposed on the first submount, wherein the second semiconductor light-emitting chip includes:

a sixth surface parallel to the first direction;

a seventh surface on an opposite side relative to the sixth surface; and a second optical waveguide extending in the first direction and disposed closer to the sixth surface than to the seventh surface, the first submount includes a seventh metal material disposed on the third surface, the spacer and the seventh metal material are electrically insulated from each other, the second semiconductor light-emitting chip is bonded to the first submount with the sixth surface facing the seventh metal material, the second submount includes a fourth metal material disposed on the fourth surface, the seventh surface is connected to the fourth metal material, and the sixth surface is electrically connected to the seventh metal material.

11. The semiconductor light-emitting device according to claim 1, wherein the second base includes a second front surface, the second front surface being an end surface closer to the first emission surface among two end surfaces of the second base in the first direction, the semiconductor light-emitting device comprises:

a light-transmissive component disposed on the first front surface and the second front surface;

a first sidewall and a second sidewall arranged in a second direction parallel to the first surface and orthogonal to the first direction; and a third sidewall, the first base includes a first rear surface facing away from the first front surface, the second base includes a second rear surface facing away from the second front surface, the third sidewall is disposed on the first rear surface and the second rear surface, the first semiconductor light-emitting chip is disposed between the first sidewall and the second sidewall, and the first semiconductor light-emitting chip is hermetically sealed by the first submount, the second submount, the light-transmissive component, the first sidewall, the second sidewall, and the third sidewall.

12. The semiconductor light-emitting device according to claim 2, wherein the second submount includes a second base, the second base includes a second front surface, the second front surface being an end surface closer to the first emission surface among two end surfaces of the second base in the first direction, the semiconductor light-emitting device comprises:

a light-transmissive component disposed on the first front surface and the second front surface;

a first sidewall and a second sidewall arranged in a second direction parallel to the first surface and orthogonal to the first direction; and a third sidewall, the first base includes a first rear surface facing away from the first front surface, the second base includes a second rear surface facing away from the second front surface, the third sidewall is disposed on the first rear surface and the second rear surface, the first semiconductor light-emitting chip is disposed between the first sidewall and the second sidewall, and the first semiconductor light-emitting chip is hermetically sealed by the first submount, the second submount, the light-transmissive component, the first sidewall, the second sidewall, and the third sidewall.

13. The semiconductor light-emitting device according to claim 3, wherein the second base includes a second front surface, the second front surface being an end surface closer to the first emission surface among two end surfaces of the second base in the first direction, the semiconductor light-emitting device comprises:

a light-transmissive component disposed on the first front surface and the second front surface;

a first sidewall and a second sidewall arranged in a second direction parallel to the first surface and orthogonal to the first direction; and a third sidewall, the first base includes a first rear surface facing away from the first front surface, the second base includes a second rear surface facing away from the second front surface, the third sidewall is disposed on the first rear surface and the second rear surface, the first semiconductor light-emitting chip is disposed between the first sidewall and the second sidewall, and the first semiconductor light-emitting chip is hermetically sealed by the first submount, the second submount, the light-transmissive component, the first sidewall, the second sidewall, and the third sidewall.

14. The semiconductor light-emitting device according to claim 1, wherein the first submount includes a second metal material disposed on the third surface, in a top view of the third surface, the spacer and the second metal material protrude from the second submount in a second direction parallel to the first surface and orthogonal to the first direction.

15. The semiconductor light-emitting device according to claim 3, wherein the first submount includes a second metal material disposed on the third surface, in a top view of the third surface, the spacer and the second metal material protrude from the second submount in a second direction parallel to the first surface and orthogonal to the first direction.

16. The semiconductor light-emitting device according to claim 5, wherein the first submount includes a second metal material disposed on the third surface, in a top view of the third surface, the spacer and the second metal material protrude from the second submount in a second direction parallel to the first surface and orthogonal to the first direction.

* * * * *